(12) United States Patent
Fujiwara

(10) Patent No.: US 6,434,053 B1
(45) Date of Patent: Aug. 13, 2002

(54) NONVOLATILE SEMICONDUCTOR MEMORY DEVICE AND METHOD OF OPERATION THEREOF

(75) Inventor: Ichiro Fujiwara, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/729,214

(22) Filed: Dec. 5, 2000

(30) Foreign Application Priority Data

Dec. 6, 1999 (JP) ............................................. 11-346812
Sep. 1, 2000 (JP) ........................................ 2000-269892

(51) Int. Cl.⁷ ............................................... G11C 16/04
(52) U.S. Cl. ............................ 365/185.28; 365/185.03; 365/185.17; 257/324
(58) Field of Search ........................ 365/185.28, 185.03, 365/185.17, 185.26, 185.01; 257/324

(56) References Cited

U.S. PATENT DOCUMENTS 5,999,444 A * 12/1999 Fujiwara ................. 365/185.02
6,011,725 A * 1/2000 Eitan ...................... 365/185.33
6,081,456 A * 6/2000 Dadashev ............... 365/185.23
6,137,718 A * 10/2000 Reisinger ............... 365/185.03
6,147,904 A * 11/2000 Liron ...................... 365/185.09
6,163,048 A * 12/2000 Hirose et al. ................ 257/315

* cited by examiner

Primary Examiner—Hoai V. Ho
(74) Attorney, Agent, or Firm—Ronald P. Kananen; Rader Fishman & Grauer PLLC

(57) ABSTRACT

A MONOS type memory transistor increased in injection efficiency or storing a plurality of bits of data by local injection of a charge into part of a plane area of distribution of a charge storing means, comprised of a channel forming region of a first conductivity type, source and drain regions of a second conductivity type, gate insulating films formed on the channel forming region, gate electrodes, and a charge storing means (charge traps) formed in the gate insulating film and dispersed in a plane facing the channel forming region and the thickness direction and in which hot electrons caused by a band-to-band tunneling current are injected from the source and drain regions, where in the gate insulating film, between a first storage region and a second storage region into which electrons are locally injected, there is a third region into which hot electrons are not injected.

72 Claims, 24 Drawing Sheets

CHANNEL FORMING REGION

READ OPERATION

ERASURE OPERATION

WRITE OPERATION

ERASURE OPERATION

WRITE OPERATION (M11)

CHANNEL FORMING REGION

CHANNEL FORMING REGION

CHANNEL FORMING REGION

NONVOLATILE SEMICONDUCTOR MEMORY DEVICE AND METHOD OF OPERATION THEREOF

BACKGROUND OF THE INVENTION

1. Field of the Invention

The present invention relates to a nonvolatile semiconductor memory device which has a planarly dispersed charge storing means (for example, in a MONOS type or a MNOS type, charge traps in a nitride film, charge traps near the interface between a top insulating film and the nitride film, small particle conductors, etc.) in a gate insulating film between a channel forming region and a gate electrode in a memory transistor and is operated to electrically inject a charge into the charge storing means to store the same therein and to extract the same therefrom and a method of operating the device.

2. Description of the Related Art

Nonvolatile semiconductor memories offer promise as large capacity, small size data-storage media. Along with the recent spread of broadband information networks, however, write speeds equivalent to the transmission rates of the networks (for example, a carrier frequency of 100 MHZ) are being demanded. Therefore, nonvolatile memories are being required to have good scaling and be improved in write speed to one or more orders of magnitude higher than the conventional write speed of 100 $\mu$s/cell.

As nonvolatile semiconductor memories, in addition to the floating gate (FG) types wherein the charge storing means (floating gate) that hold the charge is planarly formed, there are known MONOS (metal-oxide-nitride-oxide semiconductor) types wherein the charge storing means are planarly dispersed.

In an MONOS type nonvolatile semiconductor memory, since the carrier traps in the nitride film [$Si_xN_y$ (0<x<1, 0<y<1)] or on the interface between the top oxide film and the nitride film, which are the main charge-retaining bodies, are spatially (that is, in the planar direction and thickness direction) dispersed, the charge retention characteristic depends on not only the thickness of a tunnel insulating film (bottom insulating film), but also on the energy and spatial distribution of the charges captured by the carrier traps in the $Si_xN_y$ film.

When a leakage current path is locally generated in the tunnel insulating film, in an FG type, a large amount of charges easily leak out through the leakage path and the charge retention characteristic declines. On the other hand, in an MONOS type, since the charge storing means are spatially dispersed, only the charges near the leakage path will locally leak from it, therefore the charge retention characteristic of the entire memory device will not decline much.

As a result, in a MONOS type, the disadvantage of the degradation of the charge retention characteristic due to the reduction in thickness of the tunnel insulating film is not so serious as in an FG type. Accordingly, a MONOS type is superior to an FG type in scaling of a tunnel insulating film in a miniaturized memory transistor with an extremely small gate length.

Moreover, when a charge is locally injected into the plane of distribution of the planarly dispersed charge traps, the charge is held without diffusing in the plane and in the thickness direction like in an FG type memory.

To realize a miniaturized memory cell in a MONOS type nonvolatile semiconductor memory, it is important to improve the disturbance characteristic. Therefore, it is necessary to set the tunnel insulating film thicker than the normal thickness of 1.6 nm to 2.0 nm. When the tunnel insulating film is formed relatively thick, the write speed is in the range of 0.1 to 10 mo, which is still not sufficient.

In other words, in a conventional MONOS type nonvolatile semiconductor memory etc., to fully satisfy the requirements of reliability (for example, data retention, read disturbance, data rewrite, etc.), the write speed is limited to 100 $\mu$s.

A high speed is possible if the write speed alone is considered, but sufficiently high reliability and low voltage cannot be achieved. For example, a source-side injection type MONOS transistor has been reported wherein the channel hot electrons (CHE) are injected from the source side (*IEEE Electron Device Letter*, 19, 1999, p. 153). In this source-side injection type MONOS transistor, in addition to the high operation voltages of 12V for write operations and 14V for erasure operations, the road disturbance, data rewrite, and other facets of reliability are not sufficient.

On the other hand, taking note of the fact that it is possible to inject a charge into part of dispersed charge traps area by the conventional CHE injection method, it has been reported that by independently writing binary data into the source and drain side of a charge storing means, it is possible to record 2 bits of data in one memory cell. For example, *Extented Abstract of the* 1999 *International Conference on Solid State Devices and Materials*, Tokyo, 1999, pp. 522–523, considers that by changing the direction of the voltage applied between the source and drain to write 2 bits of data by injecting CHE and, when reading data, applying a specified voltage with a direction reversed to that for writing, i.e., the so-called "reverse read" method, correct reading of the 2 bits of data is possible even if the write time is short and the amount of the stored charge is small. Erasure is achieved by injecting hot holes.

By using this technique, it becomes possible to increase the write speed and largely reduce the cost per bit.

Furthermore, a split gate type MONOS nonvolatile memory able to record 2 bits in one cell was recently proposed ("Twin MONOS Cell with Dual Control Gates", 2000 *Symposium on VLSI Technology Digest of Technical Papers*, pp. 122–123).

In this MONOS type nonvolatile memory, a split gate structure is employed to provide a control gate electrode in addition to the gate electrode so as to try to increase the write speed. The principle of this write method is basically channel hot electron injection. Since the impurity concentration around the drain is made relatively high comparing with that at the center of the channel, the injection efficiency of hot electrons is greatly improved.

However, in a conventional CHE injection type MONOS type or 2 bit/cell recordable MONOS type nonvolatile semiconductor memory, since electrons are accelerated in the channel to produce high energy electrons (hot electrons), it is necessary to apply a voltage larger than the 3.2 eV energy barrier of the oxide film, in practice a voltage of about 4.5V, between the source and drain. It is difficult to decrease this source-drain voltage. As a result, in a write operation, the punch-through effect becomes a restriction and good scaling of the gate length is difficult.

In addition, with the CHE injection method, since the efficiency of charge injection into the charge storing means is as low as $1\times10^{-6}$ to $1\times10^{-5}$, a write current of a few hundred $\mu$A is needed. As a result, there is another problem that it is impossible to write in parallel a large number of memory cells simultaneously. To solve this problem, the write current has been reduced to 10 μA per cell in the recently reported split gate type cells, but it is still difficult to write memory cells of more than 1 k bits in parallel because of the current restriction of the peripheral charge pump circuitry.

Moreover, with these three types of cells using the CHE injection method, because the write operation is performed with a current flowing in the channel of a memory transistor, it is impossible to simultaneously write at the source side and the drain side for the purpose of the aforesaid 2-bit data storage.

Furthermore, in the aforesaid 2-bit data recordable memory cells and split gate type memory cells, due to the necessity of local erasure, the method of erasure of injecting hot holes from the source or drain side utilizing FN tunneling or a band-to-band tunneling current has been employed. However, with this method, since passage of hot holes may cause deterioration of the oxide film, a decline in the reliability, in particular, the data rewrite, cannot be avoided.

Therefore, in a conventional MONOS type nonvolatile semiconductor memory, as long as the erasure is performed by hot hole injection, it is impossible to improve the performance by optimizing the thickness of the bottom oxide film.

SUMMARY OF THE INVENTION

An object of the present invention is to provide a MONOS type or other nonvolatile semiconductor memory device which basically operates by storing a charge in a planarly dispersed charge storing means such as a carrier trap, when injecting a charge into part of a region of distribution of the charge storing means to record a plurality of bits of data, it is possible to write at a high speed with an extremely low current while suppressing the punch-through effect and wherein the scaling of the gate length and the thickness of the gate insulating film is good, and a method of operating the device.

According to a first aspect of the present invention, there is provided a nonvolatile semiconductor memory device comprising a channel forming region comprised of a first conductivity type semiconductor, two source and drain regions comprised of a second conductivity type semiconductor sandwiching the channel forming region between them, a gate insulating film provided on said channel forming region, a gate electrode provided on said gate insulating film, and a charge storing means which is formed in said gate insulating film dispersed in the plane facing said channel forming region and in the direction of thickness and is injected with hot electrons at the time of operation from said source and drain regions.

The hot electrons are those caused by a band-to-band tunneling current.

In the present invention, the number of recorded bits per cell may be either 2 bits per cell or 1 bit per cell.

In the former case, the gate insulating film may comprised of a storage region holding the hot electrons injected from said source and drain region and another region not injected by the hot electrons.

Alternatively, the gate insulating film may be comprised of two regions, referred to as first and second storage regions, holding the hot electrons injected from either the source region or the drain region and a third region between the first and the second regions into which the hot electrons are not injected.

A charge storing means is formed in the first and the second storage regions. The region of distribution of the charge storing means is spatially separated by the third region. Further, preferably, the first and the second storage regions are stacked film structures comprised of a number of films stacked together. The third region is a single layer of a dielectric.

Although a single gate electrode is also a possible choice, preferable the gate electrode comprises a first gate electrode formed on the first storage region, a second gate electrode formed on the second storage region, and a third gate electrode formed on the third region. The first, second, and third gate electrodes are spatially separated from each other. In order to simplify the fabrication process, the third electrode is formed on the single layer of dielectric. By stacking a number of films, a charge retaining film is formed in contact with the surfaces of the third electrode and the channel forming regions beside the third electrode. Due to formation of a gate electrode on the charge retaining film, the first and the second gate electrodes may consist of only the single gate electrode. In either case, the channel forming region consists of two channel forming regions of two memory transistors and a channel forming region of a control transistor between and in connection with the former two channel forming regions.

In more detail, a plurality of memory transistors each comprising a channel forming region, source and drain regions, gate insulating film, and gate electrode are arranged in the word line direction and in the bit line direction. In the memory transistors in the word line direction, the first and second gate electrodes are commonly connected through word lines, and in the memory transistors in the bit line direction, the third gate electrodes are commonly connected.

The gate electrode may also be a single one on the first and the second storage regions and the third region. In this case, two more gate electrodes are provided at the outer side of the first and the second storage regions spatially separated from the central gate electrode.

In the case of storing one bit per cell, a memory transistor comprising a channel forming region, source and drain regions, gate insulating film, and gate electrode may have a gate length shorter than or equal to the gate length when the region retaining hot electrons from one of the source and drain regions is merged or partially merged in the gate insulating film with the region retaining hot electrons from the other of the source and drain regions when hot electrons are injected from both the source and drain regions.

In the present nonvolatile semiconductor memory device, a separated source line type, virtual grounding type, or other NOR type cell array structure wherein a common line connected to one of the source and drain regions and a common line connected to another one of the source and drain regions can be controlled independently is preferable.

In a separated source line type, a common line connected to one of the source and drain regions is referred to as a first common line, while that connected to the other of the source and drain regions is referred to as a second common line.

In this case, the first and second common lines may have a hierarchical structure. In a so-called AND type cell array, memory transistors are connected in parallel to the first and the second sub-lines that are used as the inner interconnections in a memory block.

According to the second aspect of the present invention, there is provided a method of operating a nonvolatile semiconductor memory device comprising a channel forming region comprised of a first conductivity type semiconductor, source and drain regions comprised of a secondary conductivity type semiconductor with the channel forming region in between, a gate insulating film provided on the channel forming region and including inside it a charge storing means dispersed in a plane facing the channel forming region and thickness direction, and a gate electrode provided on the gate insulating film, the method comprises a stop of injecting hot electrons into the charge storing means from the source and drain regions when writing data to the device.

In the write operation, preferably hot electrons caused by the band-to-band tunneling current are injected into the charge storing means from the source and drain regions.

The operation methods are different for storing two bits in one cell and storing one bit in one cell.

In the case of storing two bits per cell, in a write operation, hot electrons may be injected into part of the region of distribution of the charge storing means. That is, hot electrons are injected into the first storage region from one of the source and drain regions, and independently, hot electrons are injected from another one of the source and drain regions into the second storage region separated from the first storage region. The gate insulating film may have a third region, between the first and the second storage regions, into which hot electrons are not injected. The region of distribution of the charge storing means is split spatially by the third region.

In the case of storing one bit per cell, the region retaining the hot electrons injected from one of the source and drain regions is merged or partially merged in the gate insulating film with the region retaining the hot electrons injected from the other of the source and drain regions. In more detail, a memory transistor comprising the channel forming region, source and drain regions, gate insulating film, and gate electrode has a gate length shorter than or equal to the merged gate length when merging or partial merging the two regions retaining the hot electrons.

In the present invention, in the write operation, a specified write voltage is applied between the source and drain regions and the gate electrodes.

As described above, in the case of a gate electrode consisting of the first, the second, the third gate electrodes, in a write operation of a memory cell array comprised of a plurality of memory transistors arranged in the word line direction and in the bit line direction, when writing data to one of the first and the second storage regions, the first and second gate electrodes of the other region are set in an electrically floating state or a voltage of 0V or of opposite polarity relative to the channel forming region is applied to the first or the second gate electrode of the other region.

Further, in a write operation of a memory cell array comprised of a plurality of memory transistors each comprising the channel forming region, source and drain regions, gate insulating film, and gate electrode arranged in the word line direction and in the bit line direction wherein the gate electrodes are commonly connected through word lines for every certain number of memory transistors in the word line direction, a voltage of 0V or of opposite polarity relative to the channel forming region is applied to the nonselected word lines not connected to the memory transistor in operation.

Moreover, in a write operation of a memory cell array comprised of a plurality of memory transistors each comprising the channel forming region, source and drain regions, gate insulating film, and gate electrode arranged in the word line direction and in the bit line direction wherein one of the source and drain regions is connected to a first common line and another one of the source and drain regions is connected to a second common line for every certain number of memory transistors in the bit line direction, a specified voltage is applied to the first or the second common line that is connected to the memory transistor in operation and a voltage of 0V or of opposite polarity relative to the specified voltage is applied to the first and the second common lines not connected to the memory transistor in operation.

In the present invention, even when the source or drain regions in one cell are separated from those in other cells in the word line direction (separated source line NOR type) or the source or drain regions in one cell are connected with the source or drain regions in other cells (virtual grounding type), if the first gate electrode on the first storage region and the second gate electrode on the second storage region are separated, memory cells connected to the same word line can be written simultaneously within one operation cycle.

That is, in the write operation of a memory cell array comprised of a plurality of memory transistors each comprising the channel forming region, source and drain regions, gate insulating film, and gate electrode arranged in the word line direction and in the bit line direction wherein the gate electrodes are commonly connected through word lines for every a certain number of memory transistors in the word line direction, in a write operation for all memory transistors connected to the same word line, a specified voltage is applied to all the source and drain regions corresponding to the first and the second storage regions into which hot electrons are injected, the source and drain regions corresponding to the first and the second storage regions into which hot electrons are not injected are set in an electrically floating state, a write voltage equal to a predetermined difference with the specified voltage applied to the source and drain regions is applied on the same word line, and all memory transistors connected to the same word line are written in parallel with one operation. Here, since the current required for writing is 1 nA per cell, which is sufficiently small comparing with that of the conventional CHE injection write method, it is possible to write in parallel more than 10 kilobits.

When reading data in the case of the aforesaid gate electrode consisting of the first, second, and third gate electrodes, a specified read drain voltage is applied between the two source and drain regions so that the storage region to be read becomes the source, a specified voltage is applied to the third gate electrode, and a specified read gate voltage of the same polarity with the voltage on the third gate electrode is applied to the first gate electrode and/or the second gate electrode.

In an erasure operation, the electrons which are injected from the source and drain regions and held by the charge storing means may be extracted to the source and drain region side by the direct tunneling effect or the Fowler-Nordheim tunneling effect.

Alternatively, the electrons which are injected from the source and drain regions and held at the two sides of a charge storing means in the channel direction may be extracted to the substrate side separately or simultaneously be the direct tunneling effect or the Fowler-Nordheim tunneling effect.

The present nonvolatile semiconductor memory device and the method for operating the same are suitable for example for devices where the charge storing means is formed and dispersed in a plane facing the channel forming region and in the thickness direction such as the MONOS type, small particle type having so-called nanocrystals or other small particle conductors, etc.

In the present nonvolatile semiconductor memory device and the method for operating the same, when writing two bits in one cell, hot electrons caused by a band-to-band tunneling current are injected into the charge storing means from the source and drain regions.

In more detail, if the source and drain regions are p-type impurity regions, application of a positive bias to the gate electrodes (first and second gate electrode) results in formation of an n-type inversion layer at the surfaces of the source and drain regions. Thus a high bias voltage is applied to the pn junction, and the energy bands in this inversion layer bend sharply. If the surface of the p-type impurity region is further deeply depleted, the effective bandgap decreases in this region. As a result, the band-to-band tunneling current occurs between the valence band and the conduction band. Electrons tunneling between the bands are accelerated by the electric field and become hot electrons. Their moments (magnitude and direction) are maintained and their energies are higher than the energy barrier of the oxide film, thus these electrons overcome the barrier and are locally injected into the charge storing means. In other words, if the voltage between one of the source and the drain regions and the first gate electrode is increased, hot electrons are injected and held in the first storage region of the charge storing means. If the voltage between another one of the source and the drain regions and the second gate electrode is increased, hot electrons are injected and held in the second storage region of the charge storing means. Since there is the third region into which hot electrons are not injected between the first and the second storage regions, charges corresponding to the two bits of data may be unambiguously distinguished.

In this process, hot electrons caused by the band-to-band tunneling current are injected into the charge storing means with an injection efficiency, for example, as high as $1 \times 10^{-2}$ to $1 \times 10^{-3}$. Thus, the write current per bit can be reduced to less than $\frac{1}{10}^4$ of that of the conventional CHE injection method. Therefore, it becomes possible to write in parallel more than 10 k memory cells, so the number of memory cells able to be written in parallel simultaneously (write bandwidth) increases. It also becomes possible for memory transistors connected to the same word line (one page) to be written with one operation.

In the method of writing two bits per cell described above, a write operation is performed at the source or the drain region which is not open and to which a write voltage is applied.

Therefore, in a read operation, a read drain voltage is applied so that the source or drain region to which the write voltage is applied becomes the source. The presence of a stored charge at the source or drain region that has a higher voltage does not influence the channel electric field much at all due to the pinch off effect, while the channel electric field changes influenced by the presence of a stored charge at the lower voltage side. Therefore, the threshold voltage of the memory transistor reflects the presence of a stored charge at the low voltage side.

As the most suitable memory transistor structure for writing 2 bits in one cell, for example, the gate insulating film including the charge storing means (carrier traps) is split in the channel direction into first and second storage regions located at the two sides of the gate insulating film and the third region between them is made an insulating film of a single material not containing a charge storing means. The third region at the center functions as a MOS type control transistor.

In this structure, by controlling the threshold voltage of the control transistor to within a certain range, reading can be performed with a constant current. In other words, assuming a p-channel type memory cell, when there is no control transistor, if the electrons are over-injected in the write operation and the threshold voltage of the memory transistor is largely decreased, the read current will fluctuate and much current will be wasted. However, in the present invention, because of the presence of the MOS type control transistor, if the threshold voltage of the memory transistor largely decreases and the read current starts to increase, the control transistor is cut off and functions as a limiter. As a result, in such a memory cell, the upper limit of the read current can be controlled by the threshold voltage of the control transistor and there is no unnecessary current consumption.

In the case of writing one bit in one cell, a write operation may be performed at both the source and the drain sides. In this case, although the charge injection areas from the source and drain regions are both localized, by optimizing the design of the source and drain regions so that the injection areas are sufficiently large, if the gate length is for example less than 100 nm, in the plane of distribution of the charge storing means, the charge injection area of one of the source and drain regions is at least partially merged near the center with the charge injection area of the other of the source and drain regions, therefore the charge is injected into substantially the entire area. Consequently, the threshold voltage of the memory transistor is largely decreased. In such a write operation, because the charge is injected into substantially the entire region of the plane of distribution of the charge storing means, the write time for obtaining a necessary change of the threshold voltage is, for example, less than 10 $\mu$s or shortened by more than one order of magnitude comparing with a conventional memory cell that is able to be written in parallel.

When erasing data, for example, a positive voltage is applied to the source and drain regions and the stored charge at the source or drain side is extracted to the substrate side by using the direct tunneling effect or the FN tunneling effect. With either of the tunneling effects, it is possible to erase a block simultaneously.

In the present invention, because an operation the same as that of a split gate type memory cell is possible, over erasure or overwrite hardly even happens.

BRIEF DESCRIPTION OF THE DRAWINGS

These and other objects and features of the present invention will become clearer from the following description of the preferred embodiments given with reference to the accompanying drawings, in which:

FIG. 21A is a circuit diagram of the write bias conditions of a memory transistor according to the seventh embodiment of the present invention, while

FIG. 23A is a circuit diagram of the erasure bias conditions of a memory transistor according to the seventh embodiment of the present invention; while

FIG. 27A is a cross-sectional view illustrating a first example of the configuration of a virtual grounding NOR type memory cell array according to the ninth embodiment of the present invention; while

DESCRIPTION OF THE PREFERRED EMBODIMENTS

Below, preferred embodiments will be described with reference to the accompanying drawings.

First Embodiment

Figure 1:
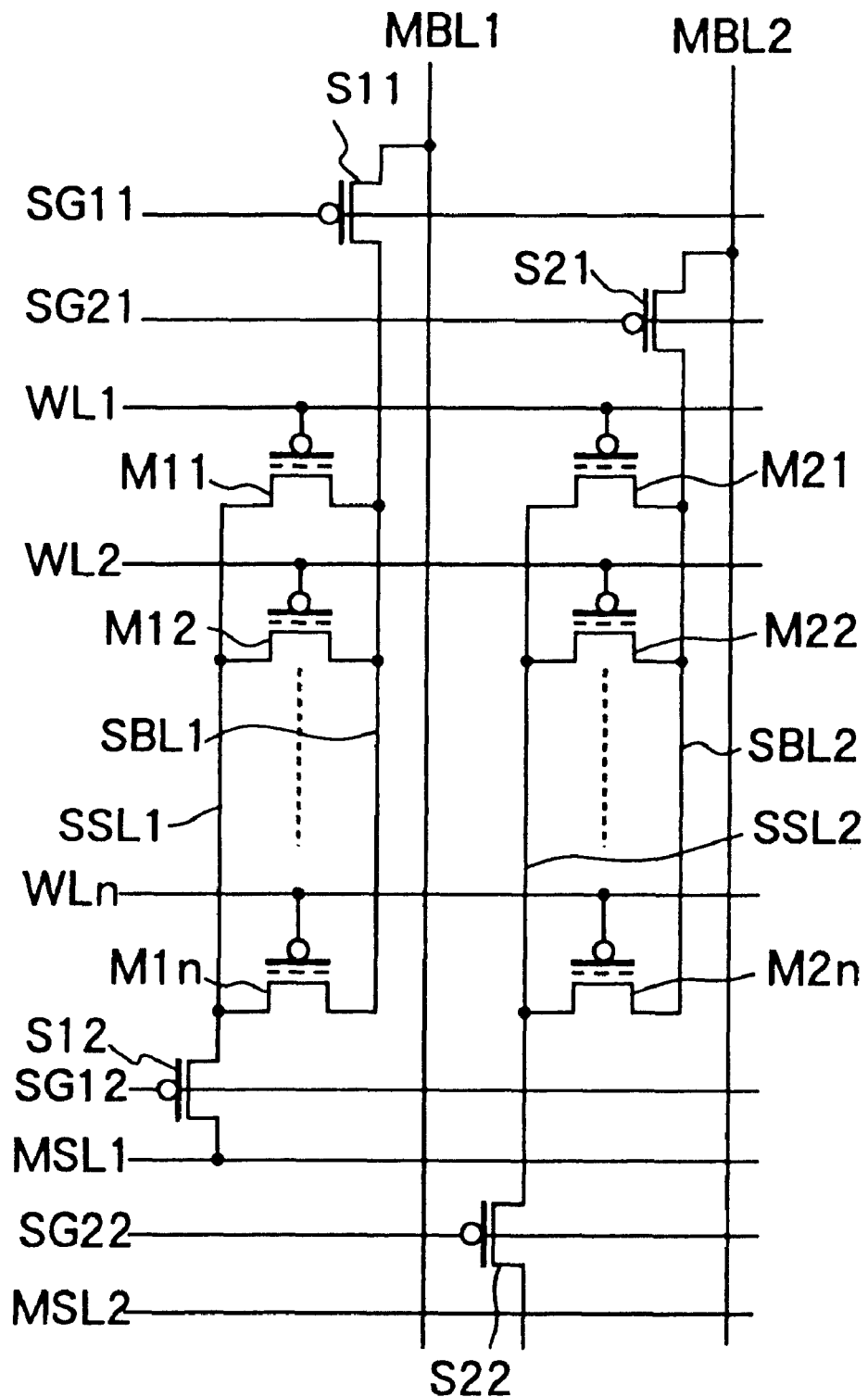
FIG. 1 is a circuit diagram of the configuration of a memory cell array of a nonvolatile semiconductor memory device according to a first embodiment of the present invention.
Figure 2:
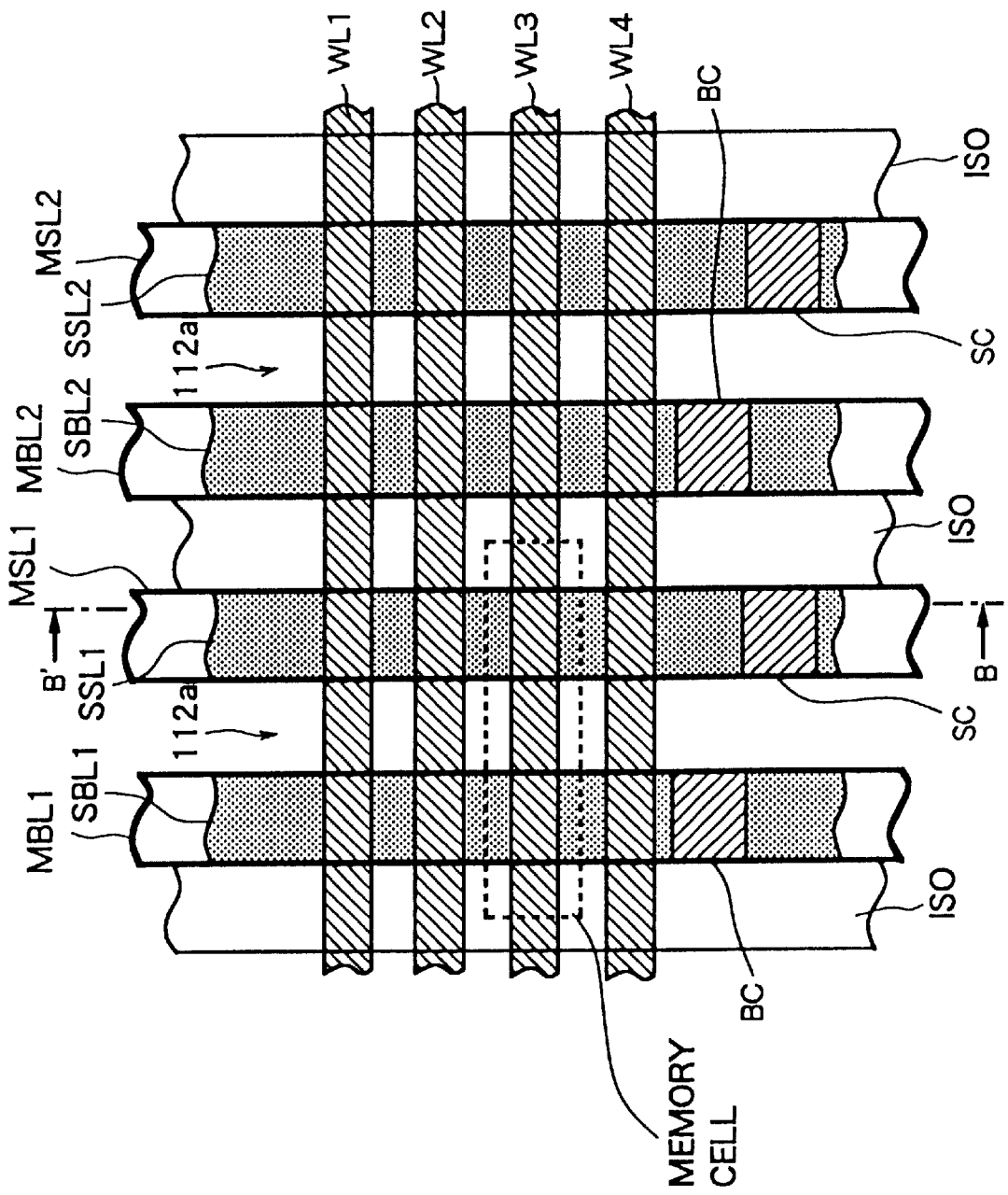
FIG. 2 is a plan view of an NOR type memory cell array according to the first embodiment of the present invention.
Figure 3:
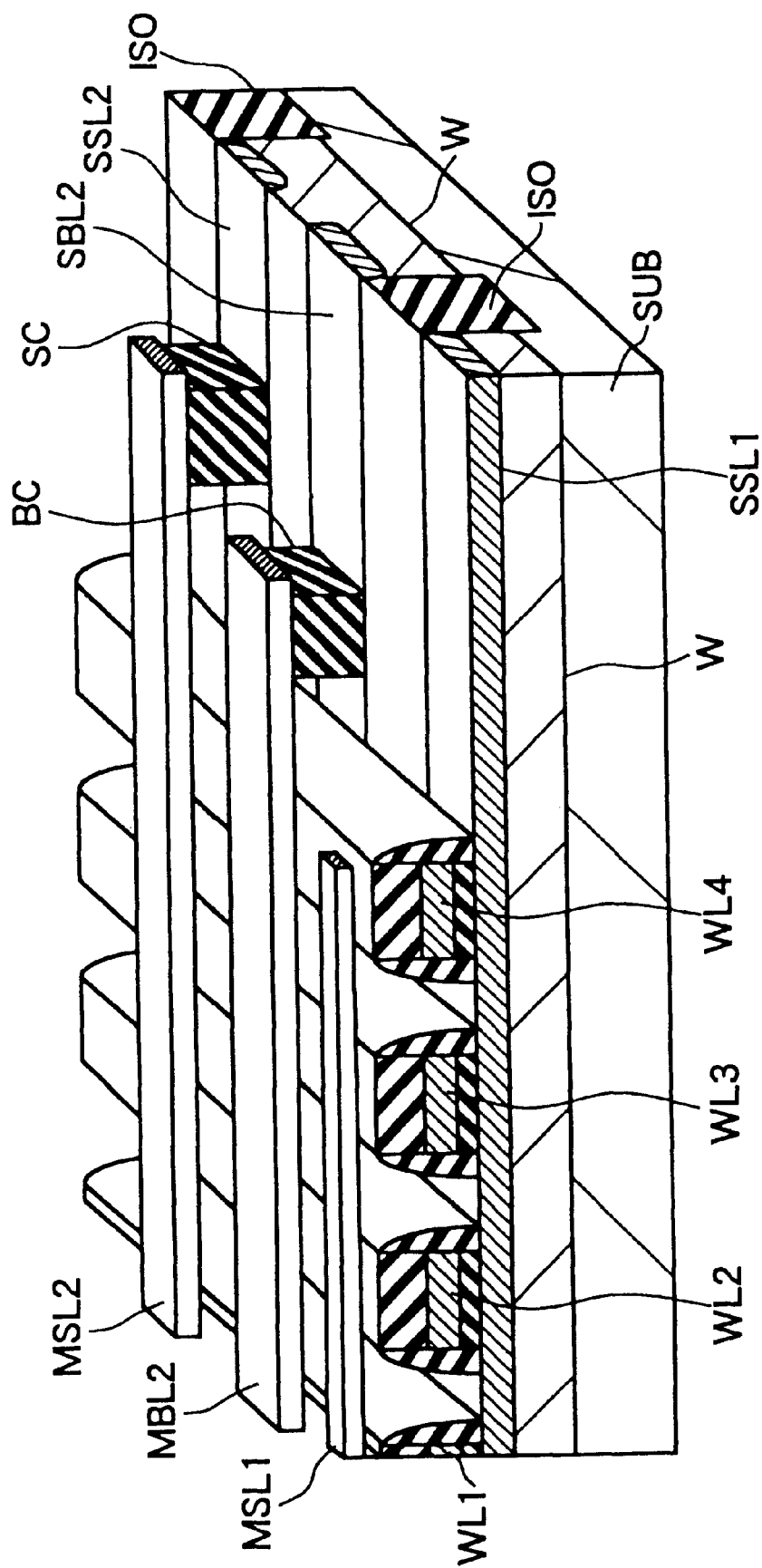
FIG. 3 is a cross-sectional bird's-eye view of the NOR type memory cell array according to the first embodiment of the present invention along the line BB' shown in FIG. 2.

FIG. 1 is a circuit diagram of the memory cell array of a nonvolatile semiconductor memory device according to the first embodiment of the present invention, FIG. 2 is the plan view of an NOR type memory cell array, and FIG. 3 is a cross-sectional bird's-eye view along the line BB' in FIG. 2.

In the present nonvolatile semiconductor memory device, bit lines (first common lines) are hierarchized into main bit lines and sub-bit lines, while source lines (second common lines) are hierarchized into main source lines and sub-source lines.

A sub-bit line SBL1 is connected to a main bit line MBL1 through a select transistor S11, and a sub-bit line SBL2 to a main bit line MBL2 through a select transistor S21. Further, a sub-source line SSL1 is connected to a main source line MSL1 through a select transistor S12, and a sub-source line SSL2 to a main source line MSL2 through a select transistor S22.

Memory transistor $M_{11}$ to $M_{1n}$ (for example, n=64) are connected in parallel to the sub-bit line SBL1 and the sub-source line SSL1, and memory transistors $M_{21}$ to $M_{2n}$ are connected in parallel to the sub-bit line SBL2 and the sub-source line SSL2. The n number of memory transistors connected in parallel to each other and the two select transistors (S11 and S12, or S21 and S22) compose a unit block of the memory cell array.

The gate electrodes of the memory transistors $M_{11}$, $M_{21}$ . . . adjacent in the word line direction are connected to the word line WL1. Similarly the date electrodes of the memory transistors $M_{12}$, $M_{22}$ . . . are connected to the word line WL2. Further, the gate electrode of the memory transistors $M_{1n}$, $M_{2n}$, . . . are connected to the word line WLn.

The select transistors $S_{11}$, . . . adjacent in the word line direction are controlled by a select line SG11, While select transistors $S_{21}$ . . . are controlled by a select line SG21. Similarly, select transistors $S_{12}$, . . . adjacent in the word line direction are controlled by a select line SG12, while select transistors $S_{22}$, . . . are controlled by a select line SG22.

In this miniature NOR type cell array, as shown in FIG. 3, n-wells NW are formed in the vicinity of the surface of the semiconductor substrate SUB. The n-wells NW are separated in the word line direction by element isolation layers ISO which are formed by burying an insulator into trenches and are arranged in parallel stripes.

An n-well W region separated by the element isolation layers ISO becomes the active region of a memory transistor. A p-type impurity is doped at a high concentration into parallel stripes at a distance from each other at the two sides of the active region in the width direciton, thereby forming sub-bit lines SBL1, SBL2 (hereinafter indicated by SBL) and sub-source lines SSL1, SSL2 (hereinafter indicated by SSL) forming the source and drain regions in the present invention.

Above and perpendicular to the sub-bit lines SBL and the sub-source lines SSL via insulating films, word lines WL1, WL2, WL3, WL4, . . . (hereinafter indicated by WL) are arranged at regular intervals. These word lines WL are above the n-well W and the element isolation films ISO via the insulating films containing the charge storing means inside.

The intersecting portion of a portion of an n-well W between a sub-bit line SBL and a sub-source line SSL with a word line WL forms the channel forming region of a memory transistor. The region of the sub-bit line and the region of the sub-source line adjacent to the channel forming region function as the drain and source, respectively.

The word lines WL are covered by offset insulating layers on their upper surfaces and sidewall insulating layers on their sidewalls (in the present case, a normal interlayer insulating film is also possible).

In these insulating layers, bit contacts BC contacting the sub-bit lines SBL and source contacts SC contacting the sub-source lines SSL are formed at certain intervals. For example, one bit contact BC and one source contact SC are set for every 64 memory transistors in the bit line direction.

Above the insulating layers, main bit lines MBL1, MBL2, . . . in contact with the bit contacts BC and main source lines MSL1, MSL2, . . . , in contact with the source contacts SC are formed alternately in parallel stripes.

In this miniature NOR type cell array, the first common lines (bit lines) and the second common lines (source lines) are hiorarchical in structure, hence it is not necessary to set a bit contact BC and a source contact SC for each memory cell. Accordingly, in principle, there is no variation in the contact resistance itself. A bit contact BC and a source contact SC are formed for example for every 64 memory cells. If plugs are not formed by self alignment, the offset insulating layers and the sidewall insulating layers are not needed. That is, an ordinary interlayer insulating film is deposited thickly to bury the memory transistors, then contacts are opened by the conventional photolithography and etching.

Since a quasi contactless structure is formed wherein the sub-lines (sub-bit lines and sub-source lines) are formed by the impurity regions, there is almost no wasted space, so when forming layers by the minimum line width F of the limit of the wafer process, very small cells of areas close to $8F^2$ can be fabricated.

Moreover, because the bit lines and source lines are hierarchized and select transistors S11 or S21 separate the parallel memory transistor groups in nonselected unit blocks from the main bit lines MBL1 or MBL2, the capacitances of the main bit lines are appreciably reduced and the speed increased and power consumption decreased. In addition, due to the functions of the select transistors S12 and S22, the sub-source lines are separated from the main source lines enabling a reduction in capacitances.

To further increase speed, the sub-bit lines SBL and sub-source lines SSL may be formed by impurity regions clad with a silicide and the main bit lines MBL and main source lines MSL may be made metal interconnections.

Figure 4:
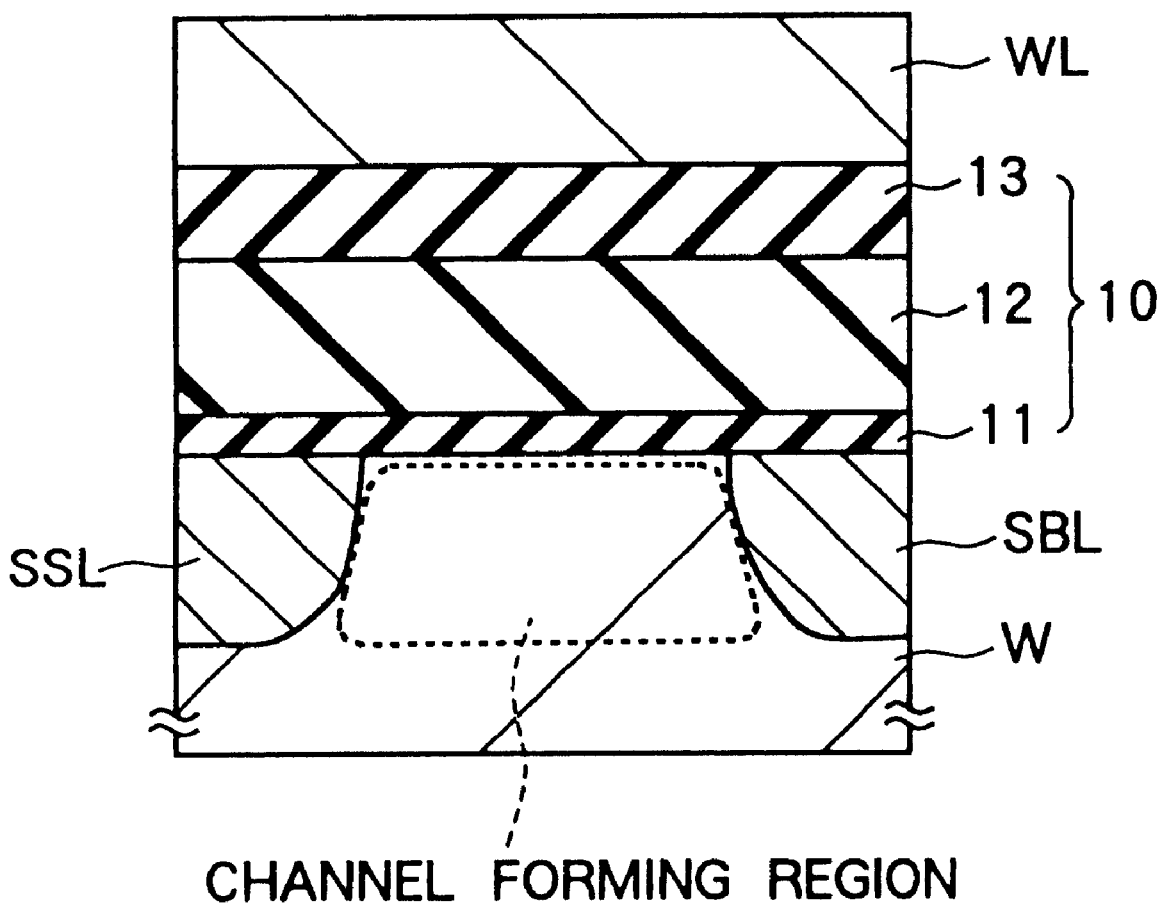
FIG. 4 is an enlarged cross-sectional view of a memory transistor according to the first embodiment of the present invention in the word line direction.

FIG. 4 is an enlarged cross-sectional view of a memory transistor in the word line direction.

In FIG. 4, the region between the sub-bit line SBL and the sub-source line SSL crossing with a word line is the channel forming region of that memory transistor.

On the channel forming region, a gate electrode (word line WL) is stacked via a gate insulating film 10. Usually the word line WL is comprised of polysilicon that is made conductive by doping a p-type or n-type impurity at a high concentration (doped poly-Si) or of a stacked film of doped poly-Si and a refractory metal silicide. The effective part of the word line (WL), that is, the length equivalent to the source-drain distance in the channel direction (gate length) is below 0.1 $\mu$m, for example; 80 nm to 90 nm.

In the present embodiment, the gate insulating film 10 consists of a bottom insulating film 11, a nitride film 12, and a top insulating film 13 in order from the bottom.

The bottom film 11, for example, is formed by forming an oxide film, then transforming this to a nitride film. The thickness of the bottom film 11 can be selected in the range from 2.5 nm to 6.0 nm corresponding to the application. Here, it is set in the range of 2.7 nm to 3.5 nm here.

The nitride film 12 is comprised of, for example, a silicon nitride film [$Si_xN_y$ (0<x<1, 0<y<1)] that is 6.0 nm in thickness. The nitride film 12 is fabricated by low pressure chemical vapor deposition (LP-CVD) and includes a large number of carrier traps. The nitride film 12 exhibits a Pool-Frankel type (PF type) electroconductivity.

The top insulating film 13 is formed by thermally oxidizing a formed nitride film since it is necessary to form deep carrier traps at a high density near the interface with the nitride film 12. Alternatively, an $SiO_2$ film formed by high temperature chemical vapor deposited oxide (HTO) may also be used as the top insulating film 13. When the top insulating film 13 is formed by CVD, the traps are formed by heat treatment. The thickness of the top insulating film 13 must be greater than 3.0 nm, preferably over 3.5 nm, in order to effectively block the injection of holes from the gate electrode (word line WL) and prevent a reduction of the number of data write-erasure cycles.

In the fabrication of memory transistors of this structure, first, the element isolation layers ISO and n-wells W are formed in the surface of a prepared semiconductor substrate SUB, then the impurity regions forming the sub-bit lines and the sub-source lines are formed by ion implantation. If necessary, ion implantation is performed for adjustment of the threshold volatge.

Next, the gate insulating film 10 is formed on the surface of the semiconductor substrate SUB.

In more detail, the silicon dioxide film (bottom film 11) is formed by heat treatment for example at 1000° C. for 10 seconds by rapid high temperature oxidation (RTO).

Next, a silicon nitride film (nitride insulating film 12) is deposited on the bottom film 11 by LP-CVD to thicker slightly greater than the final thickness of 6 nm. This LP-CVD is performed using as a feedstock gas, for example, a mixture comprised of dichlorosilane (DCS) and ammonia at a substrate temperature of 730° C.

The surface of the formed silicon nitride film is then oxidized by thermal oxidization to form a silicon dioxide film of, for example, 3.5 nm (top insulating film 13). This thermal oxidation is performed, for example, in an $H_2O$ atmosphere at a furnace temperature of 950° C. for 40 minutes. In this way, deep carrier traps with a trap level (energy difference from conduction band of silicon nitride film) less than 2.0 eV or so are formed at a density of about 1 to $2\times10^{13}/cm^2$. The heat oxidized silicon film (top insulating film 13) is formed to a thickness of 1.5 nm with respect to a nitride film 12 of 1 nm. The thickness of the underlying nitride film is reduced according to this proportion, so the final thickness of the nitride film 12 becomes 6 nm.

A conductive film forming the gate electrodes (word lines WL) and the offset insulating layer (not shown) are attacked, then this stacked layer is processed to the same pattern.

Next, the self alignment contacts are formed along with the sidewall insulating films. Bit contacts BC and source contacts SC are formed on the sub-bit lines SBL and the sub-source lines SSL exposed through the self alignment contacts.

Then, the regions surrounding these plugs are buried with the interlayer insulating film. The main bit lines and the main source lines are formed on the interlayer insulating film, then the upper layer interconnections are formed over the interlayer insulating film, the overcoat film is formed, and pads are opened, thereby completing the nonvolatile memory cell array.

Next, an example of setting the bias and the operation of a nonvolatile memory of such a configuration will be explained using as an example the operation of writing data to a memory transistor M11.

Figure 5:
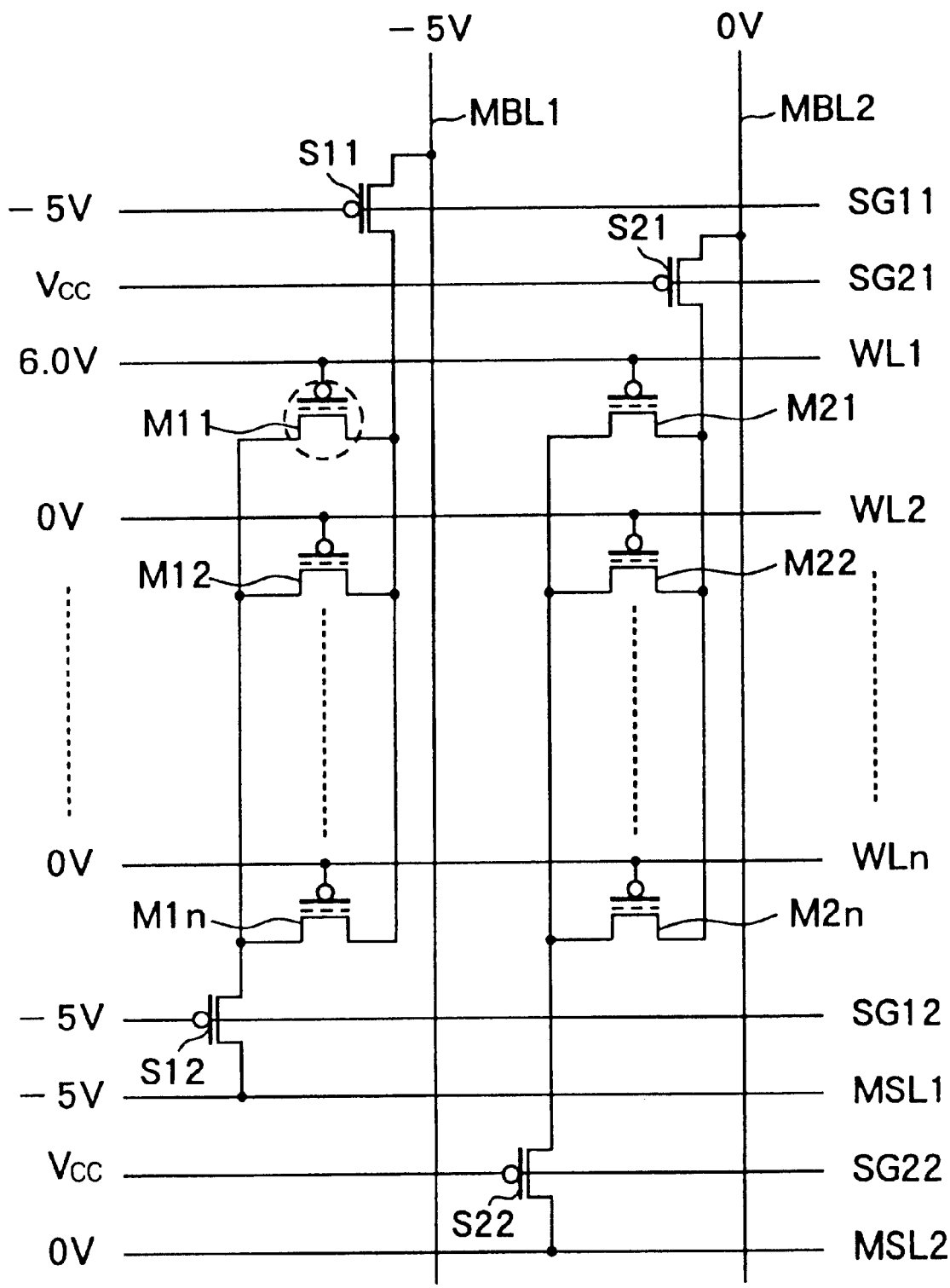
FIG. 5 is a circuit diagram showing the bias conditions of a write operation in a memory transistor according to the first embodiment of the present invention.
Figure 6:
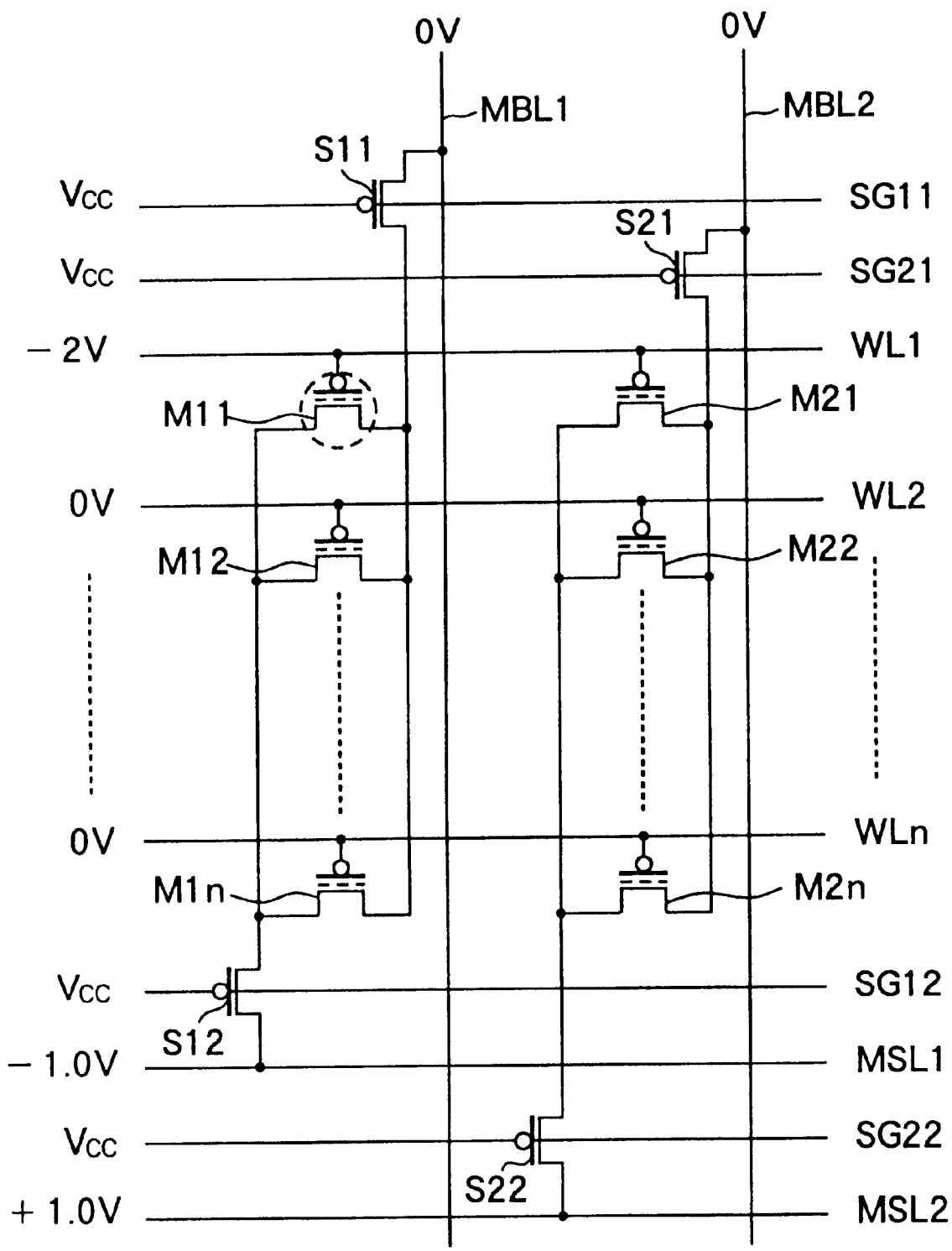
FIG. 6 is a circuit diagram showing the bias conditions of a read operation in a memory transistor according to the first embodiment of the present invention.
Figure 7:
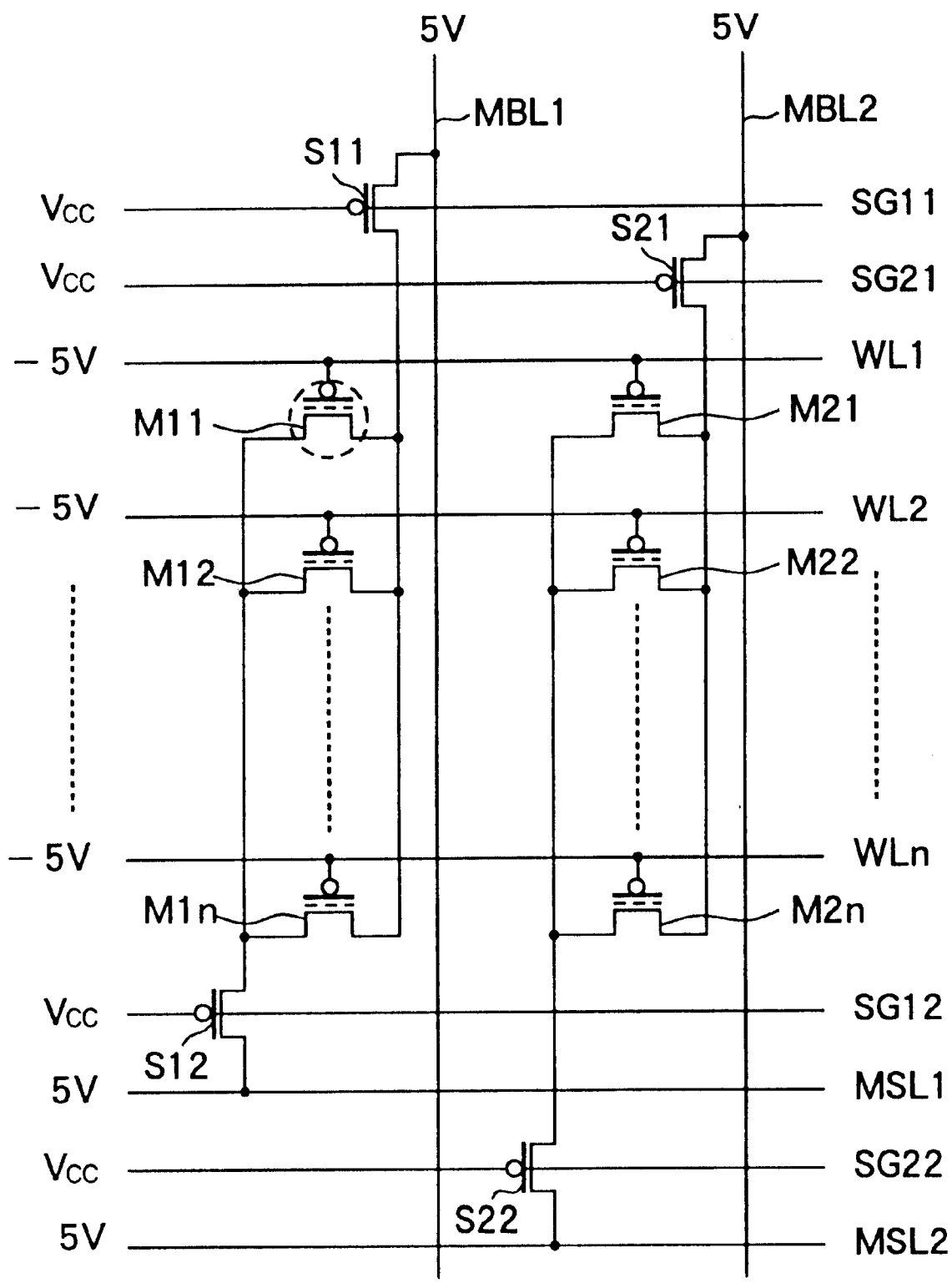
FIG. 7 is a circuit diagram showing the bias conditions of an erasure operation in a memory transistor according to the first embodiment of the present invention.
Figure 8:
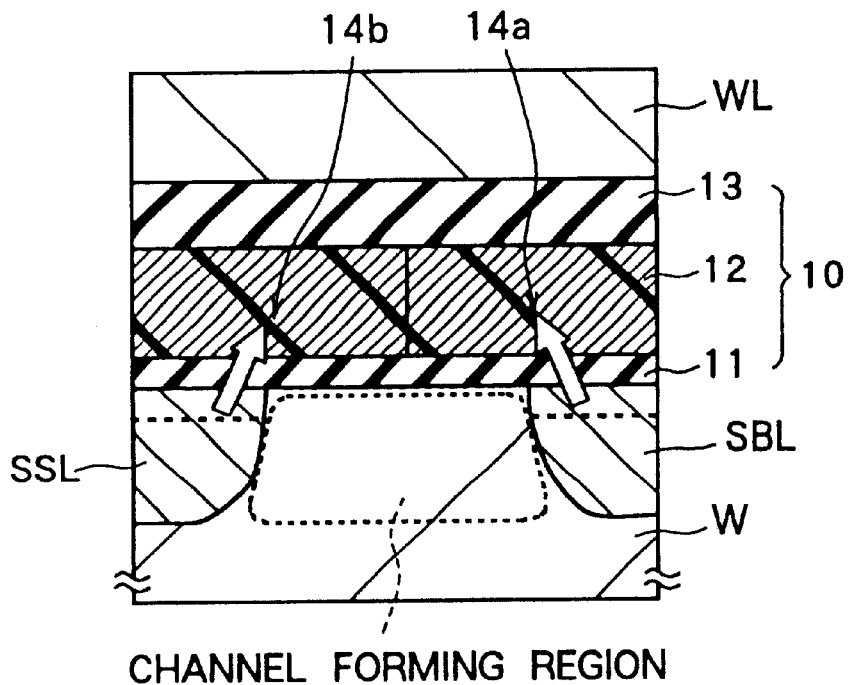
FIG. 8 is an enlarged cross-sectional view in the word line direction illustrating the write operation of a memory transistor according to the first embodiment of the present invention.
Figure 9:
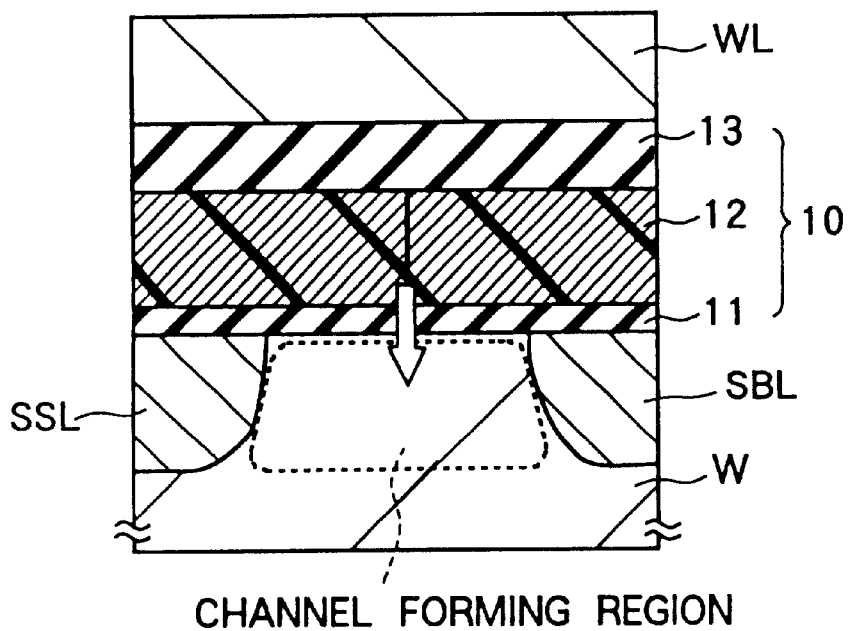
FIG. 9 is an enlarged cross-sectional view in the word line direction illustrating the erasure operation of a memory transistor according to the first embodiment of the present invention.

FIG. 5 is a circuit diagram showing the bias conditions of a write operation, FIG. 6 is a circuit diagram showing the bias conditions of a read operation, and FIG. 7 is a circuit diagram showing the bias conditions of an erasure operation. FIG. 8 is a cross-sectional view of a transistor for illustrating a write operation, while FIG. 9 is a cross-sectional view of a transistor for illustrating an erasure operation.

In a write operation, as shown in FIG. 5, a specified voltage of, for example, 6V, is applied to the selected word line WL1, and a voltage of, for example, −5V, is applied to the selected main bit line MBL1, the selected main source line MSL1, and the select lines SG11, SG12. A write inhibit voltage of, for example, 0V is applied to the nonselected word lines WL2 to WLn, while 0V is applied to the nonselected main bit line MBL2, the nonselected main source MSL2, and the substrate (n-well W). At this time, the select lines SG21 and SG22 are maintained at the power voltage Vcc.

Therefore, a voltage of −5V is transmitted to the selected sub-bit line SBL1 and the selected sub-source line SSL1, and a voltage of 0V is transmitted to the nonselected sub-bit line SBL2 and the nonselected sub-source line SSL2.

Under these write conditions, in the memory transistor M11 to which data is to be written, due to the application of a positive bias to the selected word line WL1, the surface of the impurity regions forming the sub-bit line SBL1 and sub-source line SSL1 is deeply depleted and the energy bands bend sharply. As a result, because at the band-to-band tunneling effect, electrons in the valence band tunnel to the conduction band and flow in the p-type impurity region. Those electrons drift more or less to the center of the channel forming region and are accelerated by the electric field there, whereby part become hot electrons. Their moments (magnitude and direction) are maintained and their kinetic energies are not lost much at all, therefore the electrons are injected into the carrier traps formed as the charge storing means at a high speed and with a high efficiency.

The charge injection from the p-type impurity region forming the sub-bit line SBL1 and the charge injection from the p-type impurity region forming the sub-source line SSL1 are both localized. However, because the gate length is shorter than or equal to 100 nm in the memory transistor according to the present invention, as shown in FIG. 8, in the distribution plane of the charge storing means, the area of charge injection from the SBL side 14a merges with the area of charge injection from the SSL side 14b at the center, hence, the electron injection occurs in substantially the entire area of the channel forming region. As a result, the threshold voltage of memory transistor M11 is largely deceased, and the write operation is performed. In other words, in the present embodiment, the shorter the gate length, the more efficiently electrons are injected into the entire area of the distribution plans of the charge storing means facing the channel forming region.

On the other hand, in the nonselected memory transistors in the same block M12, . . . , only 5V is applied between the gate and the source or the drain. Further, in the nonselected memory transistors in other blocks, such as M21, M22, . . . , 0V or only 6V is applied between the gate and the source or the drain. Therefore, electrons are not injected into the charge storing means, and a write operation is effectively inhibited.

In such a write process, because the charge acceleration direction is substantially the same as the injection direction, the injection efficiency is higher than the conventional CHE injection method. In addition, because a channel is not formed during a write operation, the current consumption is low. Although the hole current is small, beacuse a charge is injected into substantially the entire area of the distribution plane of the charge storing means, the write time for obtaining a necessary change of the threshold voltage is, for example, less than 10 μs or reduced by more than one order of magnitude comparing with the conventional case.

In the above write operation, blocks containing the selected cells that should be written and blocks containing the nonselected cells that should be inhibited are set using the bias conditions.

In the present embodiment, it is possible to select all blocks to write all the cells connected to the word line WL1 simultaneously. Due to the aforesaid improvement of the injection efficiency, the write current per bit is decreased by more than one order of magnitude, so the number of cells able to be written in parallel at one time is increased to about one kB in present embodiment compared with only one byte of cells with the conventional CHE injection method.

When reading data, the read operation is basically a page read.

As shown in FIG. 6, while the main bit lines MBL1, MBL2, . . . are grounded, a specified negative voltage of, for example, −1.0V, is applied to the main source line. A specified read inhibit voltage, for example, 0V, is applied to the nonselected word lines WL2, WL3, . . . . . 0V is also applied to the main bit lines MBL1 and MBL2 and the substrate (n-well W). In addition, all the select lines SG11, SG21, SG12, SG22 are maintained at the power voltage Vcc. Under these conditions, a specified read word line voltage of, for example, −2.0V, is applied to word line WL1 that should be read.

In this way, memory transistors $M_{11}$, $M_{21}$ . . . that are connected to word line WL1 are turned on or turned off in accordance with the write conditions. That is, a channel is formed in a memory transistor in the erasure state where no electrons are stored, while a channel is not formed in a memory transistor in a write state where electrons are stored. Only the voltage on the main bit line changes when the memory transistor is turned on. This change in voltage is amplified and read out by a not shown sense amplifier etc.

Erasure is performed by extracting electrons using FN tunneling or direct tunneling.

For example, in the case of erasing an entire block at one time by extracting electrons held in the charge storing means from the entire channel region by direct tunneling, as shown in FIG. 7, −5V is applied to all word lines WL1, WL2, and 5V is applied to all main bit lines MBL1, MBL2, all main source lines MSL1, MSL2, and the substrate (n-well W). At this time, all select lines SG11, SG21, SG12, SG22 are kept at the power voltage Vcc.

In this way, as shown in FIG. 9, electrons held in carrier traps formed as the charge storing means are extracted from the entire channel region to the substrate side, the threshold voltage rises, and erasure is performed. The time for erasure by extracting the electrons can be reduced to about 10 ms or improved by more than one order of magnitude comparing with the typical erasure time of 100 ms of the conventional hole injection erasure using the direct tunneling effect. Further, in the conventional erasure method by hole injection, the time for the charge to pass through the bottom film is longer than with a write operation, so the insulating film may deteriorate. In the present invention, since erasure is performed by extracting electrons, the reliability is high.

It was found a sufficient reduction in the threshold voltage could be obtained when hot electrons were locally injected from the source and drain sides in a memory transistor with a gate length as short as about 90 nm according to the first embodiment. It is thus suggested that by shortening the gate length to 90 nm, the electron injection area is extended to the whole area of the plane of the charge storing means facing the channel and this largely contributes to the reduction of the threshold voltage.

Due to the above, a write speed of the 10 μs is achieved in a MONOS transistor with a gate length of 90 nm.

The current-voltage characteristics of the memory transistor were studied in both the write and erasure states.

The results showed that at a drain voltage of −1.0V, the off leakage current from a nonselected cell was a small one of about 1 nA. Since in this case the read current is greater than 10 μA, a mistaken read of a nonselected cell does not happen. Thus, it was found there was a sufficient margin of the punch-through endurance voltage in a read operation in a MONOS type memory transistor with a gate length of 90 nm.

The read disturbance characteristic was also evaluated. It was found that even after more than $3 \times 10^8$ seconds had passed, it was still possible to read the data.

Because the carrier traps are spatially dispersed, the number of possible write-erasure cycles is found to be more than $1 \times 10^6$.

The data retention characteristic is over 10 years at 85° C. after $1 \times 10^6$ write-erasure cycles.

From the above results, it was varified that a sufficiently high performance was achieved as an MONOS type nonvolatile memory transistor with a gate length of 90 nm.

In the nonvolatile memory device according to the present embodiment, as described above, since the write operation is performed using hot electrons caused by the band-to-band tunneling, the injection efficiency is improved by 2 to 3 orders of magnitude comparing with the CHE injection method, thus a high speed write operation is possible. In addition, since erasure is performed by extracting electrons, not by injecting hot holes, the deterioration of the insulating film due to hole injection is suppressed.

Second Embodiment

The second embodiment relates to writing into a part of the region of distribution of the charge storing means in the gate insulating film and to writing 2 bits in one cell at one time by selecting bit lines and/or source lines.

In the nonvolatile memory devices according to the second embodiment, the structure of the memory cell array and transistor structure are the same with those in the first embodiment. FIG. 1 to FIG. 4 are also applicable to the present embodiment. In the present embodiment, however, the gate length of the memory transistor of the structure shown in FIG. 4 is longer than that in the first embodiment, that is, it is below 0.25 μm, for example, is 0.18 μm.

FIG. 5 to FIG. 7 showing the bias conditions are also basically applicable although there are some changes in the conditions set as follows.

Figure 10:
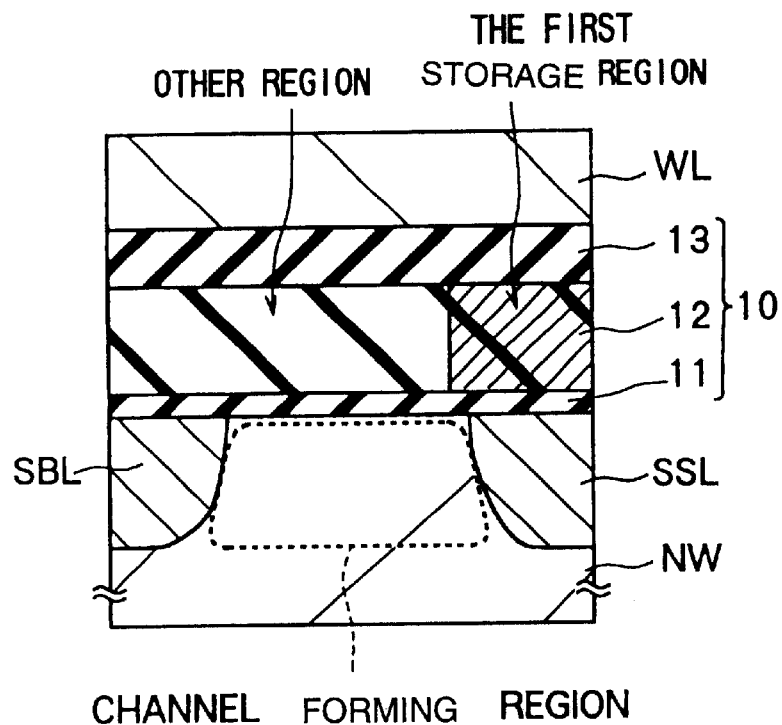
FIG. 10 is a cross-sectional view illustrating a one-side write (one-bit write) state of a memory transistor according to a second embodiment of the present invention.

FIG. 10 illustrates the state of performing a write operation at the side of the sub-source line SSL in a MONOS type memory transistor according to the present embodiment.

When performing a write operation on the memory transistor M11 shown in FIG. 5, the control line SG11 is changed to for example 0V to make the p-channel type select transistor S11 cut off. The other bias conditions are set the same as in FIG. 5. As a result, the sub-bit line SBL1 connected to the memory transistor M11 is set electrically floating. Since this potential rises, there is no effective voltage applied between the sub-bit line SBL1 and the gate electrode (selected word line WL1). On the other hand, between the sub source line SSL1 and the selected word line WL1, as described above, a write voltage of about 11V is applied, therefore hot electrons caused by the band-to-band tunneling current are locally injected into the gate insulating film at the side of the sub-source line SSL1 (first storage region) and are locally held therein.

Figure 11:
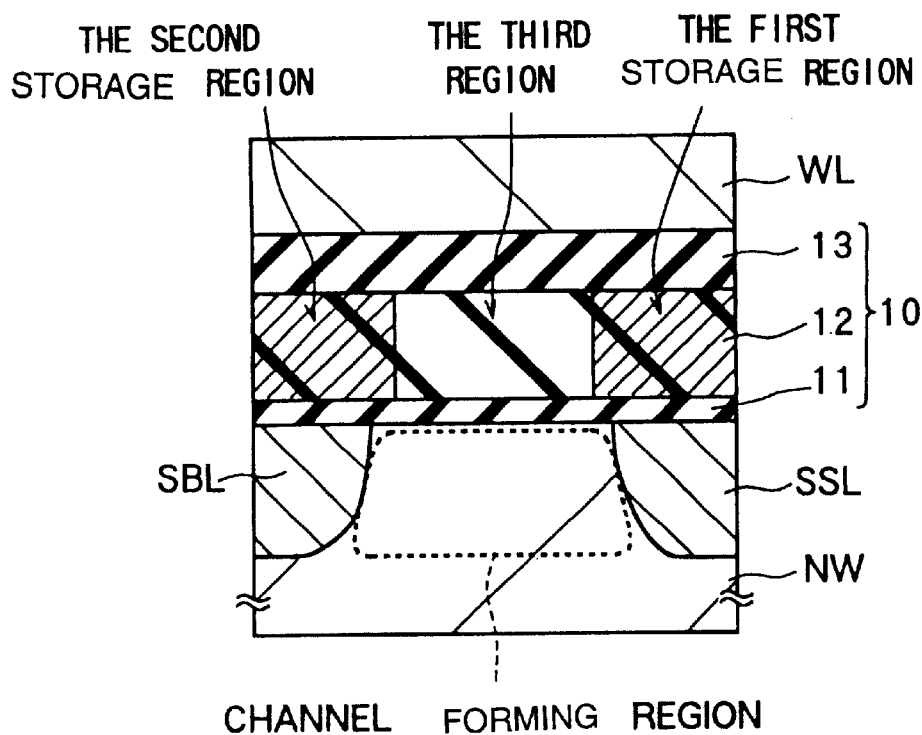
FIG. 11 is a cross-sectional view illustrating a two-side write (two-bit write) state of a memory transistor according to the second embodiment of the present invention.

Conversely, when writing to the region at the side of the sub-bit line SBL1, the select transistor S11 is turned on, the voltage on the control line SG11 is set at a high level, and the p-channel type select transistor is made to cut off, so the sub-source line is placed in a floating state. Therefore, hot electrons caused by the band-to-band tunneling current are locally injected into the gate insulating film at the side of the sub-bit line SBL1 (second storage region) and are locally held therein. FIG. 11 shows a memory transistor wherein data are independently written to the first and the second storage regions. Between the first and the second storage regions, there exists a third region into which hot electrons are not injected, thus these two bits of data can be distinguished unambiguously.

When reading data, the direction of application of the source and drain voltage (voltage between main bit line MBL1 and main source line MSL1) is determined so that the first or the second storage region where the charge to be read is stored becomes the hole source (source side). For example, using the same bias conditions as those shown in FIG. 6, it is possible to change the voltage to the main source line MSL1 to −1.5V and to read the data in the source side, that is, the second storage region at the sub-bit line SBL1 side.

Conversely, to read the data in the first storage region at the side of the sub-source line SSL1, the main bit line MBL1 is made a low voltage, for example, −1.5V, while the main source line MSL1 is made a high voltage, for example, the grounding voltage.

Therefore, it is possible to independently read the two bits of data recorded in one cell by switching the application direction of the source and drain voltage in accordance with the location of the stored data (first or second storage region). When miniaturizing a two-bit cell, the drain voltage is −1.0V and the gate voltage etc. are almost the same as with the case of a gate length of 0.18 μm.

The erasure is the same as with the first embodiment.

In the second embodiment, in the same way as with the first embodiment, since the write operation is performed by using hot electrons caused by the band-to-band tunneling current, the injection efficiency is improved by 3 orders of magnitude comparing with the conventional CHE injection method, thus a high speed write is possible. In addition, since the gate length is longer than that in the first embodiment, two bits of data can be recorded independently at the first and second storage regions of the gate insulating film 10 in the channel direction. Further, in the read operation, by switching the application direction of the voltage between the source and drain, the two bits of data recorded in one memory cell can be correctly read. Moreover, in the present MONOS structure storing two bits in one cell, when the gate length of the control transistor of the MOS structure at the center is made short, the gate length can be reduced to 0.1 μm or even shorter by optimizing the shape of the transistor, the effective gate length, or the profile of the impurity.

Below, examples of modifications of the configurations and patterns of the memory cell arrays of the first and the second embodiments will be explained in the third to sixth embodiments.

Third Embodiment

Figure 12:
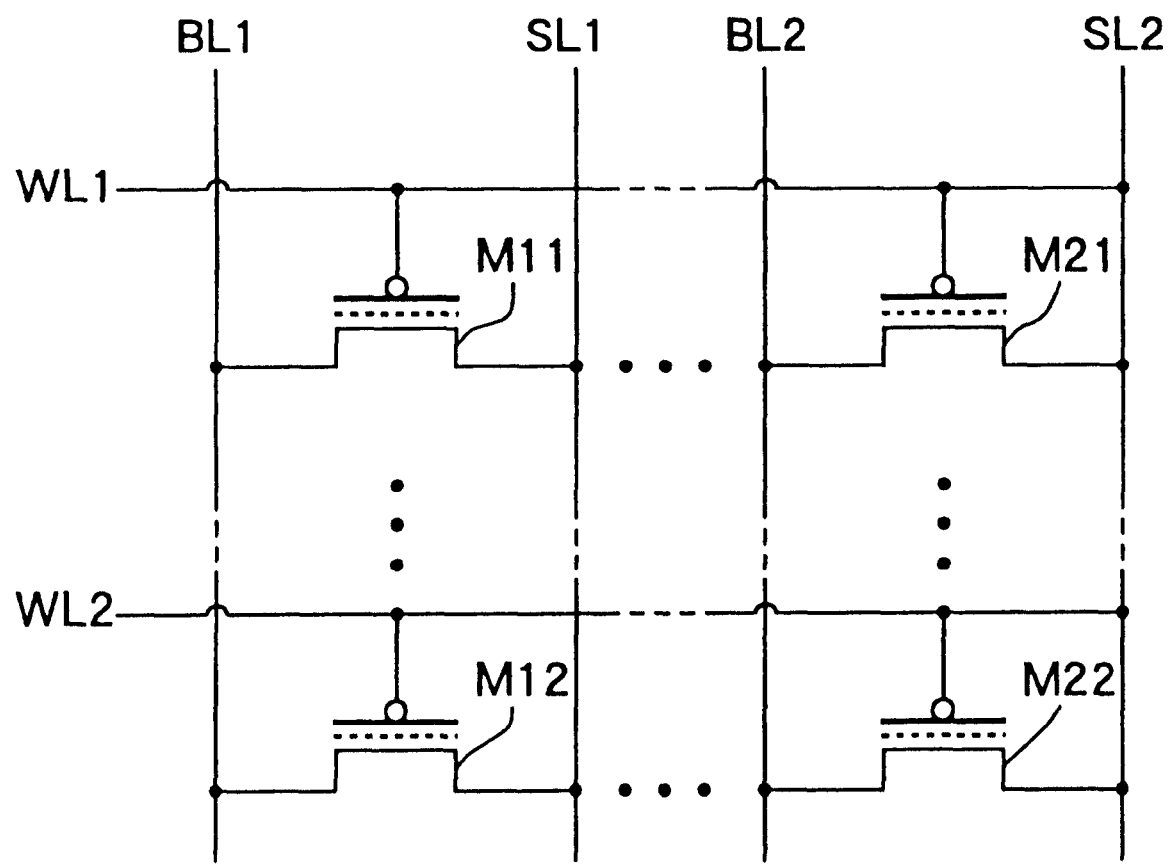
FIG. 12 is a circuit diagram of the configuration of a memory cell array of a nonvolatile semiconductor memory device according to a third embodiment of the present invention.

FIG. 12 is a circuit diagram for illustrating the general configuration of a separated source line NOR type memory cell array of a nonvolatile semiconductor memory according to the third embodiment.

In this nonvolatile memory device, each memory cell in the NOR type memory cell array is comprised of one memory transistor. As shown in FIG. 12, memory transistors M11 to M22 are arranged in a matrix. Word lines, bit lines, and separated source lines are arranged between adjacent transistors.

Namely, the drains of adjacent memory transistors M11 and M12 in the bit line direction are connected to a bit line BL1, while their sources are connected to a source line SL1. Similarly, the drains of adjacent memory transistors M21 and M22 in the bit line direction are connected to a bit line BL2, while their sources are connected to a source line SL2.

Further, the gates of adjacent memory transistors M11 and M21 in the word line direction are connected to a word line WL1. Similarly, the gates of adjacent memory transistors M12 and M22 in the word line direction are connected to a word line WL2.

Such a cell arrangement and connections between cells are repeated in the entire memory cell array.

Figure 13:
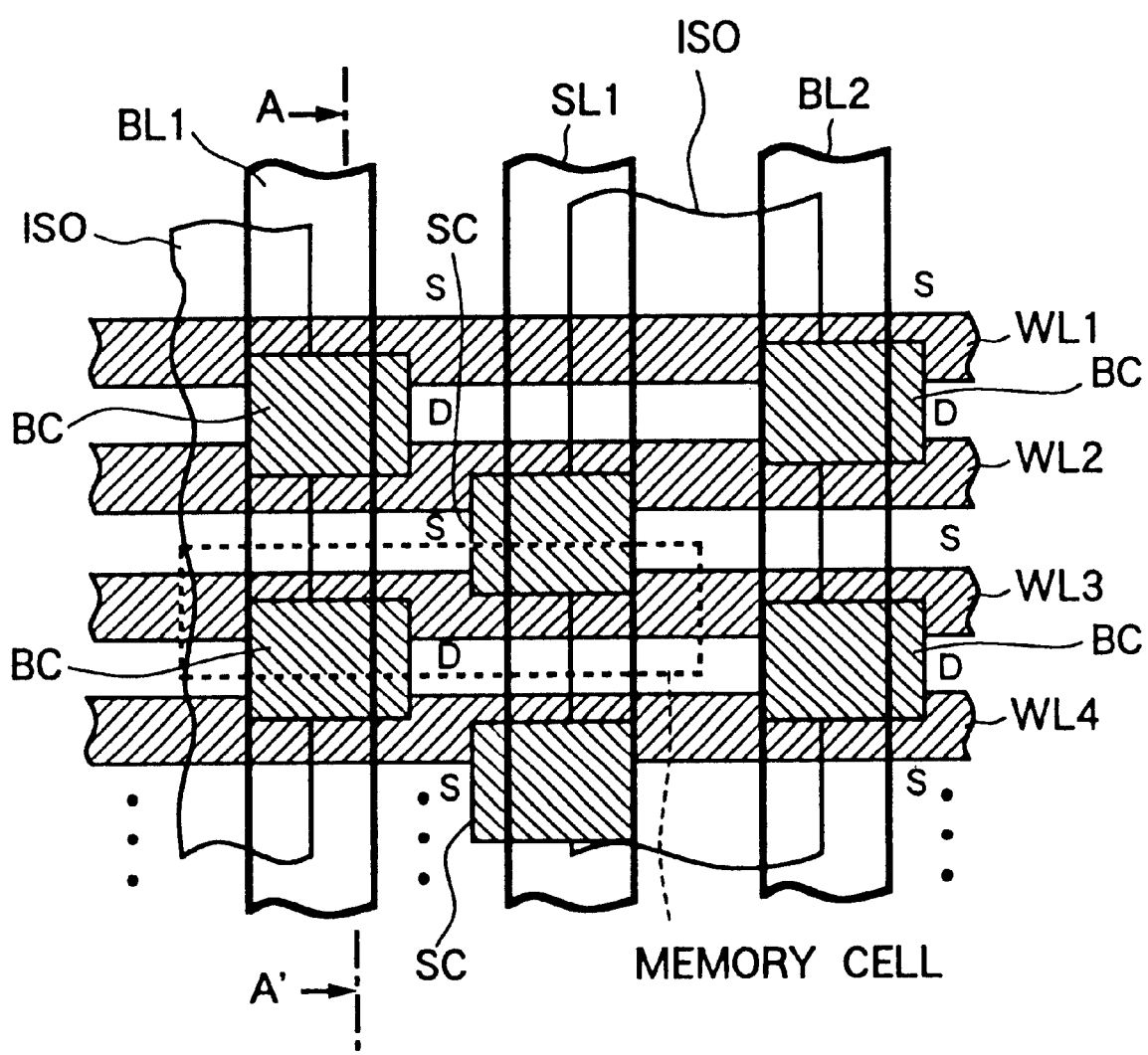
FIG. 13 is a plan view of a separated source line NOR type memory cell array according to the third embodiment of the present invention.
Figure 14:
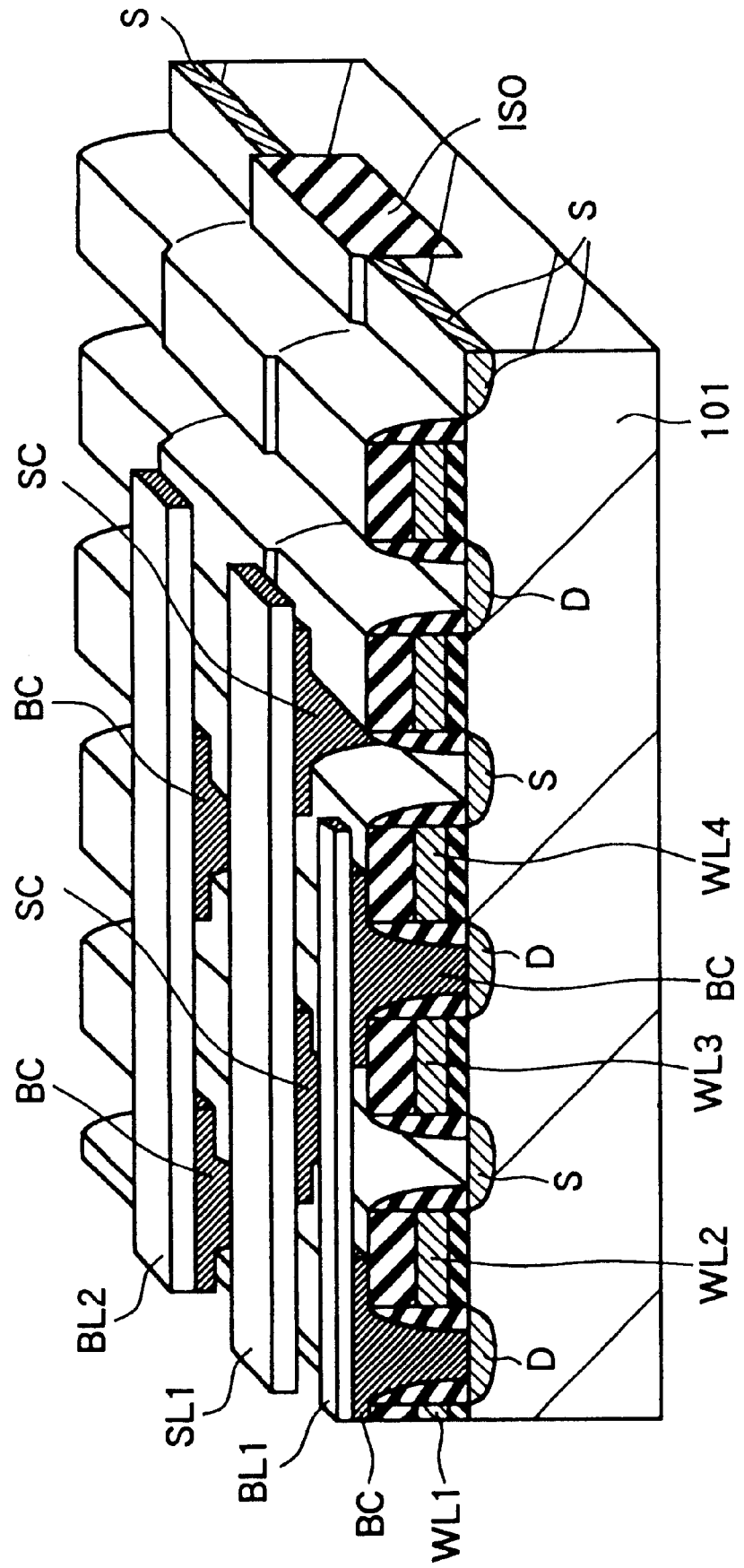
FIG. 14 is a cross-sectional bird's-eye view of a separated source line NOR type memory cell array according to the third embodiment of the present invention along the line AA' shown in FIG. 13.

FIG. 13 is a schematic plan view of a miniature NOR type memory cell array according the third embodiment, while FIG. 14 is a cross-sectional bird's-eye view along the line A–A' shown in FIG. 13.

In the miniature NOR type memory cell array, as shown in FIG. 14, the element isolation layers ISO are formed by trenches or LOCOS in the surface of an n-type semiconductor substrate SUB (an n-well is also usable). As shown in FIG. 13, the element isolation layers ISO are arranged in parallel stripes in the bit line direction (vertical direction in FIG. 12). Substantially perpendicular to the element isolation layers ISO, word lines WL1, WL2, WL3, WL4, . . . are arranged at regular intervals. As in the first embodiment, such word lines are made by stacking a polysilicon or other gate electrode and a gate insulating film comprised of a bottom insulating film, a nitride film, and a top insulating film.

In the active region between adjacent element isolation layers ISO, an impurity of opposite conductive type to the substrate SUB is introduced at a high concentration into the regions between adjacent word lines to form the source impurity regions S and drain impurity region D alternately. The sizes of S and D in the word line direction (the horizontal direction in FIG. 12) are determined only by the interval of adjacent element isolation layers ISO. In the bit line direction, they are determined only by the interval of adjacent word lines. Therefore, the source impurity region S and the drain impurity region D can be formed extremely uniformly in size and arrangement because almost no mask alignment error introduced.

Word lines are covered by insulating layers on their upper surfaces and sidewalls. Namely, in the same pattern, the offset insulating layers are formed on the upper surfaces of word lines WL1, WL2, . . . . The sidewall insulating layers are formed on the two sidewalls of the stacked patterns including the offset insulating layers, and thereunder the gate electrodes (word lines) and the gate insulating films. Because of the formation of the offset insulating layers and the sidewall insulating layers, there appears long and narrow spaces along the word lines between adjacent word lines acting as self alignment contact holes.

Conductive materials are alternately buried into the self alignment contact holes so as to partly overlap the source impurity region S or the drain impurity region D. Due to this, bit contacts BC and source contacts SC are formed.

In the formation of these contact BC and SC, the conductive materials are deposited until the entire regions of the self alignment contact holes are buried and resist patterns used for etching masks are formed over them. At this time, resist patterns are formed one size larger than the width of the self alignment contact holes. Further, parts overlap with the element isolation film. Then, the resist patterns are used as masks and the conductive materials around the resist patterns are removed by etching. Due to this way, two kinds of contacts BC and SC are formed at one time.

The depressions surrounding the contacts are buried with not shown insulating films. On these insulating films, bit lines BL1, BL2, . . . in contact with the bit contacts BC and source lines SL1, . . . in contact with the source contacts SC are formed alternately in parallel stripes.

In this miniature NOR type cell array, the contacts for bit lines or source lines are formed by forming the self alignment contact holes and forming the plugs. In the formation of the self alignment contact holes, the isolation from the word lines is achieved and the exposed surfaces of the source impurity regions S or the drain impurity regions D are uniformly formed. Further, the bit contacts and the source contacts are formed on the exposed surfaces of the source impurity regions S or of the drain impurity regions D inside the self alignment contact holes. Therefore, the size of the surface of each plug contacting the substrate in the bit line direction is substantially determined by the formation of the self alignment contact holes. Thus, there is little variation in the contact areas.

It is easy to isolate the bit contacts BC or the source contacts SC from the word lines. That is, the offset insulating layers are formed at one time when forming the word lines, then the sidewall insulating layers are formed by just forming the insulating films and etching the entire region (etchback).

In addition, since the bit contacts BC and the source contacts SC, or the bit lines and the word lines are severally formed by patterning the same layer of conductive film, the interconnection structure is extremely simple, and the number of processes is small, and therefore this structure is advantageous in maintaining the manufacturing costs low.

Further, since there is almost no wasted space, if each layer is formed at the minimum line width F of the limit in the wafer process, very small cells of areas close to $8F^2$ can be fabricated.

The basic structure of the MONOS type memory transistor according to the third embodiment is the same as that of the first and second embodiments. In the memory transistor according to the third embodiment, however, the facing direction between the source impurity regions S and drain impurity regions D, that is, the channel direction, is perpendicular to the direction of the word lines WL. Therefore, the gate length is substantially determined by the width of the word lines.

In the fabrication of memory transistors of this structure, the major difference from the first embodiment is that source and drain impurity regions S and D are formed after the formation of the word lines. That is, in the same way as in the first embodiment, after the formation of the element isolation layers ISO, and formation and processing of the gate insulating films and the gate electrodes, the source impurity regions S and the drain impurity regions D are formed by ion implantation by self alignment with the formed patterns.

Next, to construct the structure of the memory cell array shown in FIG. 14, self alignment contact holes are formed together with the sidewall insulating films, then the bit contacts BC and the source contacts SC are formed on the source impurity regions S and the drain impurity regions D exposed through the self alignment contact holes.

Then, the areas surrounding the contacts are buried with interlayer insulating films. Bit lines and source lines are formed on the interlayer insulating films, then when necessary upper layer interconnections are formed over the interlayer insulating films, an overcoat is formed, pads are made, etc. to complete the nonvolatile memory cell array.

In the first and the second embodiments, the transistor's source and drain voltages are transmitted to the sub-bit lines SBL and the sub-source lines SSL through the select transistors.

In the present embodiment, the voltages transmitted to the sub-bit lines SBL and the sub-source lines SSL in the first and the second embodiments are directly applied to the bit lines BL and the source lines SL. Therefore, operations the same as those in the first and the second embodiments, that is, write, read, and erasure, become possible. The procedure of injecting charges in the transistors is the same as the first and second embodiments, so the detailed explanation is omitted.

As a modification of the present embodiment, even the source lines and/or the bit lines are formed from the semiconductor impurity regions in the same way as the first embodiment and these impurity regions are connected to metal interconnections through contacts for every 32 to 128 memory cells, the same effects as the first and the second embodiments can be achieved.

Fourth Embodiment

The fourth embodiment relates to a modification of the aforesaid memory cell array configuration of the third embodiment.

Figure 15:
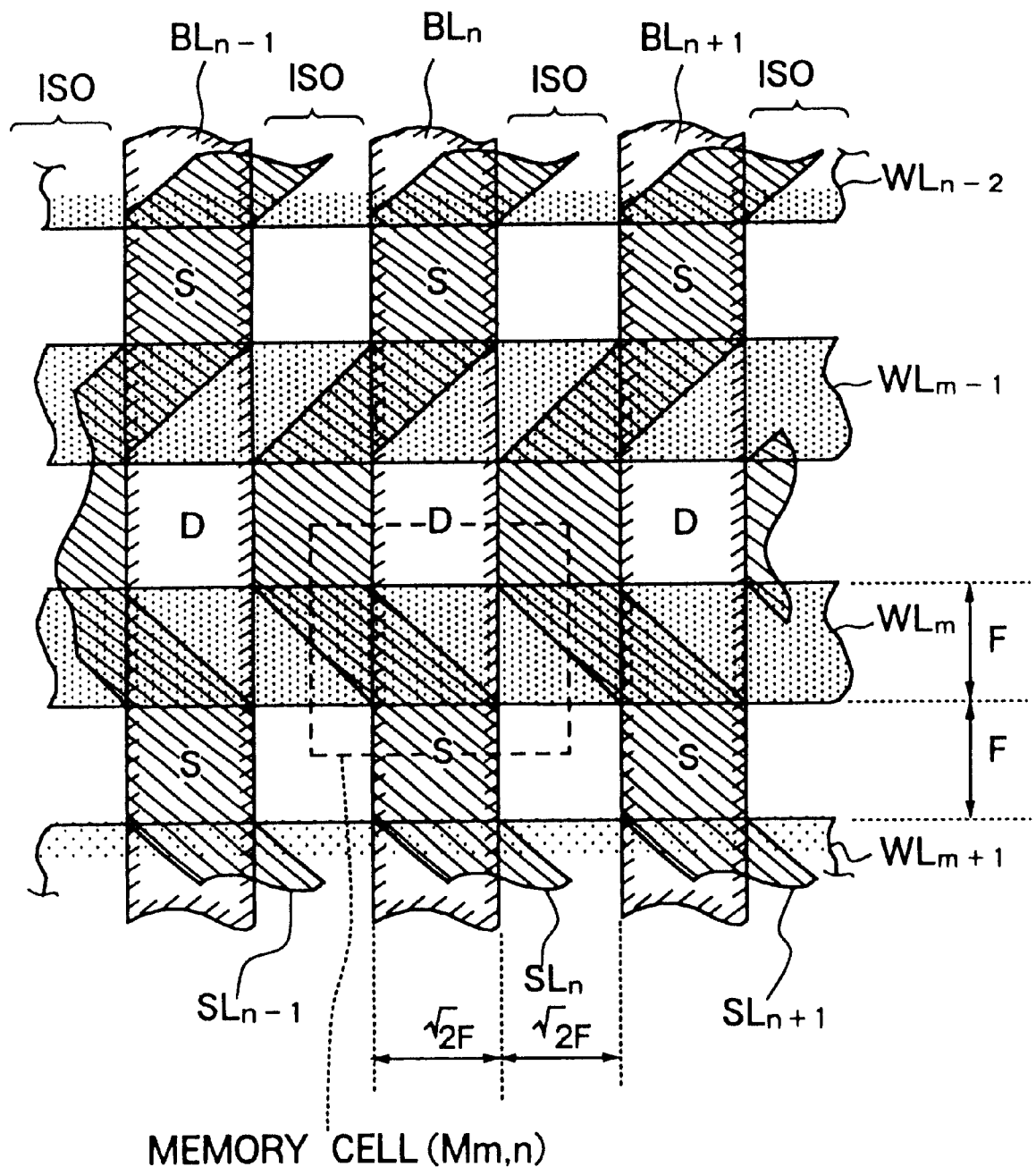
FIG. 15 is a plan view of a separated source line NOR type memory cell array according to a fourth embodiment of the present invention.

FIG. 15 is a schematic plan view of a miniature NOR type memory cell array using self alignment and serpentine source lines.

In this NOR type memory cell array, on the surface of a not shown n-well, vertical stripe trenches or LOCOS or other element isolation layers ISO are arranged at regular intervals in the bit line direction (vertical direction in FIG. 15). Substantially perpendicular to the element isolation layers ISO, word lines $WL_{m-2}$, $WL_{m-1}$, $WL_m$, $WL_{m-1}$ are arranged at regular intervals. The structure of a word line, in the same way as shown in the previous embodiments, is formed by a stacking a bottom insulating film, a nitride film, a top insulating film, and a gate electrode.

In the active regions between adjacent element isolation layers ISO, for example, a p-type impurity is introduced at a high concentration to alternately form source impurity regions S and drain impurity regions D. The sizes of the source impurity regions S and the drain impurity regions D in the word line direction (horizontal direction in FIG. 15) are determined only by the intervals of adjacent element isolation layers ISO, while the sizes in the bit line direction are determined only by the intervals of adjacent word lines. Therefore, the source impurity regions S and the drain impurity regions D are formed extremely uniformly in size and arrangement, since almost no mask alignment error is itroduced.

Around each word line, by just forming the sidewall insulating films, contact holes for connecting bit lines and contact holes for connecting source lines are formed on the source impurity regions S and the drain impurity regions D by applying two self-alignment contact steps. Moreover, the above process does not require a photomask. Therefore, as described above, not only are the source regions and drain regions uniform in size and arrangement, but also the contact holes for connection of the bit lines or the source lines formed by self alignment in two dimensions are extremely uniform in size. Furthermore, the contact holes have substantially the maximum areas relative to the areas of the source regions S and the drain regions D.

The source lines $SL_{n-1}$, $SL_n$, and $SL_{n+1}$ (hereinafter, indicated by SL) arranged in the bit line direction are arranged in a serpentine fashion on the element isolation layers ISO and source impurity regions S while avoiding the drain impurity regions D and are connected to the lower layer source impurity regions S through the contact holes for source line connection. The bit lines $BL_{n-1}$, $BL_n$, and $BL_{n+1}$ (hereinafter indicated by BL) are arranged at equal intervals on the source lines SL through the second interlayer insulating film. The bit lines BL are positioned above the active regions and are connected to the lower layer drain regions through contact holes for bit line connection.

In a cell pattern of such a configuration, as explained above, since the source regions and drain regions can be formed without being affected much by mask alignment, and the contact holes for bit line connection and contact holes for source line connection are formed by applying two self-alignment steps, the contact holes are not elements restricting the reduction of the cell area, so it is possible to arrange sources at the minimum line width F of the limit in the wafer process and there is almost no wasted space, so it is possible to realize an extremely small cell area close to $6F^2$.

Fifth Embodiment

The fifth embodiment relates to a so-called virtual grounding type common source line NOR type nonvolatile memory device.

Figure 16:
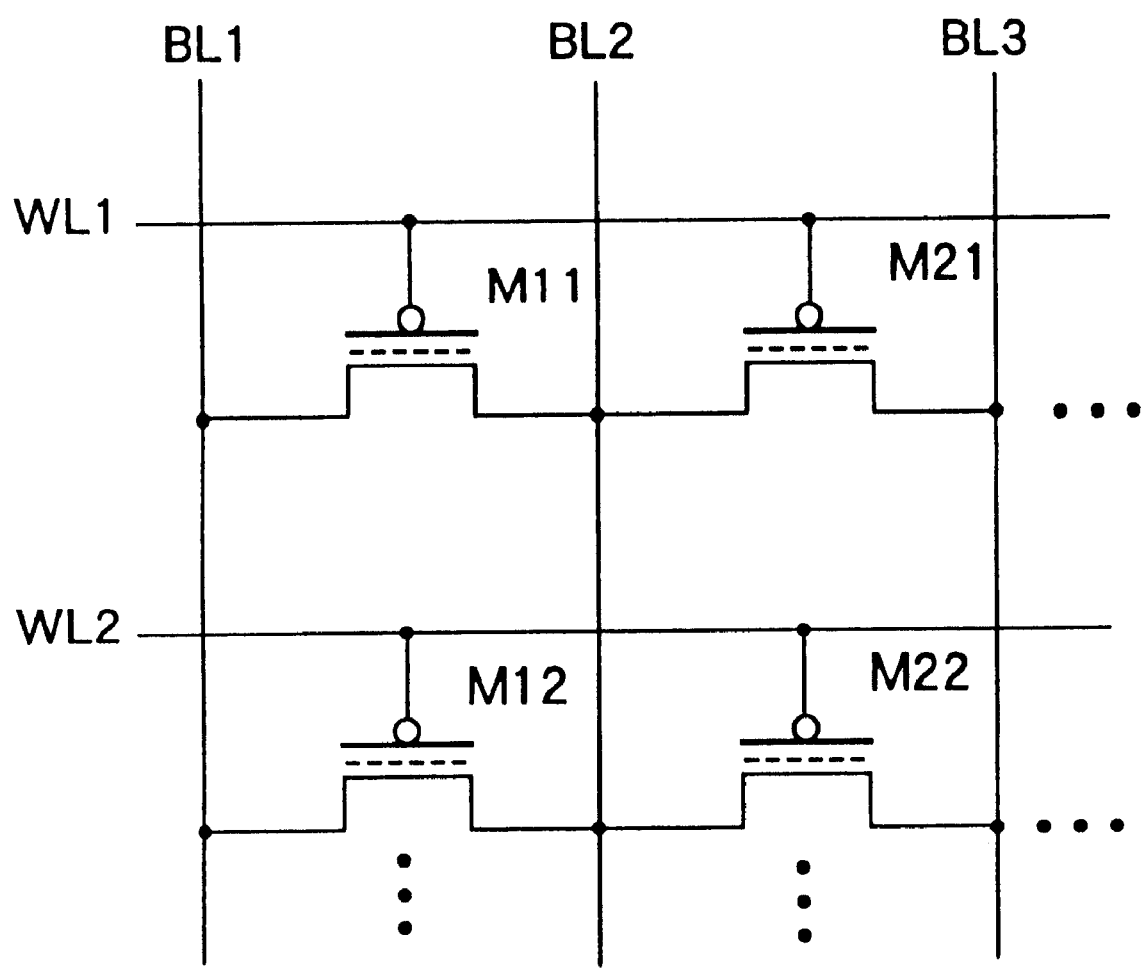
FIG. 16 is a circuit diagram of the configuration of a memory cell array of a nonvolatile semiconductor memory device according to a fifth embodiment of the present invention.

FIG. 16 is a circuit diagram for illustrating the configuration of a virtual grounding NOR type memory cell array.

Figure 17:
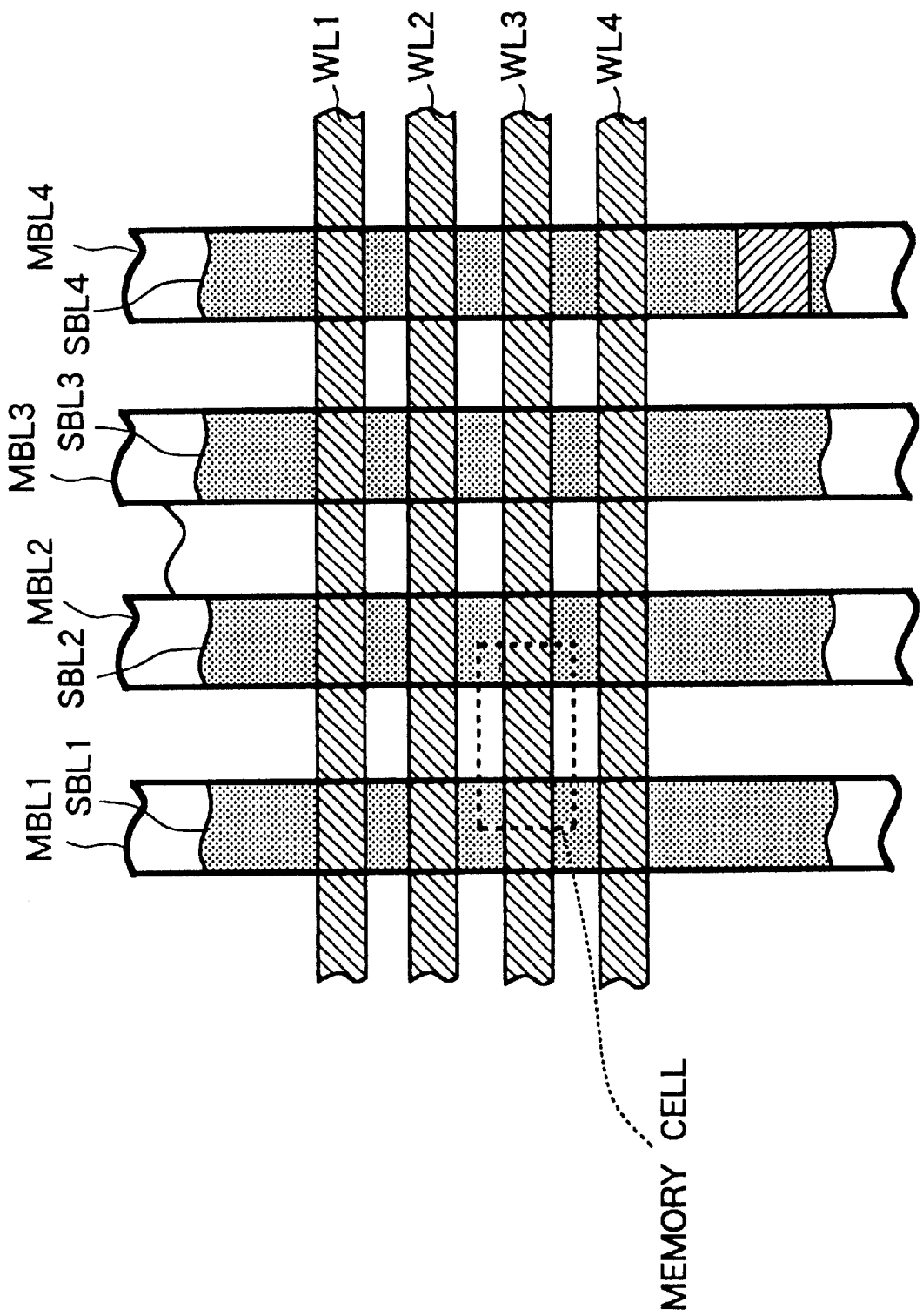
FIG. 17 is a plan view of a common source line NOR type memory cell array according to a fifth embodiment of the present invention.

FIG. 17 is schematic plan view of the virtual grounding NOR type memory cell array.

In this memory cell array, unlike that shown in FIG. 12, the source lines are not separated, here the source line is shared. This shared source line functions as a bit line when the adjacent memory cell is operated. Therefore, in this memory cell, all lines in the bit line direction are called bit lines.

As shown in FIG. 17, each bit line (BL1 to BL3) is comprised of a diffusion layer connection formed from a semiconductor impurity region (sub-bit lines SBL1, SBL2, . . . ) and a metal connection (main bit lines MBL1, MBL2, . . . ) connected to a sub-bit line SBL1, SBL2, . . . through a not shown bit contact.

In this pattern of the memory cell array, there is no element isolation ISO at all, thus the cell area is smaller than those in the memory cell arrays of the first to fourth embodiments.

Note that one of every other bit lines, for example, BL1 and BL3, may be connected to the upper layer metal interconnections through not shown bit contacts.

In the present embodiment, the voltages transmitted to the sub-bit lines SBL and the sub-source lines in the first and the second embodiments are directly applied to the bit lines BL and the source lines SL. Therefore, write, read, and erasure operations the same as those in the first and the second embodiments are possible. The procedure of injecting charges in the transistors is same as the first embodiment, so a detailed explanation is omitted.

In the virtual grounding NOR type, because the source lines are shared, in general there arises a problem of a mistaken write to the adjacent memory transistors in the word line direction. However, when the virtual grounding NOR type is applied to the first embodiment, because there is only a large change in the threshold voltage after charges are injected from both the source and the drain sides, there is the advantage that there is seldom a mistaken write to adjacent nonselected memory transistors in the word line direction.

Sixth Embodiment

The sixth embodiment relates to a common source line NOR type nonvolatile memory device similar to the HiCR type in an FG type.

Figure 18:
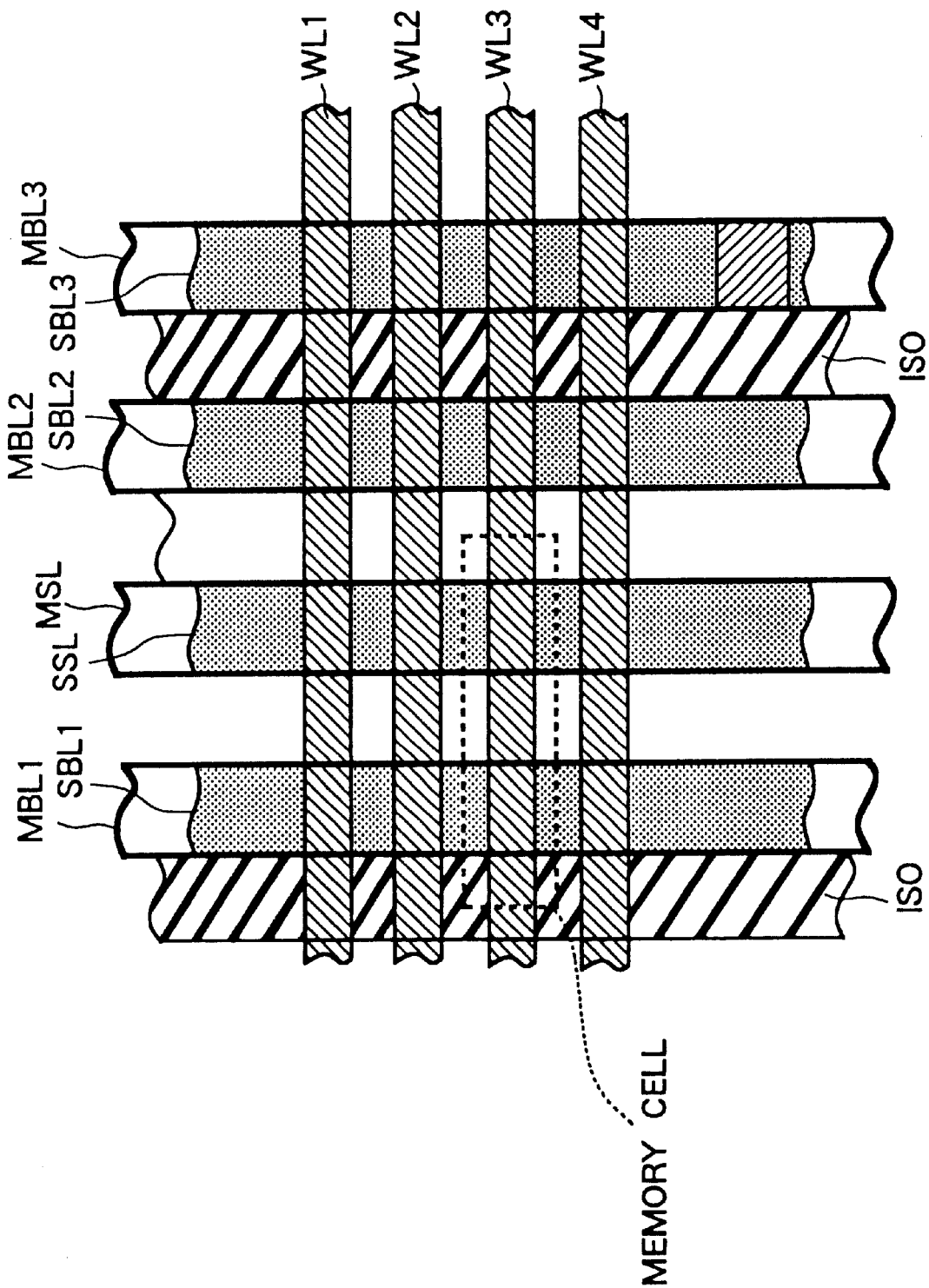
FIG. 18 is a plan view of a common source line NOR type memory cell array according to a sixth embodiment of the present invention.

FIG. 18 is schematic plan view of a memory cell array according to the sixth embodiment. The circuit diagram of the memory cell array is the same as that in FIG. 16 for the fifth embodiment.

In this memory cell array, as shown in FIG. 18, source lines (main source lines MSL and sub-source lines SSL) are arranged in common between two adjacent memory transistors in the word line direction. Therefore, element isolation layers ISO are provided for every three sub lines (sub-bit lines SBLn and SBLn+1 and sub-source line SSL).

In this pattern of the memory cell array, there are fewer element isolation layers ISO than in the first to fourth embodiments, so the cell area is smaller than the memory cell arrays of the first to fourth embodiments.

In the present embodiment, the voltages transmitted to the sub-bit lines SBL and the sub-source lines in the first and the second embodiments are directly applied to the main bit lines BL and the source lines SL. Therefore, write, read, and erasure operation the same as those in the first and the second embodiments are possible. The procedure of injecting charges in the transistors is the same as the first embodiment, so a detailed explanation is omitted.

In addition, in the same way as the virtual grounding NOR type, because there is only a large change in the threshold voltage after charges are injected from both the source and the drain sides, there is the advantage that there is seldom a mistaken write to adjacent nonselected memory transistors in the word line direction.

Seventh Embodiment

The seventh embodiment relates to a separated source line NOR type nonvolatile memory suitable for writing two bits in one cell.

Figure 19:
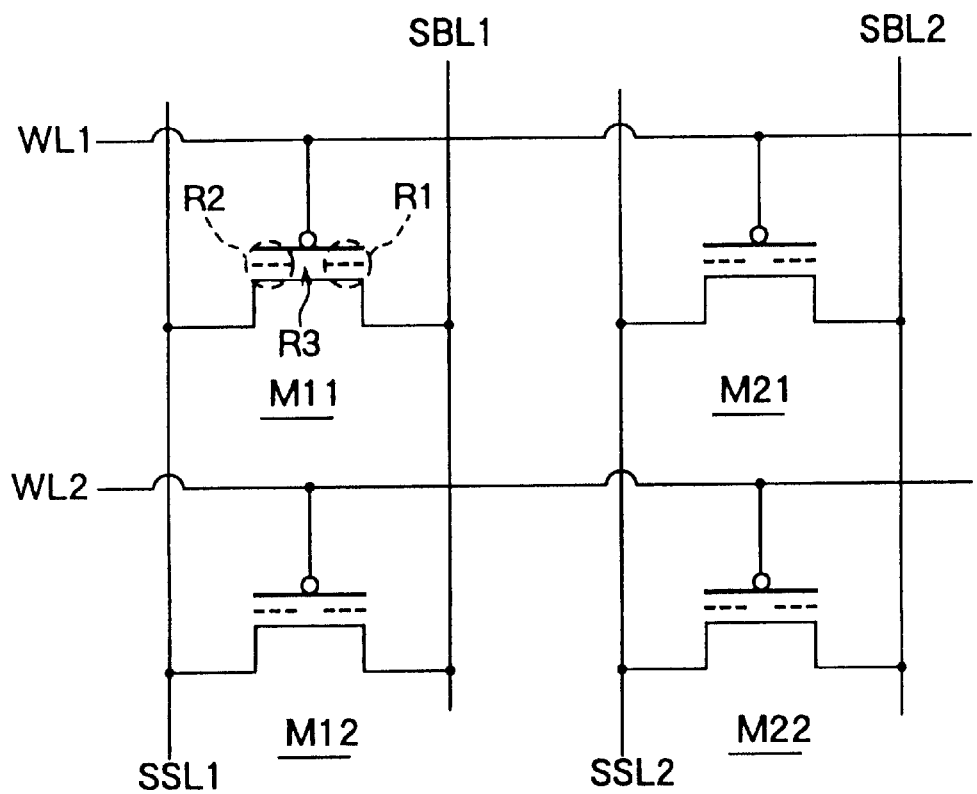
FIG. 19 is a circuit diagram of four cells of a separated source line NOR type memory cell array according to a seventh embodiment of the present invention.
Figure 20:
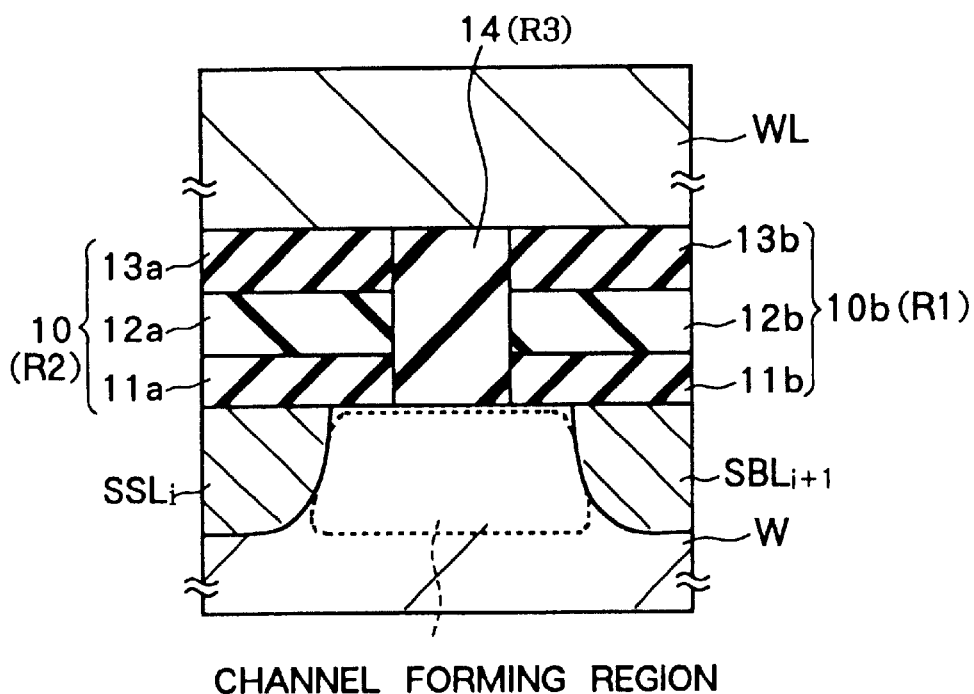
FIG. 20 is a cross-sectional view illustrating the structure of a memory transistor according to the seventh embodiment of the present invention.

FIG. 19 shows the circuit diagram of four cells in a memory cell array. This memory cell array is an enlargement of the memory cell array in FIG. 1 and corresponds to the memory cell array in FIG. 12. FIG. 20 is a cross-sectional view for illustrating the structure of the memory transistor according to the seventh embodiment.

In the memory transistor shown in FIG. 20, the gate insulating film having the charge-retaining function consists of a gate insulating film 10a at the side of the sub-bit line SBLi and a gate insulating film at the side of the sub-bit line SBLi+1. The two gate insulating films 10a, 10b are spatially separated by a single layer gate insulating film 14 above the central portion of the channel.

The gate insulating films 10a and 10b have the same structure as gate insulating film 10 in the first embodiment. That is, the gate insulating film 10a consists of a bottom insulating film 11a, a nitride film 12a, and a top insulating film 13a in order from the bottom. Similarly, the gate insulating film 10b consists of a bottom insulating film 11b, a nitride film 12b, and a top insulating film 13b in order from the bottom.

The bottom films 11a, 11b, nitride films 12a, 12b, and top insulating films 13a, 13b are comprised of the same materials, of the same thicknesses, by using the same methods as the bottom film 11, nitride film 12, and top insulating film 13 in the first embodiment, respectively.

Here, in the gate insulating film 10b, the region including the nitride film 12b and its surroundings is referred to as "the first storage region R1", in the gate insulating film 10a, the region including the nitride film 12b and its surroundings is referred to as "the second storage region R2", and the region of the gate insulating film 14 is referred to as "the third region R3".

In the present embodiment, the region of distribution of each charge storing means (carrier traps) is split into the spatially separated first storage region R1 and second storage region R2 and a single layer of a dielectric between them (third region R3). As a result, there is formed an element structure in which memory transistors having a mutually separated memory region are integrated with an MOS type control transistor formed between the two memory regions and shares a common gate electrode with the memory transistors.

This structure has various advantages. One of them is that the charge injection area is confined, so over injection of charges hardly ever happens. Another advantage, as explained later, is that the ON/OFF state of the channel can be controlled through a MOS type control transistor of a constant threshold voltage in addition to having transistors of a variable threshold voltage. Furthermore, there is the large advantage that even at a high temperature the stored charge does not diffuse in the transverse direction, therefore the reliability is superior.

The gate insulating film 14 between the gate insulating films 10a and 10b is comprised of a silicon dioxide film formed by, for example, CVD and buries the space between the gate insulating films at the two sides.

As an example showing one of the various methods of forming such a gate insulating film structure, first, in the same way as in the first embodiment, after the stacked film of a bottom film, a nitride film, and a top insulating film is formed on the entire area, part of the stacked film above the central portion of the channel forming region is removed by etching, so gate insulating film 10a and 10b are formed spatially separated. Then, silicon oxide film is thickly deposited on the entire area and etchback is performed on the surface of the silicon oxide film. The etchback is stopped when the insulating film on the gate insulating films 10a and 10b is removed and the gate insulating film 14 buries just the space between gate insulating films 10a and 10b, whereupon the desired gate insulating film structure is completed. In order to prevent over etching, an etching stopper film, for example, a thin silicon nitride film, may be formed beforehand on the gate insulating films 10a and 10b.

Next, in the same way as in the first embodiment, after the process of forming word lines WL etc., the memory transistor is completed.

Next, the operation of a nonvolatile memory of such a configuration will be explained by taking as an example a plurality of memory transistors M11, M21, . . . connected to the word line WL1.

Figure 21A:
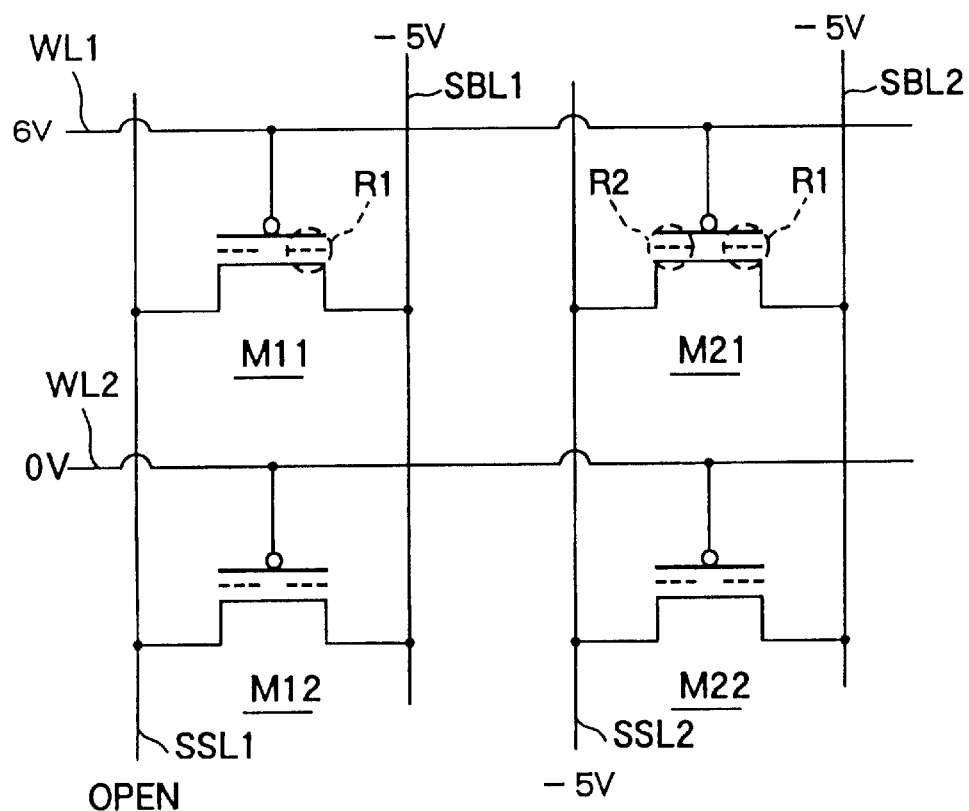
Figure 21B:
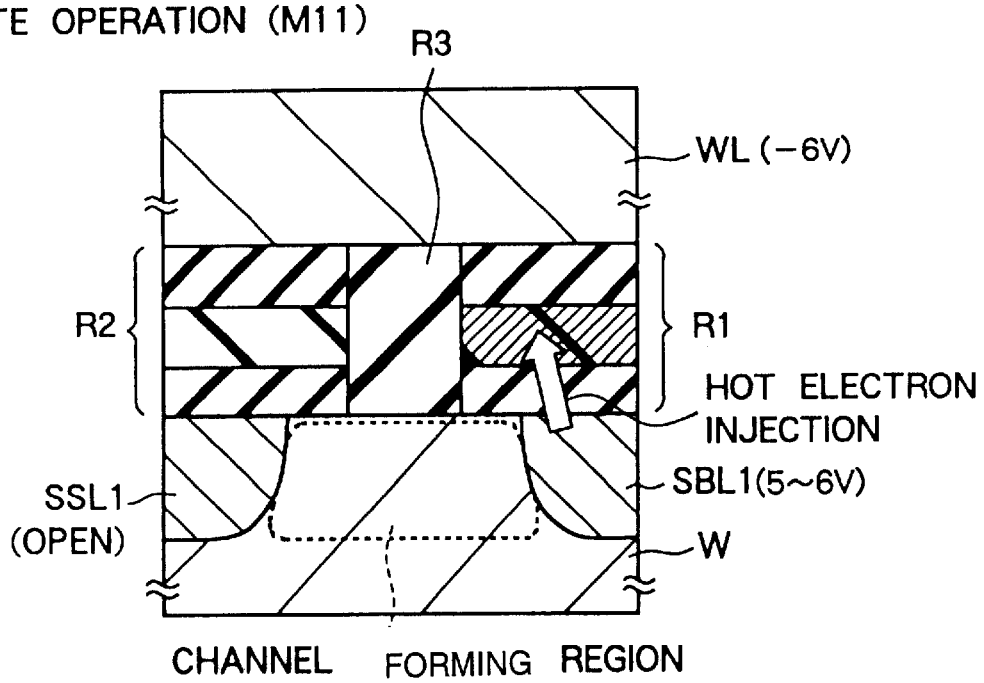
FIG. 21B is a cross-sectional view of the transistor showing the write operation.
Figure 22A:
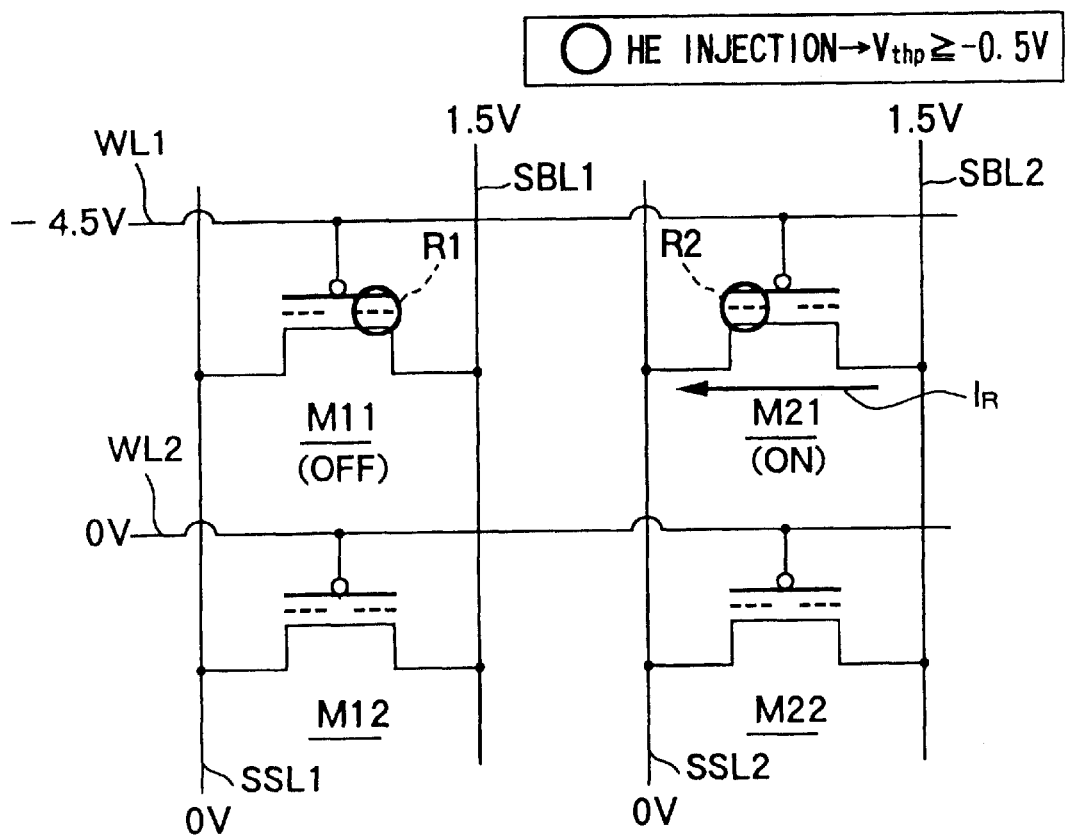
FIGS. 22A and 22B are circuit diagrams of the read bias conditions of a memory transistor according to the seventh embodiment of the present invention.
Figure 22B:
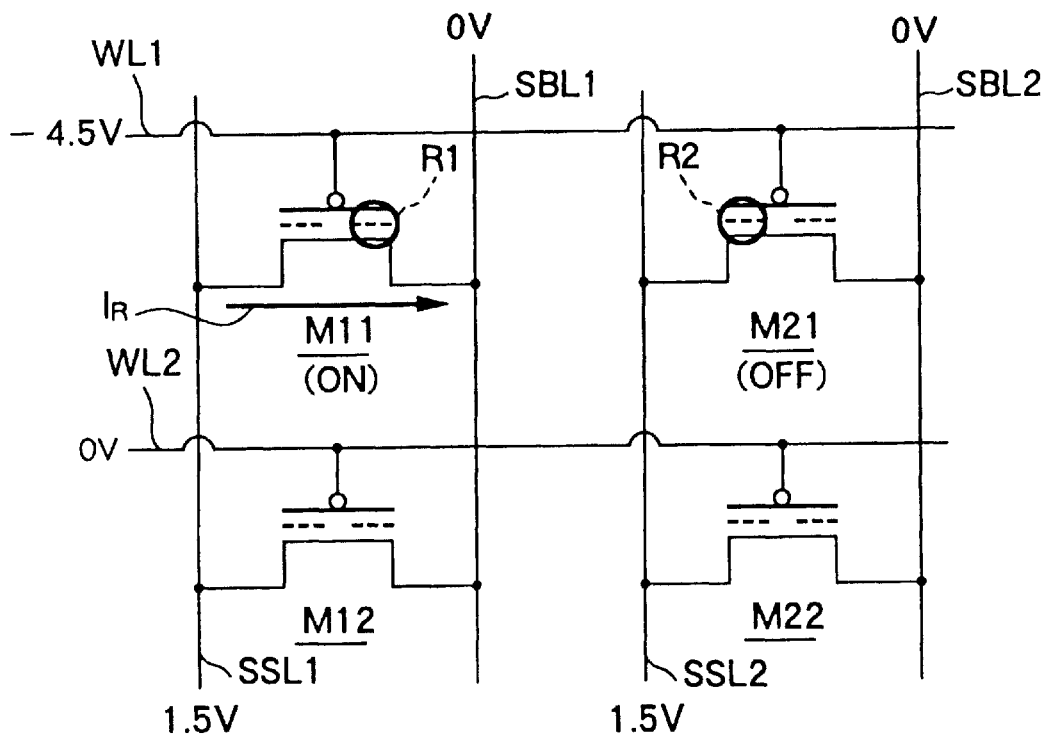
Figure 23A:
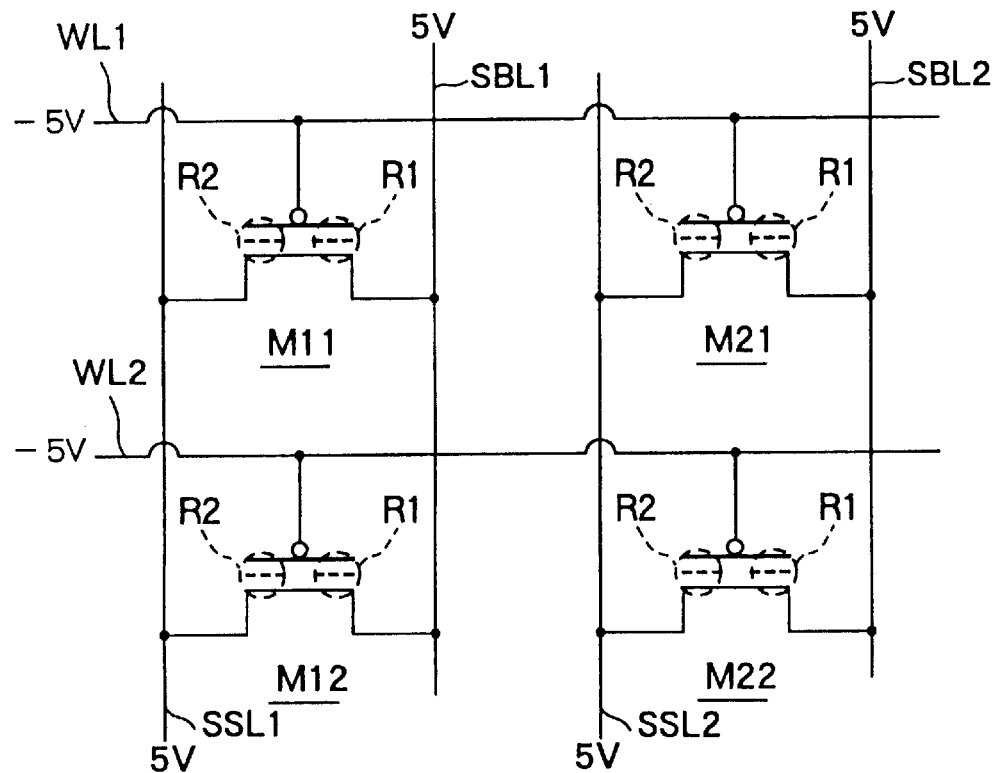
Figure 23B:
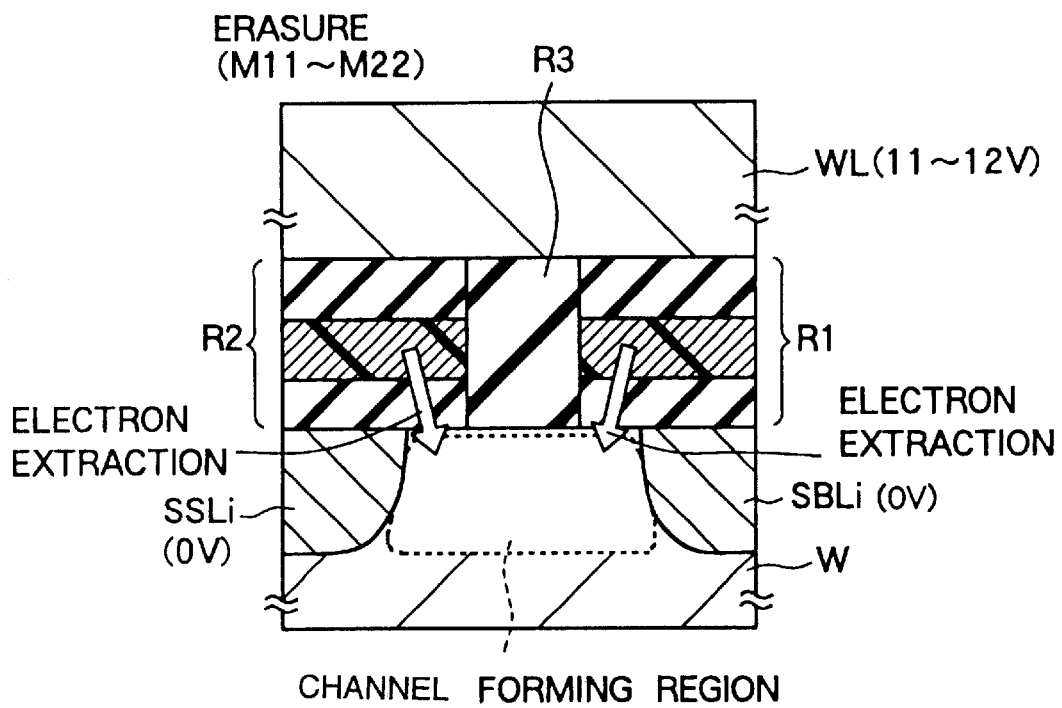
FIG. 23B is a cross-sectional view of the transistor showing the erasure operation.

FIG. 21A is a circuit diagram showing the bias conditions of a write operation, FIG. 21B is a cross-sectional view of a transistor showing a write operation, FIGS. 22A and 22B are circuit diagrams showing the bias conditions of a read operation, FIG. 23A is a circuit diagram showing the erasure bias conditions, and FIG. 23B is a cross-sectional view of a transistor showing an erasure operation.

In a write operation, memory cells connected to the same word line (here, WL1) can be written simultaneously. As shown in FIGS. 21A and 21B, the pattern of the voltages applied to the sub-bit lines SBL1, SBL2, . . . and the sub source lines SSL1, SSL2, . . . is determined according to which side of the first and the second storage regions R1, R2 is to be written. In more detail, in FIGS. 21A and 21B, if injecting hot electrons into the first storage region R1 of the memory transistor M11 and the first and second storage regions R1, R2 of the memory transistor M21, a specified negative voltage of, for example, −5V or so is applied to the sub-bit lines SBL1, SBL2 and the sub-source lines SSL2. Other sub-lines not to be injected with hot electrons (here, the sub-source line SSL1) are set open and are in an electrically floating state.

Further, a specified positive voltage of, for example, 6V, is applied to the selected word line WL1, while a write inhibit voltage of, for example, 0V, is applied to the nonselected word lines WL2 to WLn. 0V is also applied to the substrate (n-well W).

Under these write conditions, in the row of memory transistors to which data is to be written, due to the application of a positive voltage to the selected word line WL1, the surface of the p-type impurity regions as the sub-source line SSL1 and the sub-bit line SBL1 on which a negative voltage (−5V) is applied, is deeply depleted, consequently, because of the same principles shown in the first and the second embodiments, the hot electrons are injected into the carrier traps formed as the charge storing means at a high speed and with a high efficiency.

As a result, the threshold voltage of the memory transistor is reduced from Vthe=−2.5V to −2.3V in the erasure state to Vthp≧−0.5V in the write state.

On the other hand, in the nonselected row of memory transistors M12, M22, . . . , only 6V is applied between the gate and the source or the drain, so electrons are not injected into the charge storing means, and a write is effectively inhibited.

In such a write process, because the charge acceleration direction is substantially the same as the injection direction, the injection efficiency is higher than the conventional CHE injection. In addition, because a channel is not formed during the write operation, the current consumption is low. Although the current is small, because charges are injected into substantially the entire area of the plane of distribution of the charge storing means, the write time for obtaining the necessary change of the threshold voltage is, for example, less than 10 μs or reduced by more than one order of magnitude comparing with the conventional case.

Moreover, in this write process, the charge injection from the p-type impurity region serving as the sub-bit line SBL1 and the charge injection from the p-type impurity region serving as the sub-source line SSL1 are both localized. That is, in the present embodiment, the charge injection area is confined to the first storage region R1 or the second storage region R2, therefore over write is prevented.

Furthermore, a page write can be performed with only one operation of setting a combination of the voltages applied to the sub-lines SBL and SSL and lowering the potential on the word line. Due to the aforesaid improvement of the injection efficiency, the write current per bit is decreased by more than one order of magnitude, so the number of cells able to be written in parallel simultaneously is increased to one kilobyte (kB) in the present embodiment, whereas it is only one byte of cells with the conventional CHE injection.

When not writing a page, the selected rows of cells to be written and the nonselected rows of cells to be inhibited are differentiated using the bias conditions. It is therefore possible to write on only the selected rows of cells.

The read operation is basically a page read.

As shown in FIG. 22A, when the bits of the second storage regions R2 are to be read, a specified voltage of, for example, −1.5V is applied to the sub-bit source lines SBL1, SBL2, . . . , while 0V is applied to the sub-source lines SSL1, SSL2, . . . and the substrate. In addition, a specified read inhibit voltage, for example, 0V is applied to the nonselected word lines WL2, WL3, . . . . . Under these conditions, a specified read gate voltage of, for example, −4.5V, is applied to the word line WL1 to be read.

In this way, when the second storage regions R2 of the memory transistors M21, . . . are connected to the word line WL1 are in a write state, the memory transistors M21, are turned on, the read current $I_R$ flows as illustrated, and the voltage of the sub-bit line changes. On the other hand, in a memory transistor M11 whose second storage region R2 is not in a write state, the threshold voltage remains at a high level, and the memory transistor remains off.

Next, the change of the voltage on the sub-bit line SBL2 etc. caused by flowing of its pre-charges to the source line through the ON memory transistor is amplified and read by a not shown sense amplifier.

The first storage region R1 can be read by applying a −1.5V drain voltage in the opposite direction to the above.

In the transistor structure of the second embodiment where there was no MOS type control transistor in the central portion of the channel, when electrons were over-injected at the time of writing and the threshold voltage of the memory transistor was largely decreased, the read current fluctuated and further there was such unnecessary current consumption.

With a structure including an MOS type control transistor formed in the central portion of the channel (third region R3) such as in the present embodiment, the threshold voltage Vth(MOS) of the MOS transistor in the third region R3 is set in advance in the range of for example −0.5 to −0.7V. As a result, even if over-write to a memory transistor occurs, it does not influence the read process. This is because when the threshold voltage of the memory transistor largely decreases and the read current starts to increase, the MOS control transistor cuts off and functions as a limiter. Therefore, in such a memory cell, there is the advantage that the upper limit of the read current can be controlled by controlling the threshold voltage of the control transistor and there is no unnecessary current consumption.

Erasure is performed, in the same way as in the first and the second embodiments, by extracting the charges from the entire channel region by FN tunneling or direct tunneling. In the case of erasing a whole block simultaneously by direct tunneling, as shown for example in FIG. 23A, −5V is applied to all word lines WL1, WL2, . . . , and 5V is applied to all sub-bit lines SBL1, SBL2, . . . , and sub-source lines SSL1, SSL2, . . . , and the substrate (p-well W).

In this way, as shown in FIG. 23B, electrons held in the charge storing means are extracted to the substrate side, the threshold voltage rises, and erasure is performed. The time for this erasure by extracting electrons can be reduced to about 10 ms or improved by more than one order of magnitude comparing with the typical erasure time of 100 ms of the conventional hole injection erasure method using the direct tunneling effect. Further, in the conventional erasure method by hole injection, the time for passage of charges through the bottom film is longer comparing with a write operation, so the insulating film may deteriorate. In the present invention, since erasure is performed by extracting electrons, the reliability is high.

The reliability of the memory cell was studied using the write, read, and erasure operations described above.

Concerning the data rewrite, data retention, and read disturbance, it was found that more than $1 \times 10^6$ times of data rewrites, 10 years of data retention, and 10 years of resistance to read disturbance could be guaranteed. The data retention was more than 10 years at 85° C. even after $1 \times 10^6$ write-erasure cycles.

Moreover, in the present MONOS structure storing two bits in one cell, when shortening the gate length of the center MOS control transistor, by optimizing the shape of the transistor, the effective gate length, or the profile of the impurity, the gate length can be reduced to 0.1 μm or even shorter.

Eighth Embodiment

The eighth embodiment relates to a virtual grounding NOR type nonvolatile memory suitable for writing two bits in one cell.

Figure 24:
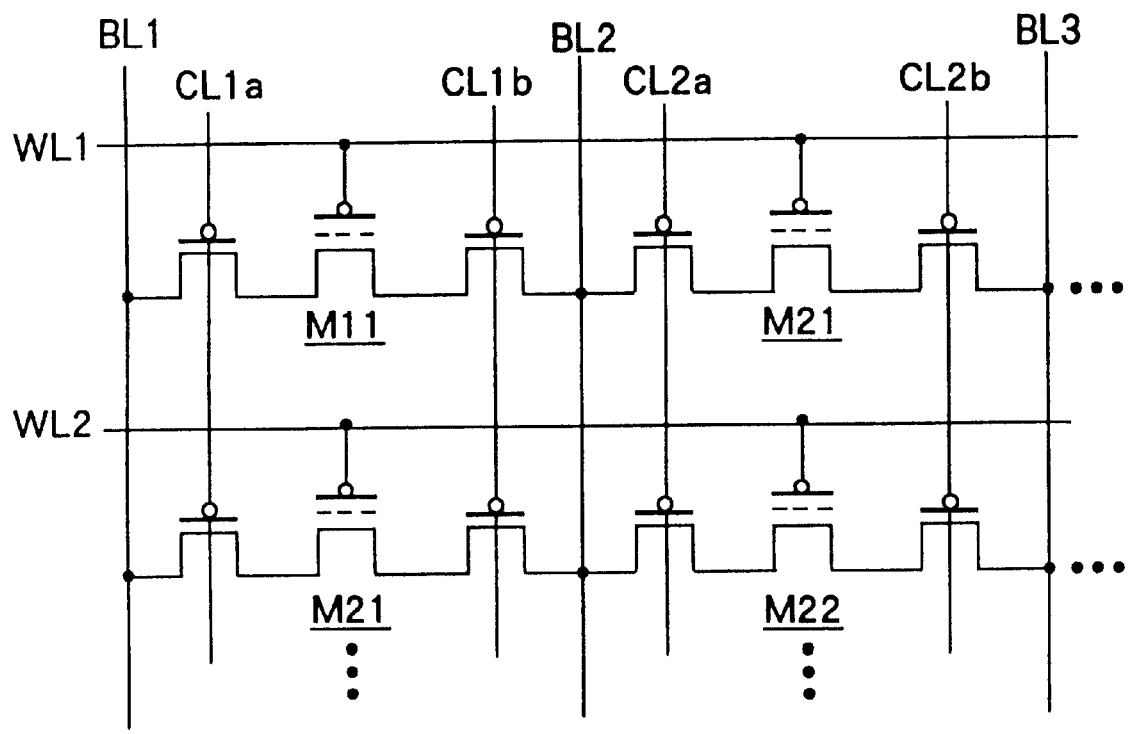
FIG. 24 is an equivalent circuit diagram of the configuration of a virtual grounding NOR type memory cell array according to an eighth embodiment of the present invention.

FIG. 24 is a circuit diagram of an example of the configuration of a memory cell array according to the eighth embodiment.

This memory transistor array is basically a virtual grounding NOR type memory cell array the same as that in the fifth embodiment. In the present memory cell array, however, in each memory transistor, the control gates are provided to extend from the source and drain impurity region side to partly overlap with the channel forming region.

Further, the array is provided with a control line CL1a commonly connecting one of the control gates of the memory transistors M11, M12, . . . connected in the bit line direction, a control line CL1b commonly connecting the other of the control gates, a control line CL2a commonly connecting one of the control gates of the memory transistors M21, M22, . . . connected in the bit line direction and belonging to another row, a control line CL2b commonly connecting the other control gates. The control lines and the word lines are controlled separately.

In FIG. 24, by partly overlapping the control lines with the channel forming region, two MOS control transistors are formed at the two sides of the center memory transistor.

Figure 25:
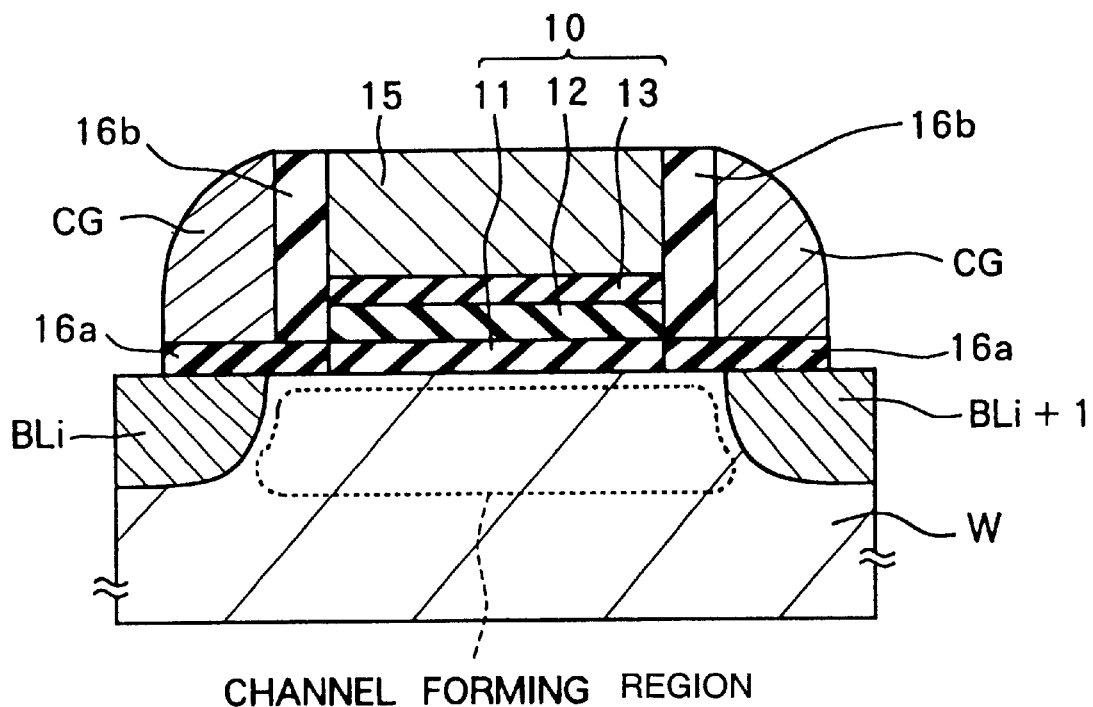
FIG. 25 is a cross-sectional view illustrating the configuration of a virtual grounding NOR type memory cell array according to the eighth embodiment of the present invention.

FIG. 25 illustrates the transistor configuration according to the eighth embodiment.

In this memory transistor, in the center portion of the upper surface of the channel forming region, a gate electrode of the memory transistor is stacked on the gate insulating film consisting of a bottom insulating film 11, a nitride film 12, and a top insulating film 13 in order from the bottom. This gate electrode is connected with the upper interconnection layer forming the not shown word line and is connected in common between the cells in the word line direction.

On the other hand, the gate insulating films 16a of the control transistor are formed on the sub-bit lines SBLi and SBLi+1 at the two sides of the memory transistor in the channel direction. On the gate insulating films 16a, control gates CG are formed. The control gates CG and the gate electrode 15 are separated by a spacer insulating film 16b between them.

To form such a memory cell, for example, a gate insulating film 10 and the conductive film for forming gate electrode 15 are formed on the entire area, then, when patterning the gate electrode, the gate insulating film 10 is processed in order from the top layer. Next, this pattern is covered by the gate insulating film 16a. When making the spacer insulating film 16b thicker than the gate insulating film 16a, the same kind of insulating film is further stacked, then anisotropically etched them. Due to this, the spacer insulating films 16b are formed on the sidewalls of the gate electrode. A conductive film for forming the control gate CG is deposited, then the conductive film is anisotropically etched to leave it as sidewalls and thereby form the control gate.

The write operation of a transistor formed in this way is a page write in the same way as in the previous embodiments. The bias conditions are basically the same with those in the seventh embodiment.

However, in the eighth embodiment, because the bit lines are connected in common between two adjacent memory cells in the word line direction, the voltages on the control cells of the control transistors control according as whether a write operation is performed on the first or the second storage region of the memory transistor. That is, a voltage of −5V is applied to all the bit lines BL1, BL2, . . . , and a specified positive voltage of, for example, 6V is applied only to the control gate CG at the sides where the write operation is to be performed. As a result, under each control gate CG on which a positive bias is applied, the p-type impurity region is deeply depleted, and the energy band bends sharply. Because of the band-to-band tunneling effect, electrons in the valence band tunnel to the conduction band, forming a current in the p-type impurity region. Those electrons drift more or less to the center of the channel forming region and then are accelerated by the fairly strong electric field near the gate electrode 15, then part of them become hot electrons. The high energy charges (hot electrons) produced in the p-type impurity region are injected into the carrier traps serving as the charge storing means efficiently and at a high speed without losing almost any of its kinetic energy while maintaining its moments (magnitude and direction).

As a result, the threshold voltage of the memory transistor is reduced from Vthe=−2.5V to −2.3V in the erasure state to Vthp≧−0.5V in the write state.

On the other hand, 0V or −5V or so is applied to the control gates CG at the side that is not to be written. In the p-type impurity region under this control gates CG, the energy band does not bend sharply, therefore no hot electrons are produced, and a write is effectively inhibited.

In such a write process, the same effects as in the seventh embodiment can be achieved, that is, the charge injection is fast and with a high efficiency, and the current consumption is small.

The read operation is basically a page read. The basic bias values are the same as those in the seventh embodiment, that is, −1.5V on the drain, 0V on the source, and −4.5V on the gate.

However, in the present embodiment, the common lines in the bit line direction (bit lines BL1, BL2, . . . ) are connected in common between the two memory cells adjacent in the word line direction. Consequently, in the same way as the sixth embodiment, if −1.5V and 0V are alternately applied to the common lines in the bit line direction, two cells worth of data are read from the memory cells connected to the common lines (bit lines) on which −1.5V is applied, and it is impossible to distinguish the data. Thereupon, it is necessary to turn on the control gate CG to cut off the channel beforehand. In other words, with one read operation cycle, only one row can be read. So, to read the first storage region R1 and the second storage region R2, two read operation cycles are needed, and four operation cycles are needed to read one page.

Erasure is performed in the same way as in the previous embodiments.

Ninth Embodiment

The ninth embodiment relates to another example of the separated source line NOR type nonvolatile memory suitable for writing two bits in one cell.

Figure 26:
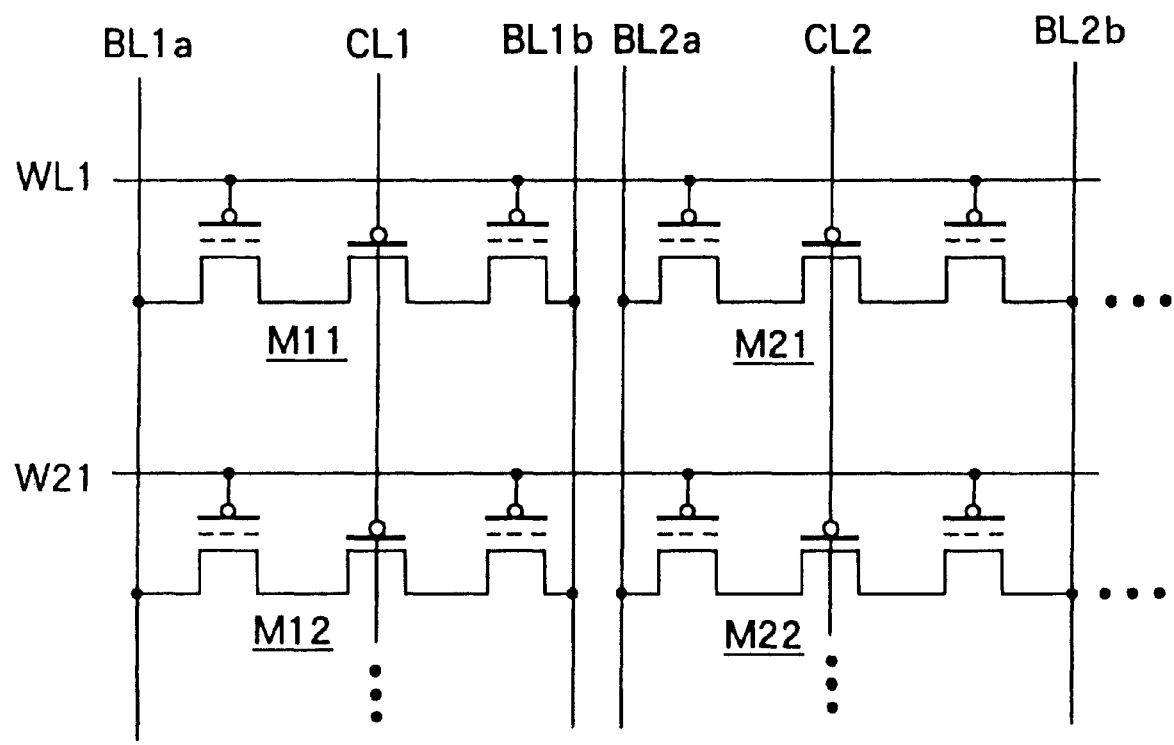
FIG. 26 is an equivalent circuit diagram of the configuration of a virtual grounding NOR type memory cell array according to a ninth embodiment of the present invention.

FIG. 26 is a circuit diagram of the configuration of a memory cell array according to the ninth embodiment.

In this memory cell array, in each memory cell, there is a MOS type control transistor connected to the control line CL1 or CL2, . . . in the bit line direction at the same and two memory transistors whose gates are connected to the word line WL1 or WL2, . . . formed at the two sides of the control transistor.

Figure 27A:
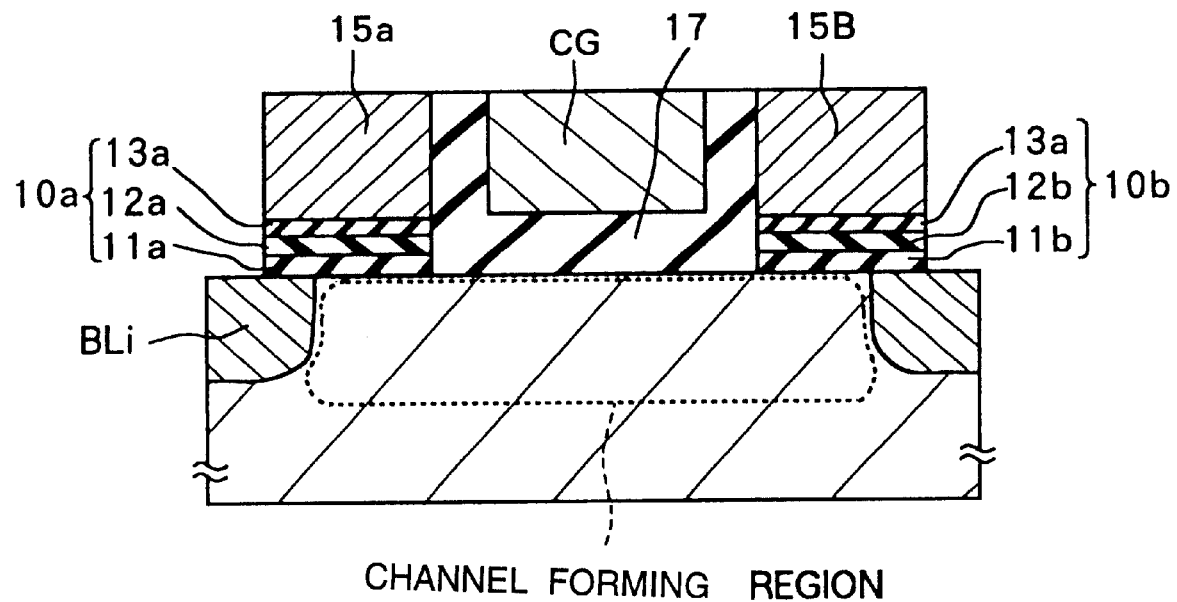

FIG. 27A illustrates a first example of the memory cell array configuration according to the ninth embodiment.

Compared with the memory cell configuration shown in the seventh embodiment (FIG. 20), in the present memory cell configuration, each of the first storage region R1, the second storage region R2, and the third region R3 has its own gate electrodes. That is, the present memory cell has a control gate CG formed in the central portion of the channel forming region and gate electrodes 15a and 15b which are isolated from the control gate CG, provided at the two sides in the channel direction and connected to the word line WL.

The control gate CG is buried on the gate insulating film 17 between the two spatially separated gate stacked patterns at the source side and the drain side, that is, the stacked pattern of the gate electrode 15a and the gate insulating film 10a and the stacked pattern of the gate electrode 15b and the gate insulating film 10b.

As an example showing one of the various methods of forming such a memory cell, for example, the gate insulating films 10a and 10b and the conductive films for forming the gate electrodes 15a and 15b are formed on the entire area, then, when patterning the two gate electrodes 15a and 15b, the gate insulating films 10a and 10b are processed at the same time. Due to this, two stacked patterns of the gate electrodes 15a, 15b and the gate insulating film 10a, 10b respectively are formed spatially separated at the side of the sub-bit line SBLi and the side of the sub-bit line SBLi+1, respectively. Then, the insulating film 17 and the conductive film forming the control electrode CG are deposited and etched back. Due to this, the gate insulating film 17 and the control gate CG are formed buried between the two stacked patterns of the gate electrodes 15a, 15b and the gate insulating films 10a, 10b.

In a memory cell formed in this way, in the same way as the seventh embodiment, in order to suppress the influence of over write, a MOS type control transistor connected to the word line is formed in the central portion of the channel forming region. The threshold voltage of the control transistor is set to be, for example, in the range of −0.5V to −0.7V. Further, above the impurity regions serving as the bit lines BLli and Bli+1 gate electrodes 15a and 15b are provided on ONO type gate insulating films 10a and 10b that include the charge storing means and are able to retain charges. Due to this, a memory transistor is formed.

Figure 27B:
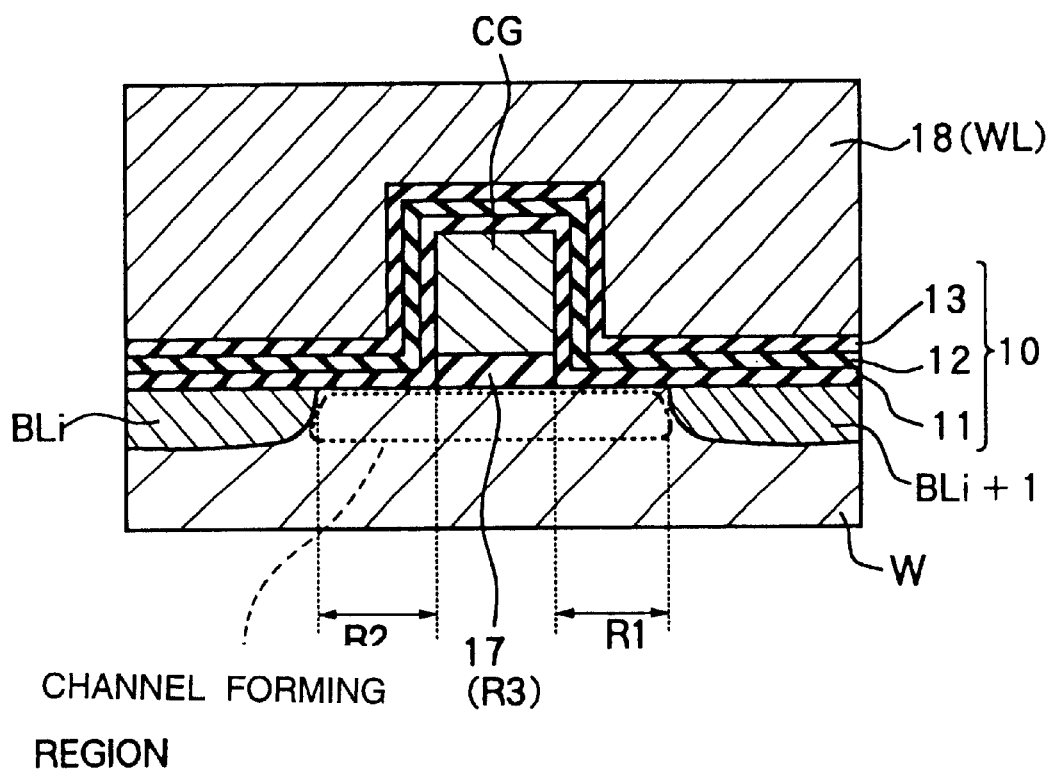
FIG. 27B is a cross-sectional view illustrating a second example of the configuration.

FIG. 27B illustrates a second example of the memory cell configuration according to the ninth embodiment.

In FIG. 27A, the gate electrodes 15a and 15b were separated. In the present memory cell configuration, the gate electrode 18 of the memory transistor is formed integrally from a single conductive material. The gate electrode 18 forms the word line in FIG. 26 and intersects the center control gate CG with the ONO type gate insulating film 10 in between. Because of this structure, the ONO type gate insulating film 10 is in contact with portions of the channel forming region between the control gate CG and the source and drain regions (bit line BLi or BLi+1). These portions of the gate insulating film 10 contacting the channel forming region form the first and the second storage regions R1 and R2. In addition, the gate insulating film 17 under the control gate CG is a single layer of an insulating film. This single layer of insulating film forms the third region R3 that is not able to retain a charge.

In the second example of the memory cell structure, the ONO type gate insulating film 10 that is able to retain a charge does not need to be split into two parts. In other words, the gate stacked pattern of the control gate (17, CG) is formed extending long in the bit line direction on the n-well W wherein the p-type impurity region (bit line BLi and BLi+1) are formed, then the gate insulating film 10 is formed in the same was as that in the first embodiment, a conductive film forming the gate electrode 18 is deposited, then this conductive film and the gate insulating film 10 are processed at the same time in a pattern extending long in the word line direction. Therefore, it is possible to simplify the manufacturing process and easily fabricate the device.

In order to provide a difference between the threshold voltages of the center control transistor whose control gate CG is made the gate electrode and the memory transistors at the two sides, before forming the control gate CG, ions are implanted into the channel forming region for setting the threshold voltage of the control transistor, the control gate CG is formed, then ions are again implanted to adjust the threshold voltage of the memory transistors. Therefore, setting of the threshold voltage is easy too.

The write operation of the memory cell shown in FIG. 27A or 27B is also a page write in the same way as in the seventh embodiment. The bias conditions are basically the same with the seventh embodiment.

In the present embodiment, in the same way as the seventh embodiment, the bit lines are separated between the two memory cells adjacent in the word line direction and whether a write operation is performed or not to the firs storage region R1 and second storage region R2 is controlled by if the bit line is given a voltage of −5V or is set open. First, a voltage of 6V is applied to all the word lines, then a voltage of about −5V is applied to the opened bit line at the side that is to be written. The order of applying voltages may also be to apply voltage to the bit line, then apply voltage to the word lines.

Consequently, under the gate electrodes 15a and 15b (or 18) to which a positive voltage is applied, the p-type impurity region applied with −5V is deeply depleted. Due to the same principle as shown in the previous embodiments, the hot electrons are injected into the carrier traps formed as the charge storing means fast with a high efficiency.

As a result, the threshold voltage of the memory transistor is reduced from Vthe of the erasure state to the Vthp of the write state.

At this time, because a specified negative voltage is applied on the control line CL, the depletion region extending from the p-type impurity region (sub-bit lines SBLi and SBLi+1) is suppressed, and the center part of the channel is not depleted. Therefore, in the ninth embodiment, the punch through endurance is strong compared with the seventh embodiment.

With such a write process, the same effect as in the other embodiments can be achieved, that is, a page write can be performed with a fast and highly efficiently charge injection and small current consumption. Further, the charge injection area is localized, therefore, an over write is prevented.

In the same way as the seventh embodiment, a road operation is basically a page read, and the basic bias values such as −1.5V on the drain, 0V on the source, −8V on the control transistor gate (control gate CG), and −4.5V on the memory transistor gate are used.

Also, in the same way as the seventh embodiment, in this read process, by providing an MOS type transistor, there is an advantage that the upper limit of the read current can be controlled by controlling the threshold voltage of the transistor and there is little wasted current consumption.

Erasure is performed in the same way with the other embodiments. Further, in the MONOS of the present structure storing two bits in one cell, when shortening the gate length of the center MOS type control transistor, by optimizing the shape of the transistor, the effective gate length, or the profile of the impurity, the gate length can be reduced to 0.1 μm or even shorter.

Below, the 10th and 11th embodiments show modifications of the structure of the memory transistors of the first to the ninth embodiments.

10th Embodiment

The 10th embodiment relates to a nonvolatile semiconductor memory device using as the charge storing means of a memory transistor a large number of mutually isolated silicon nanocrystals buried in the gate insulating film and having a size of for example below 10 nm (hereinafter referred to as the Si nanocrystal type).

Figure 28:
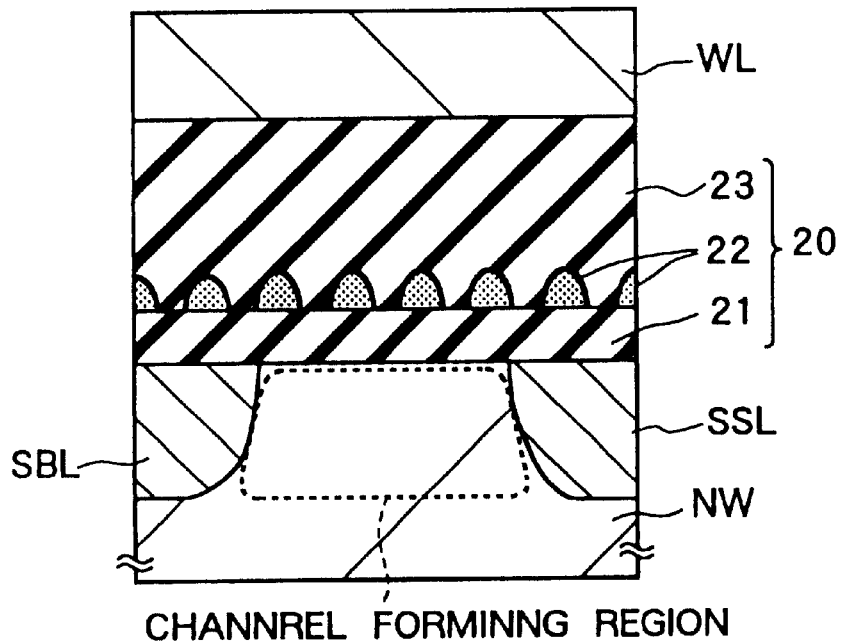
FIG. 28 is a cross-sectional view of a Si nanocrystal type memory transistor according to a 10th embodiment of the present invention in the word line direction.

FIG. 28 is a cross-sectional view for illustrating the element structure of a silicon nanocrystal type memory transistor.

In the silicon nanocrystal type nonvolatile memory according to the present embodiment, the gate insulating film 20 is comprised of a bottom insulating film 21, silicon nanocrystals 22 thereon used as the charge storing means, and an oxide film 23 covering the silicon nanocrystals 22.

The rest of the configuration, that is, the semiconductor substrate, channel forming region, well W, source lines MSL, SSL, bit lines BL, MSL, SBL, and word lines WL, are the same as those in the first to the eighth embodiments.

The silicon nanocrystals 22 have a size (diameter) of preferably below 10 nm, for example, about 4.0 nm. The individual Si nanocrystals are separated spatially by the oxide film 23, for example, are at intervals of for example 4 nm or so.

The bottom insulating film 21 in this example is somewhat thicker than in the first embodiment due to the closeness of the charge storing means (Si nanocrystals 22) to the substrate side. The thickness may be suitably selected in the range from 2.6 nm to 5.0 nm in accordance with the application. Here, it is made a thickness of about 4.0 nm.

The memory transistor of this configuration is fabricated by forming the bottom insulating film 21, then forming a number of Si nanocrystals 22 on the bottom insulating film 21 by for example LP-CVD. Further, the oxide film 23 is formed to for example 7 nm by LP-CVD to bury this Si nanocrystals 22. In this LP-CVD, the feedstock gas is a mixture of DCS and N$_2$O and the substrate temperature is made for example 700° C. At this time, the Si nanocrystals 22 are buried in the oxide film 23 and the surface of the oxide film 34 is flattened. When insufficiently flattened, a new flattening processes (for example, CMP) may be performed. Next, the conductive film forming the word lines is formed and the gate stacked film is patterned all together, whereby the Si nanocrystal type memory transistor is completed.

The Si nanocrystals 22 formed in this way function as carrier traps discrete in the planar direction. The trap level can be deduced from the band discontinuity with the surrounding silicon oxide. It is deduced to be about 3.1 eV. Individual Si nanocrystals 22 of this trap level are able to hold several injection electrons. Note that a silicon nanocrystal can also be made smaller to hold a single electron.

11th Embodiment

The 11th embodiment relates to a nonvolatile semiconductor device using as the charge storing means of the memory transistor a large number of mutually separated fine split floating gates buried in the insulating film (hereinafter referred to as fine split FG type).

Figure 29:
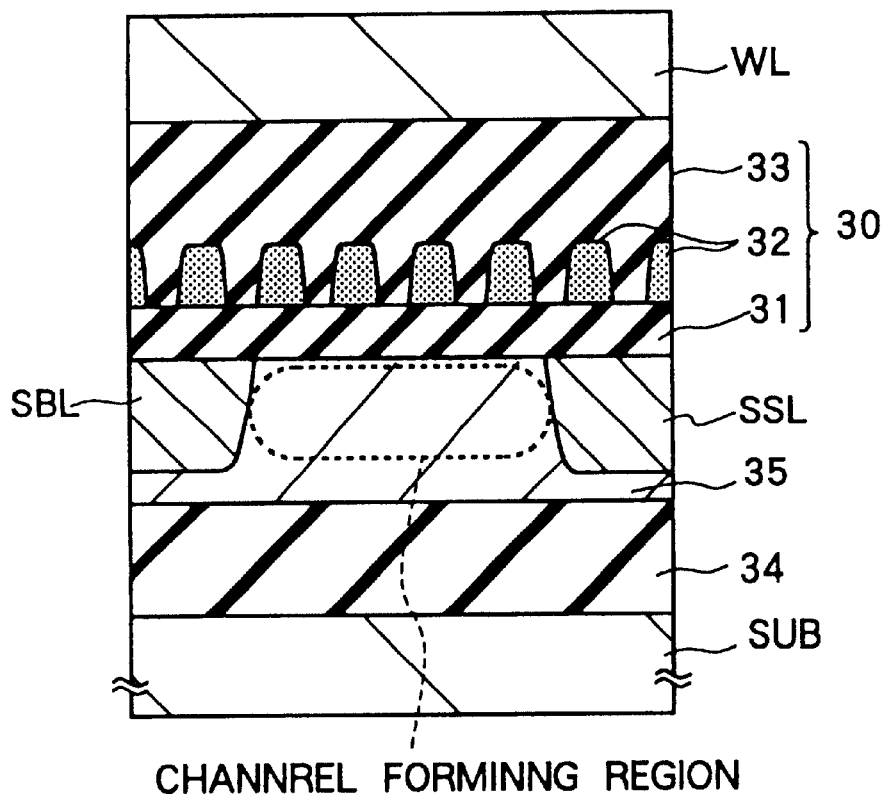
FIG. 29 is a cross-sectional view of a fine split FG type memory transistor according to an 11th embodiment of the present invention in the word line direction.

FIG. 29 is a cross-sectional view of the element structure of a fine split FG type memory transistor.

In the fine split FG type nonvolatile memory of the 11th embodiment, the memory transistor is formed on an SOI substrate. The gate insulating film 30 is comprised of a bottom insulating film 31, fine split floating gates 32 thereon used as the charge storing means, and an oxide film 33 burying the fine split floating gates 32.

The fine split floating gates 32, along with the Si nanocrystals 22 in the 10th embodiment, are specific examples of "small particle conductors" spoken of in the present invention.

As the SOI substrate, use may be made of a separation-by-implanted-oxygen (SIMOX) substrate comprised of a silicon substrate implanted with oxygen ions at a high concentration to form a buried oxide film at a location deeper than the substrate surface or a bonded substrate consisting of any a substrate and a silicon substrate with an oxide film formed on its surface, etc. The SOI substrate formed by this method shown in FIG. 29 is comprised of a semiconductor substrate SUB, an isolation oxide film 34, and a silicon layer 35. In the silicon layer 35, sub-source lines SBL (source impurity region S) and sub-bit lines (drain impurity regions D) are formed. The region between these two impurity regions is the channel forming region.

Instead of the semiconductor substrate SUB, use may also be made of a glass substrate, a plastic substrate, a sapphire substrate, etc.

The fine split floating gates 32 are obtained by processing a normal floating gate into fine poly-Si dots of for example a height of about 5.0 nm and a diameter of up to 8 nm.

The bottom insulating film 31 in the present embodiment is formed much thinner than the normal FG type. The thickness may be suitably selected in the range from 2.5 nm to 4.0 nm in accordance with the application. Here, it is made the thinnest 2.5 nm.

In the fabrication of a memory transistor of this configuration, a bottom insulating film 31 is formed on the SOI substrate, then a polysilicon film (final thickness 5 nm) is formed on the bottom insulating film 31 by for example LP-CVD. In this LP-CVD, the feedstock gas is a mixture of DCS and ammonia and the substrate temperature is made for example 650° C. Next, for example, electron beam lithography is used to process the polysilicon film into fine polysilicon dots of a diameter of for example up to 8 nm. The polysilicon date function as the fine split type flating gates 32 (the charge storing means). Then, an oxide film 44 is formed to a thickness of for example up to 9 nm by LP-CVD to bury the fine split type floating gates 32. In this LP-CVD, the feedstock gas is a mixture of DCS and N$_2$O, the substrate temperature is made for example 700° C. At this stage, the fine split type floating gates 32 are buried in the oxide film 33 and the surface of the oxide film 33 is flattened. If the flattening is insufficient, another flattening process (for example, CMP) may be performed. Next, the conductive film forming the word lines is formed and the gate stacked films are patterned, thereby completing the fine split FG type memory transistor.

Concerning the effects of using an SOI substrate and splitting a floating gate into fine dots, elements were fabricated in the manner described above and evaluated for performance. It was verified that good performances as predicted were obtained.

Modifications

While the invention has been described with reference to specific embodiment chosen for purpose of illustration, it should be apparent that numerous modifications could be made thereto by those skilled in the art without departing from the basic concept and scope of the invention.

Specifically, various modifications may be made to the first of the 11th embodiments described above.

In the present invention, although data was erased by FN tunneling or direct tunneling, it is also possible to erase the locally stored electrons by injecting channel hot holes.

The present invention is also applicable to other kinds of NOR type cells, such as the DINOR type, which are not illustrated.

The "planarly dispersed charge storing means" in the present invention includes carrier traps in the bulk of a nitride film and carrier traps formed near the interface between an oxide film and the nitride film, hence the present invention is applicable even to an MNOS type whose gate insulating film is an NO (nitride-oxide) film.

In addition to a stand alone type nonvolatile memory, the present invention is also applicable to an embedded nonvolatile memory provided with logic circuits integrated on the same substrate.

Summarizing the effects of the present invention, according to the nonvolatile semiconductor memory device and the method for operating the same, in a write operation, by utilizing, for example, the hot electrons caused by the band-to-band tunneling current, a charge can be quickly and highly efficiently injected into the planarly dispersed charge storing means. Because a channel is not formed during the write operation, the disadvantage as in the case of the conventional CHE injection of punch through preventing the gate length from being shortened is eliminated. In fact, in the present write process, the shorter the gate length, the greater the change of the threshold voltage which is able to be obtained and the higher the speed of the write operation.

On the other hand, when storing two bits in one cell, since the charge injection area is localized, over write can be prevented, and charge diffusion at high temperature can also be prevented, therefore, the reliability is high. Further, since a channel is not formed during a write operation, in various NOR type memory cell arrays such as the so-called AND type and virtual grounding type, a page write can be performed with a low current and within one operation cycle. Therefore, over 1 kB of cells can be written in parallel, and the write band width is greatly improved compared with the CHE injection method.

Due to the present invention, a nonvolatile semiconductor memory device is realized which is fast, has a large capacity, and is superior in scaling.

What is claimed is:

1. A nonvolatile semiconductor memory device comprising:

a channel forming region comprised of a first conductivity type semiconductor, source and drain regions comprised of a second conductivity type semiconductor sandwiching the channel forming region between them, a gate insulating film provided on said channel forming region, a gate electrode provided on said gate insulating film, and a charge storing means which is formed in said gate insulating film dispersed in the plane facing said channel forming region and in the direction of thickness and is injected with hot electrons at the time of operation from said source and drain regions, wherein a memory transistor comprises said channel forming region, said source and drain regions, said gate insulating film, and said gate electrode has a gate length shorter than or equal to the gate length when a region retaining hot electrons from one of said source and drain regions is merged or partially merged in the gate insulating film with a region retraining hot electrons from the other of said source and drain regions when hot electrons are injected from both said source and drain regions.

2. The nonvolatile semiconductor memory device as set forth in claim 1, wherein said hot electrons are those caused by a band-to-band tunneling current.

3. The nonvolatile semiconductor memory device as set forth in claim 1, wherein said gate insulating film comprises a storage region holding the hot electrons injected from said source and drain regions and another region not injected by the hot electrons.

4. The nonvolatile semiconductor memory device as set forth in claim 3, wherein said gate insulating film comprises a first storage region holding the hot electrons injected from either said source region or said drain region, a second storage region holding the hot electrons injected from the other of said source and drain regions, and a third region between the first and the second regions into which the hot electrons are not injected.

5. The nonvolatile semiconductor memory device as set forth in claim 4, wherein a charge storing means is formed in the first and the second storage region and the region of distribution of said charge sorting means is spatially separated by the third region.

6. The nonvolatile semiconductor memory device as set forth in claim 5, wherein said first and second storage regions are stacked film structures comprised of a number of films stacked together, and said third region is a single layer of a dielectric.

7. The nonvolatile semiconductor memory device as set forth in claim 5, wherein the gate electrode comprises a first gate electrode formed on the first storage region, a second gate electrode formed on the second storage region, and a third gate electrode formed on the third region and said first, second, and third gate electrodes are spatially separated from each other.

8. The nonvolatile semiconductor memory device as set forth in claim 7, wherein said channel forming region comprises two channel forming regions of two memory transistors and a channel forming region of a control transistor between and in connection with the former two channel forming regions.

9. The nonvolatile semiconductor memory device as set forth in claim 7, wherein
a plurality of memory transistors each comprises a channel forming region, source and drain regions, gate insulating film, and gate electrode are arranged in the word line direction and in the bit line direction;
in the memory transistors in the word line direction, said first and second gate electrodes are commonly connected through word lines; and
in the memory transistors in the bit line direction, said third gate electrodes are commonly connected.

10. The nonvolatile semiconductor memory device as set forth in claim 4, further comprising
a first gate electrode at the outer side of the first storage region, and
a second gate electrode at the outer side of the second storage region,
said first and second gates being spatially separated by a single said gate electrode formed on said first storage region, said second storage region, and said third region.

11. The nonvolatile semiconductor memory device as set forth in claim 1, wherein said first conductivity type is an n-type, and said second conductivity type is a p-type.

12. The nonvolatile semiconductor memory device as set forth in claim 1, wherein
a plurality of memory transistors each of which includes said channel forming region, said source and drain regions, and gate insulating film, and said gate electrode, are arranged in both a word line direction and a bit line direction;
said memory device further comprises
a plurality of word lines and
a plurality of common lines which intersect with said plurality of word lines in an electrically insulated state;
the plurality of said gate electrodes are respectively connected to said plurality of word lines; and
the plurality of said source and drain regions are coupled with the plurality of common lines.

13. The nonvolatile semiconductor memory device as set forth in claim 12, comprising
word lines commonly connecting said gate electrodes in a word line direction,
first common lines commonly connecting one of said source and drain regions in a bit line direction, and
second common lines commonly connecting the other of said source and drain regions.

14. The nonvolatile semiconductor memory device as set forth in claim 13, wherein
said first common lines include
first sub-lines commonly connecting one of said source and drain regions in a bit line direction and
first main lines commonly connecting the first sub-lines in a bit line direction;
said second common lines include
second sub-lines commonly connecting the other of said source and drain regions and
second main lines commonly connecting the second sub-lines; and
said plurality of memory transistors are connected in parallel between said first sub-lines and the second sub-lines.

15. The nonvolatile semiconductor memory device as set forth in claim 1, wherein
a plurality of memory transistors each of which includes said channel forming region, said source and drain regions, said gate insulating film, and said gate electrode, are arranged in both a word line direction and a bit line direction;
said source and drain regions comprises a semiconductor doped with the second conductivity type impurity, and
an element isolation layer is formed between one of said source and drain regions in one said memory transistor and the other of said source and drain regions in another said memory transistor adjacent to the former in the word line direction.

16. The nonvolatile semiconductor memory device as set forth in claim 1, wherein
said charge storing means does not have conductivity as a plane as a whole facing said channel forming region at least when there is not dissipation of charges in the outside.

17. The nonvolatile semiconductor memory device as set forth in claim 16, wherein said gate insulating film comprises
a bottom insulating film on said channel forming region, and
a nitride film or an oxynitride film on said bottom insulating film.

18. The nonvolatile semiconductor memory device as set forth in claim 16, wherein said gate insulating film comprises
a bottom insulating film on said channel forming region, and
mutually insulated small particle conductors formed on the bottom film and functioning as said charge storing means.

19. The method of operating a nonvolatile semiconductor memory device comprising: a channel forming region comprised of a first conductivity type semiconductor, source and drain regions comprised of a second conductivity type semiconductor with said channel forming region in between, a gate insulating film provided on said channel forming region and including inside it a charge storing means dispersed in a plane facing said channel forming region and thickness direction, and a gate electrode provided on the gate insulating film;
said method comprising a step of injecting hot electrons into said charge storing means from said source and drain regions when writing data to the device,
wherein the gate length of a memory transistor including said channel forming region, said source and drain regions, said gate insulating film, and said gate electrode is shorter than or equal to the gate length when said source and drain regions retaining hot electrons are merged or partially merged in the gate insulating film.

20. The method of operating a nonvolatile semiconductor memory device as set forth in claim 19, comprising, in the write operation, a step of injecting hot electrons caused by the band-to-band tunneling current into said charge storing means from said source and drain regions.

21. The method of operating a nonvolatile semiconductor memory device as set forth in claim 19, comprising, in a write operation, a step of injecting hot electrons into part of the region of distribution of said charge storing means in said gate insulating film.

22. The method of operating a nonvolatile semiconductor memory device as set forth in claim 20, comprising, in a write operation, a step of:
injecting hot electrons into a first storage region from one of said source and drain regions; and injecting hot electrons from the other of said source and drain regions into a second storage region separated from the first storage region in the gate insulating film independently from the injection of hot electrons to said first storage region.

23. The method of operating a nonvolatile semiconductor memory device as set forth in claim 22, wherein:

said gate insulating film has a third region, between the first and the second storage regions, into which hot electrons are not injected;

said charge storing means is formed in said first and second storage regions; and the region of distribution of said charge storing means is spatially separated by said third region.

24. The method of operating a nonvolatile semiconductor memory device as set forth in claim 23, wherein;

said first and second storage regions are of stacked film structures comprising a plurality of films stacked on each other, and said third region is an insulating film of a single material.

25. The method of operating a nonvolatile semiconductor memory device as set forth in claim 23, wherein in write operation of a memory cell array comprised of a plurality of said memory transistors each including said channel forming region, said source and drain regions, said gate insulating film, and said gate electrode, arranged in both a word line direction and bit line direction wherein said gate electrodes are commonly connected through word lines for every certain number of memory transistors in a word line direction, said method comprising in a write operation for all memory transistors connected to the same word line, step of:

applying a specified voltage to all of the source and drain regions corresponding to the first and the second storage regions into which hot electrons are injected;

setting the source and drain regions correspond to the first and the second storage regions into which hot electrons injected in an electrically floating state;

applying a write voltage, which is equal to a predetermined difference with said specified voltage applied to said source and drain regions, on said same word line; and writing all memory transistors connected to said same word line in parallel with one operation.

26. The method of operating a nonvolatile semiconductor memory device as set forth in claim 25, wherein:

said source and drain regions are comprised of a semiconductor doped with the second conductivity type impurity; and said memory cell array is provided with an element isolation layer between one of said source and drain regions in one said memory transistor and the other of said source and drain regions in another said memory transistor adjacent to the former in the word line direction.

27. The method of operating a nonvolatile semiconductor memory device as set forth in claim 19, wherein the region retaining hot electrons from one of said source and drain regions is merged or partially merged in the gate insulating film with the region retaining hot electrons from the other of said source and drain regions.

28. The method of operating a nonvolatile semiconductor memory device as set forth in claim 19, comprising, when writing data, a step of applying a specified write voltage between said source and drain regions and said gate electrode.

29. The method of operating a nonvolatile semiconductor memory device as set forth in claim 28, wherein:

a memory cell array comprised of a plurality of said memory transistors arranged in both a word line direction and bit line direction;

said gate insulating film in each said memory transistor each including said channel forming region, said source and drain regions, said gate insulating film, and said gate electrode comprises a first storage region into which hot electrons are injected from one of said source and drain regions, a second storage region into which hot electrons are injected from the other of said source and drain regions, and a third region which is between said first and the second regions and into which to electrons are not injected; and said gate electrode in said memory transistor comprises a first gate electrode formed on said first storage region, a second gate electrode formed on said second storage region, and a third gate electrode formed on said third region, said method comprising, when writing data to one region of said first and the second storage regions, a step of setting the gate electrode at the other of said first and second storage regions electrically floating, or applying a voltage of 0V or of an opposite polarity relative to said channel forming region to the gate electrode at the other of said first and the second storage regions.

30. The method of operating a nonvolatile semiconductor memory device as set forth in claim 28, said device having memory cell array comprised of a plurality of memory transistors each including said channel forming region, and source and drain regions, said gate insulating film and said gate electrode arranged in both a word line direction and bit line direction wherein said gate electrodes are commonly connected through the word lines for every certain number of memory transistors in a word line direction, said method comprising, in a write operation, a step of applying a voltage of 0V or of an opposite polarity relative to said channel forming region to the non-selected word lines to which a memory transistor to be operated is not connected.

31. The method of operating a nonvolatile semiconductor memory device as set forth in claim 19, wherein:

a memory cell array comprised of a plurality of a memory transistors each including said channel forming region, and source and drain regions, said gate insulating film, and said gate electrode arranged in both a word line direction and bit line direction;

one of said source and drain regions are commonly connected through first common lines for every certain number of memory transistors in a bit line direction; and the other of said source and drain regions are commonly connected through second common lines, said method comprising step of:

applying a specified voltage to the first and/or the second common lines to which the memory transistor to be operated is connected; and applying a voltage of 0V or of an polarity opposite to said specified voltage to the first and the second common lines to which the memory transistor to be operated is not connected.

32. The method of operating a nonvolatile semiconductor memory device as set forth in claim 19, wherein:

in a read operation of said nonvolatile semiconductor memory device wherein said gate insulating film in said memory transistor including said channel forming region, said source and drain regions, said gate insulating film, and said gate electrode said gate insulating film comprises a first storage region into which hot electrons are injected from one of said source and drain regions, a second storage region into which hot electrons are injected from the other of said source and drain regions, and a third region which is between said first and the second regions and into which hot electrons are not injected; and said gate electrode in said memory transistor comprises a first gate electrode formed on said first storage region, a second gate electrode formed on said second storage region, and a third gate electrode formed on said third region, said method comprising, in a read operation, steps of:

applying a specified read drain voltage between said source and drain regions so that the storage region to be read becomes the source;

applying a specified voltage to said third gate electrode; and applying a specified read gate voltage of the same polarity as that applied to said third gate electrode to said first and/or the second gate electrodes.

33. The method of operating a nonvolatile semiconductor memory device as set forth in claim 19, comprising, when erasing data, a step of extracting hot electrons which are injected from said source and drain regions and are stored in said charge storing means to the side of said source and drain regions by utilizing the direct tunneling effect or the FN tunneling effect.

34. The method of operating a nonvolatile semiconductor memory device as set forth in claim 19, comprising, when erasing data, a step of extracting hot electrons which are injected from said source and drain regions and are separated and stored at the two sides of the charge storing means in the channel direction to the substrate side separately or simultaneously by utilizing the direct tunneling effect or the FN tunneling effect.

35. The method of operating a nonvolatile semiconductor memory device as set forth in claim 19, wherein said first conductivity type is an n-type, and said second conductivity type is a p-type.

36. The method of operating a nonvolatile semiconductor memory device as set forth in claim 19, wherein said charge storing means does not have conductivity as a plane as a whole facing said channel forming region at least when there is not dissipation of charges in the outside.

37. The method of operating a nonvolatile semiconductor memory device as set forth in claim 36, wherein said gate insulating film comprises:

a bottom insulating film on said channel forming region; and a nitride film or an n oxynitride film on said bottom insulating film.

38. The method of operating a nonvolatile semiconductor memory device as set forth in claim 36, wherein said gate insulating film comprises:

a bottom insulating film on said channel forming region; and mutually insulated small particle conductors formed on the bottom film and functioning as said charge storing means.

39. A nonvolatile semiconductor memory device comprising:

a channel forming region comprised of a first conductivity type semiconductor, source and drain regions comprised of a second conductivity type semiconductor sandwiching the channel forming region between them, a gate insulating film provided on said channel forming region, said gate insulating film comprising a first storage region holding hot electrons injected from either said source region or said drain region, a second storage region holding hot electrons injected form the other of said source and drain regions, and a third region between the first and the second regions into which hot electrons are not injected, said third region comprising a single layer of a dielectric, a gate electrode provided on said gate insulating film, and a charge storing means which is formed in said gate insulating film dispersed in the plane facing said channel forming region and in the direction of thickness and is injected with hot electrons at the time of operation from said source and drain regions.

40. The nonvolatile semiconductor memory device as set forth in claim 39, wherein said hot electrons are those caused by a band-to-band tunneling current.

41. The nonvolatile semiconductor memory device as set forth in claim 39, wherein said charge storing means is formed in the first and the second storage regions and the region of distribution of said charge storing means is spatially separated by the third region.

42. The nonvolatile semiconductor memory device as set forth in claim 39, wherein said first and the second storage regions are stacked film structures comprised of a number of films stacked together.

43. The nonvolatile semiconductor memory device as set forth in claim 39, wherein the gate electrode comprises a first gate electrode formed on the first storage region, a second gate electrode formed on the second storage region, and a third gate electrode formed on the third region and said first, second, and third gate electrodes are spatially separated from each other.

44. The nonvolatile semiconductor memory device as set forth in claim 39, wherein said channel forming region comprises two channel forming regions of two memory transistors and a channel forming region of a control transistor between and in connection with the former two channel forming regions.

45. The nonvolatile semiconductor memory device as set forth in claim 39, wherein a plurality of memory transistors each comprise a channel forming region, source and drain regions, gate insulating film, and gate electrode are arranged in the word line direction and in the bit line direction;

in the memory transistors in the word line direction, said first and second gate electrodes are commonly connected through word lines; and in the memory transistors in the bit line direction, said third gate electrodes are commonly connected.

46. The nonvolatile semiconductor memory device as set forth in claim 39, further comprising a first gate electrode at the outer side of the first storage region, and a second gate electrode at the outer side of the second storage region, and first and second gates being spatially separated by a single said gate electrode formed on said first storage region, and second storage region, and said third region.

47. The nonvolatile semiconductor memory device as set forth in claim 39, wherein a memory transistor comprises said channel forming region, said source and drain regions, and gate insulating film, and said gate electrode has a gate length shorter than or equal to the gate length when a region retaining hot electrons from one of said source and drain regions is merged or partially merged in the gate insulating film with a region retaining hot electrons from the other of said source and drain regions when hot electrons are injected from both said source and drain regions.

48. The nonvolatile semiconductor memory device as set forth in claim 39, wherein said first conductivity type is an n-type, and said second conductivity type is a p-type.

49. The nonvolatile semiconductor memory device as set forth in claim 39, wherein a plurality of memory transistors each of which includes said channel forming region, said two source and drain regions, said gate insulating film, and said gate electrode, are arranged in both a word line direction and a bit line direction;
said memory device further comprises:
a plurality of word lines and
a plurality of common lines which intersect with said plurality of word lines in an electrically insulated state;
the plurality of said gate electrodes are respectively connected to said plurality of word lines; and
the plurality of said source and drain regions are coupled with the plurality of common lines.

50. The nonvolatile semiconductor memory device as set forth in claim 49, comprising word lines commonly connecting said gate electrodes in a word line direction, first common lines commonly connecting one of said two source and drain regions in a bit line direction, and second common lines commonly connecting the other of said two source and drain regions.

51. The nonvolatile semiconductor memory device as set forth in claim 50, wherein said first common lines include first sub-lines commonly connecting one of said source and drain regions in a bit line direction and first main lines commonly connecting the first sub-lines in a bit line direction;
said second common lines include
second sub-lines commonly connecting the other of said source and drain regions and
second main lines commonly connecting the second sub-lines; and
said plurality of memory transistors are connected in parallel between said first sub-lines and the second sub-lines.

52. The nonvolatile semiconductor memory device as set forth in claim 39, wherein a plurality of memory transistors each of which includes such channel forming region, said source and drain regions, said gate insulating film, and said gate electrode, are arranged in both a word line direction and a bit line direction;
said two source and drain regions comprises a semiconductor doped with the second conductivity type impurity, and
an element isolation layer is formed between one of said source and drain regions in one said memory transistor and the other of said source and drain regions in another said memory transistor adjacent to the former in the word line direction.

53. The nonvolatile semiconductor memory device as set forth in claim 39, wherein said charge storing means does not have conductivity as a plane as a whole facing said channel forming region at least when there is not dissipation of charges in the outside.

54. The nonvolatile semiconductor memory device as set forth in claim 53, wherein said gate insulating film comprises a bottom insulating film on said channel forming region, and a nitride film or an oxynitride film on said bottom insulating film.

55. The nonvolatile semiconductor memory devices as set forth in claim 53, wherein said gate insulating film comprises a bottom insulating film on said channel forming region, and mutually insulated small particle conductors formed on the bottom film and functioning as said charge storing means.

56. A method of operating a nonvolatile semiconductor memory device comprising: a channel forming region comprised of a first conductivity type semiconductor, source and drain regions comprising of a second conductivity type semiconductor with said channel forming region in between, a gate insulating film provided on said channel forming region and including inside it a charge storing means dispersed in a plane facing said channel forming region and thickness direction, said gate insulating film comprising a first storage region retaining hot electrons injected from either said source region or said drain region, a second storage region retaining hot electrons injected from the other of said source and drain regions, and a third region between the first and the second region into which hot electrons are not injected, said third region comprising an insulating film of a single material, and a gate electrode provided on the gate insulating film;
said method comprising, in a write operation, a step of:
injecting hot electrons into said first storage region from one of said source and drain regions; and
injecting hot electrons from the other of said source and drain regions into said second storage region separated from the first storage region in the gate insulating film independently from the injection of hot electrons into said first storage region.

57. The method of operating a nonvolatile semiconductor memory device as set forth in claim 56, wherein;
said first and second storage regions are of stacked film structures comprising a plurality of films stacked on each other.

58. The method of operating a nonvolatile semiconductor memory device as set forth in claim 56, wherein
said first storage region retaining hot electrons from one of said source and drain regions is merged or partially merged in the gate insulating film with said second storage region retaining hot electrons from the other of said source and drain regions.

59. The method of operating a nonvolatile semiconductor memory device as set forth in claim 56, comprising, when writing data, a step of
applying a specified write voltage between said source and drain regions and said gate electrode.

60. The method of operating a nonvolatile semiconductor memory device as set forth in claim 56, wherein the gate length of a memory transistor including said channel forming region, said source and drain regions, said gate insulating film, and said gate electrode is shorter than or equal to the gate length when said source and drain regions retaining hot electrons are merged or partially merged in the gate insulating film.

61. The method of operating a nonvolatile semiconductor memory device as set forth in claim 60, wherein:
a memory cell array comprised of a plurality of said memory transistors arranged in both a word line direction and bit line direction;

said gate insulating film in each said memory transistor each including said channel forming region, said two source and drain regions, said gate insulating film, and said gate electrode comprises a first storage region into which hot electrons are injected from one of said source and drain regions, a second storage region into which hot electrons are injected from the other of said source and drain regions, and a third region which is between said first and the second regions and into which hot electrons are not injected; and said gate electrode in said memory transfer comprises a first gate electrode formed on said first storage region, a second gate electrode formed on said second storage region, and a third gate electrode formed on said third region, said method comprising, when writing data to one region of said first and the second storage regions, a step of setting the gate electrode at the other of said first and second storage regions electrically floating, or applying a voltage of 0V or of an opposite polarity relative to said channel forming region to the gate electrode at the other of said first and the second storage regions.

62. The method of operating a nonvolatile semiconductor memory device as set forth in claim 60, said device having a memory cell array comprised of a plurality of memory transistors each including said channel forming region, said two source and drain regions, said gate insulating film, and said gate electrode arranged in both a word line direction and bit line direction wherein said gate electrodes are commonly connected through the word lines for every certain number of memory transistors in a word line direction, said method comprising, in a write operation, a step of applying a voltage of 0V or of an opposite polarity relative to said channel forming region to the non-selected word lines to which a memory transistor to be operated is not connected.

63. The method of operating a nonvolatile semiconductor memory device as set forth in claim 56, wherein:

a memory cell array comprised of a plurality of memory transistors each including said channel forming region, said source and drain regions, said gate insulating film, and said gate electrode arranged in both a word line direction and bit line direction;

one of said source and drain regions are commonly connected through first common lines for every certain number of memory transistors in a bit line direction; and the other of said source and drain regions are commonly connected through second common lines, said method comprising a step of:
applying a specific voltage to the first and/or the second common lines to which the memory transistor to be operated is connected; and
applying a voltage of 0V or of an polarity opposite to said specified voltage to the first and the second common lines to which the memory transistor to be operated is not connected.

64. The method of operating a nonvolatile semiconductor memory device as set forth in claim 63, wherein in write operation of a memory cell array comprised of a plurality of said memory transistors each including said channel forming region, said source and drain regions, said gate insulating film, and said gate electrode, arranged in both a word line direction and bit line direction wherein said gate electrodes are commonly connected through word lines for every certain number of memory transistors in a word line direction, said method comprising in a write operation for all memory transistors connected to the same word line, step of:
applying a specified voltage to all of the source and drain regions corresponding to the first and the second storage regions into which hot electrons are injected;
setting the source and drain regions corresponding to the first and the second storage regions into which hot electrons injected in an electrically floating state;
applying a write voltage, which is equal to a predetermined difference with said specified voltage applied to said source and drain regions, on said same word line; and
writing all memory transistors connected to said same word line in parallel with one operation.

65. The method of operating a nonvolatile semiconductor memory device as set forth in claim 64, wherein:

said source and drain regions are comprised of a semiconductor doped with the second conductivity type impurity; and said memory cell array is provided with an element isolation layer between one of said source and drain regions in one said memory transistor and the other of said source and drain regions in another said memory transistor adjacent to the former in the word line direction.

66. The method of operating a nonvolatile semiconductor memory device as set forth in claim 56, wherein:

in a read operation of said nonvolatile semiconductor memory device wherein said gate insulating film in said memory transistor including said channel forming region, said source and drain regions, said gate insulating film, and said gate electrode said gate insulating film comprises a first storage region into which hot electrons are injected from one of said source and drain regions, a second storage region into which hot electrons are injected from the other of said source and drain regions, and a third region which is between said first said the second regions and into which hot electrons are not injected; and said gate electrode in said memory transistor comprises a first gate electrode formed on said first storage region, a second gate electrode formed on said second storage region, and a third gate electrode formed on said third region, said method comprising in a read operation, steps of:
applying a specified read drain voltage between said source and drain regions so that the storage region to be read becomes the source;
applying a specified voltage to said third gate electrode; and
applying a specified read gate voltage of the same polarity as that applied to said third gate electrode to said first and/or the second gate electrodes.

67. The method of operating a nonvolatile semiconductor memory device as set forth in claim 56, comprising, wherein erasing data, a step of extracting hot electrons which are injected from said source and drain regions and are stored in said charge storing means to the side of said source and drain regions by utilizing the direct tunneling effect or the FN tunneling effect.

68. The method of operating a nonvolatile semiconductor memory device as set forth in claim 56, comprising, when erasing data, a step of extracting hot electrons which are injected from said source and drain regions and are separated and stored at the two sides of the charge storing means in the channel direction to the substrate side separately or simultaneously by utilizing the direct tunneling effect or the FN tunneling effect.

69. The method of operating a nonvolatile semiconductor memory device as set forth in claim 56, wherein said first conductivity type is an n-type, and said second conductivity type is a p-type.

70. The method of operating a nonvolatile semiconductor memory device as set forth in claim 56, wherein said charge storing means does not have conductivity as a plane as a whole facing said channel forming region at least when there is not dissipation of charges in the inside.

71. The method of operating a nonvolatile semiconductor memory device as set forth in claim 70, wherein said gate insulating film comprises:

a bottom insulating film on said channel forming region; and a nitride film or an n oxynitride film on said bottom insulating film.

72. The method of operating a nonvolatile semiconductor memory device as set forth in claim 70, wherein said gate insulating film comprises:

a bottom insulating film on said channel forming region; and mutually insulated small particle conductors formed on the bottom film and functioning as said charge storing means.

* * * * *

UNITED STATES PATENT AND TRADEMARK OFFICE
CERTIFICATE OF CORRECTION

PATENT NO. : 6,434,053 B1
DATED : August 13, 2002
INVENTOR(S) : Ichiro Fujiwara

It is certified that error appears in the above-identified patent and that said Letters Patent is hereby corrected as shown below:

Column 2,
Line 16, replace "Device Letter, 19, 1999" with -- Device Letter, 19, 1998 --.

Column 4,
Line 9, replace "preferable the gate" with -- preferably the gate --.

Column 5,
Line 2, replace "secondary conductivity type" with -- second conductivity type --.

Column 6,
Line 61, replace "or simultaneously be the" simultaneously by the --.

Column 8,
Line 46, replace "hardly even happens" with --hardly ever happens --.

Column 10,
Line 57, replace "SG11, While Select" with -- SG11, while select --; and
Line 58, replace "$S_{21}$...are controlled" with -- $S_{21}$,...are controlled --.

Column 13,
Line 5, replace "(not shown) are attacked" with -- (not shown) are stacked --.

Column 27,
Line 60, replace "Bli+1 gate electrodes" with -- Bli+1, gate electrodes --.

Column 30,
Line 39, replace "line SBL (source" with -- line SSL (source --; and
Line 62, replace "The polysilicon date function as the fine split type flating" with -- The polysilicon dots function as the fine split type floating --.

Column 32,
Line 19, replace "with a region retraining" with -- with a region retaining --;
Line 43, replace "second storage region and" with -- second storage regions and --; and
Line 44, replace "charge sorting means is" with -- charge storing means is --.

UNITED STATES PATENT AND TRADEMARK OFFICE
CERTIFICATE OF CORRECTION

PATENT NO. : 6,434,053 B1
DATED : August 13, 2002
INVENTOR(S) : Ichiro Fujiwara

It is certified that error appears in the above-identified patent and that said Letters Patent is hereby corrected as shown below:

Column 33,
Line 30, replace "regions, and gate" with -- regions, said gate --.

Column 36,
Line 15, replace "and into which to" with -- and into which hot --.

Column 38,
Line 15, replace "electrons injected form" with -- electrons injected from --.

Column 39,
Line 4, replace "and gate insulating film," with -- said gate insulating film, --.

Column 40,
Line 25, replace "the second region into which" with -- the second regions into which --.

Column 43,
Line 18, replace "inside" with -- outside --.

Signed and Sealed this

Twenty-ninth Day of June, 2004

JON W. DUDAS
*Acting Director of the United States Patent and Trademark Office*

UNITED STATES PATENT AND TRADEMARK OFFICE
CERTIFICATE OF CORRECTION

PATENT NO.    : 6,434,053 B1
DATED         : August 13, 2002
INVENTOR(S)   : Ichiro Fujiwara It is certified that error appears in the above-identified patent and that said Letters Patent is hereby corrected as shown below:

Column 2,
Line 16, replace "Device Letter, 19, 1999" with -- Device Letter, 19, 1998 --.

Column 4,
Line 9, replace "preferable the gate" with -- preferably the gate --.

Column 5,
Line 2, replace "secondary conductivity type" with -- second conductivity type --.

Column 6,
Line 61, replace "or simultaneously be the" with -- simultaneously by the --.

Column 8,
Line 46, replace "hardly even happens" with -- hardly ever happens --.

Column 10,
Line 57, replace "SG11, While Select" with -- SG11, while select --; and
Line 58, replace "$S_{21}$... are controlled" with -- $S_{21},$... are controlled --.

Column 13,
Line 5, replace "(not shown) are attacked" with -- (not shown) are stacked --.

Column 27,
Line 60, replace "Bli+1 gate electrodes" with -- Bli+1, gate electrodes --.

Column 30,
Line 39, replace "line SBL (source" with -- line SSL (source --; and
Line 62, replace "The polysilicon date function as the fine split type flating" with
 -- The polysilicon dots function as the fine split type floating --.

Column 32,
Line 19, replace "with a region retraining" with -- with a region retaining --;
Line 43, replace "second storage region and" with -- second storage regions and --; and
Line 44, replace "charge sorting means is" with -- charge sorting means is --.

Column 33,
Line 30, replace "regions, and gate" with -- regions, said gate --.

Column 36,
Line 15, replace "and into which to" with -- and into which hot --.

UNITED STATES PATENT AND TRADEMARK OFFICE
CERTIFICATE OF CORRECTION

PATENT NO. : 6,434,053 B1
DATED : August 13, 2002
INVENTOR(S) : Ichiro Fujiwara

It is certified that error appears in the above-identified patent and that said Letters Patent is hereby corrected as shown below:

Column 38,
Line 15, replace "electrons injected form" with -- electrons injected from --.

Column 39,
Line 4, replace "and gate insulating film," with -- said gate insulating film, --.

Column 40,
Line 25, replace "the second region into which" with -- the second regions into which --.

Column 43,
Line 18, replace "inside" with -- outside --.

Signed and Sealed this

Third Day of August, 2004

JON W. DUDAS
*Acting Director of the United States Patent and Trademark Office*